(12) United States Patent
Nakashima et al.

(10) Patent No.: US 8,785,087 B2
(45) Date of Patent: *Jul. 22, 2014

(54) PIGMENT-DISPERSED COMPOSITION, CURABLE COMPOSITION, COLOR FILTER AND PRODUCTION METHOD THEREOF

(75) Inventors: Taeko Nakashima, Ashigarakami-gun (JP); Kazuto Shimada, Haibara-gun (JP); Shuichi Odagiri, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 511 days.

This patent is subject to a terminal disclaimer.

(21) Appl. No.: 12/521,316

(22) PCT Filed: Dec. 27, 2007

(86) PCT No.: PCT/JP2007/075412
§ 371 (c)(1),
(2), (4) Date: Jun. 26, 2009

(87) PCT Pub. No.: WO2008/081996
PCT Pub. Date: Jul. 10, 2008

(65) Prior Publication Data
US 2010/0323284 A1 Dec. 23, 2010

(30) Foreign Application Priority Data

Dec. 27, 2006 (JP) ................... 2006-352716
Feb. 23, 2007 (JP) ................... 2007-044675
Aug. 16, 2007 (JP) ................... 2007-212261

(51) Int. Cl.
*G03F 7/00* (2006.01)
*G02B 5/20* (2006.01)

(52) U.S. Cl.
USPC ............. 430/7; 430/287.1; 106/493; 106/499

(58) Field of Classification Search
None
See application file for complete search history.

(56) References Cited

U.S. PATENT DOCUMENTS

| 3,536,510 | A | 10/1970 | Allen et al. |
|---|---|---|---|
| 3,778,287 | A | 12/1973 | Stansfield et al. |
| 5,821,016 | A | 10/1998 | Satch et al. |
| 6,087,050 | A | 7/2000 | Itano et al. |
| 2002/0191517 | A1 | 12/2002 | Honda et al. |
| 2008/0241713 | A1 | 10/2008 | Tanaka |
| 2010/0323284 | A1 | 12/2010 | Nakashima et al. |

FOREIGN PATENT DOCUMENTS

| EP | 0 723 167 A2 | 7/1996 |
|---|---|---|
| EP | 0 780 731 A2 | 6/1997 |
| JP | 54-34009 B | 10/1979 |
| JP | 5-72943 B | 11/1986 |
| JP | 64-25147 A | 1/1989 |
| JP | 01025147 | 1/1989 |
| JP | 10-62986 A | 3/1989 |
| JP | 1-126345 A | 5/1989 |
| JP | 2-38471 A | 2/1990 |
| JP | 2-245231 A | 10/1990 |
| JP | 8-123028 A | 5/1995 |
| JP | 8-48890 A | 2/1996 |
| JP | 8-123027 A | 5/1996 |
| JP | 8-259876 A | 10/1996 |

(Continued)

OTHER PUBLICATIONS

Computer-generated translation of JP 2006-162784 (Jun. 2012).*
Advanced Process Technologies and Chemicals for Color Filters, published by CMC Publishing, Ltd., pp. 129-150, Jan. 31, 2006 (27 pages with partial translation).
Computer-generated translation of JP 11-258794 (Sep. 1999).
EP Communication, dated Mar. 23, 2009, issued in EP Application No. 08153431.5.

(Continued)

*Primary Examiner* — John A. McPherson
(74) *Attorney, Agent, or Firm* — Sughrue Mion, PLLC

(57) ABSTRACT

The present invention provides a pigment-dispersed composition including at least a polymer compound (A-1) having at least one selected from the structural units represented by the following formulae (1) to (3), a pigment (B) and a solvent (C), and a pigment-dispersed composition including at least a resin (D) having an acid number of 100 mg KOH/g or more, a dispersion resin (A-2) having an acid number of less than 100 mg KOH/g and an unsaturation equivalent of less than 600, a pigment (B), and a solvent (C) [$R^1$ to $R^{20}$: a hydrogen atom, a monovalent organic group; $A^1$ to $A^3$: an oxygen atom, a sulfur atom, —N($R^{21}$)—; $G^1$ to $G^3$: a divalent organic group; X, Z: an oxygen atom, a sulfur atom, —N($R^{22}$)—; Y: an oxygen atom, a sulfur atom, a phenylene group, —N($R^{23}$)—; and $R^{21}$ to $R^{23}$: an alkyl group].

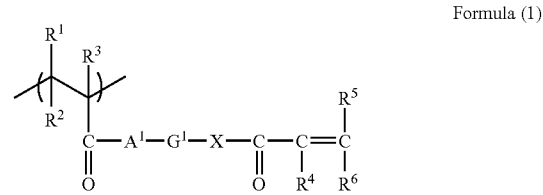

Formula (1)

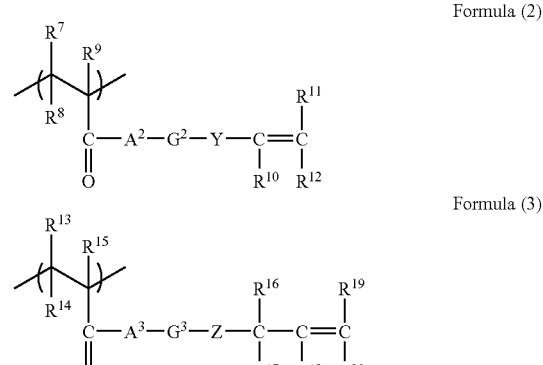

Formula (2)

Formula (3)

13 Claims, 3 Drawing Sheets

(56) References Cited

FOREIGN PATENT DOCUMENTS

| | | | |
|---|---|---|---|
| JP | 10-133010 A | | 5/1998 |
| JP | 10-332929 A | | 12/1998 |
| JP | 11-066617 A | | 3/1999 |
| JP | 11-258794 A | | 9/1999 |
| JP | 11-258819 A | | 9/1999 |
| JP | 2000-113516 A | | 4/2000 |
| JP | 2000-321763 A | | 11/2000 |
| JP | 2001-337450 A | | 12/2001 |
| JP | 2001-342364 A | | 12/2001 |
| JP | 2002-203321 A | | 7/2002 |
| JP | 2003-29018 A | | 1/2003 |
| JP | 2003-262958 A | | 9/2003 |
| JP | 2004-138950 A | | 5/2004 |
| JP | 2004-219980 A | | 8/2004 |
| JP | 2004-287230 A | | 10/2004 |
| JP | 2005-148717 A | | 6/2005 |
| JP | 2005-157311 A | | 6/2005 |
| JP | 2006-016545 A | | 1/2006 |
| JP | 2006-098684 A | | 4/2006 |
| JP | 2006-124664 A | | 5/2006 |
| JP | 2006-162784 A | * | 6/2006 |
| JP | 2006-215452 A | | 8/2006 |
| JP | 2006-215453 A | | 8/2006 |
| JP | 2006-301055 A | | 11/2006 |
| JP | 2006-338043 A | | 12/2006 |
| JP | 2007-058192 A | | 3/2007 |
| JP | 2007-206165 A | | 8/2007 |
| JP | 2008-056967 A | | 3/2008 |
| JP | 2010-515098 A | | 5/2010 |
| WO | 2004/106444 A1 | | 12/2004 |

OTHER PUBLICATIONS

Office Action dated Feb. 18, 2011 in U.S. Appl. No. 12/058,693.
Office Action dated Jul. 27, 2011 in U.S. Appl. No. 12/058,693.
Recent Technological Trend in Color Filters, published by Johokiko Co., Ltd., pp. 85-87, May 31, 2005 (8 pages with translation).
Ueki et al., "A color filter for 10.4-inch TFT-LCD of 512-color display," Proceedings of the 7th Joint Conference on Color Technology, Oct. 30-31, 1990, pp. 89-92 (8 pages including partial translation).
Office Action dated Apr. 2, 2013 in Japanese Application No. 2007-044675.
Office Action dated Apr. 30, 2013 in Taiwan Application No. 96150185.
Information Statement filed on May 29, 2013 in Japanese Patent Application No. 2007-337823 with Partial English Translation.
Information Statement filed on May 30, 2013 in Japanese Patent Application No. 2007-337823 with Partial English Translation.
Office Action dated Jul. 30, 2012 in Chinese Application No. CN 200780048138.7.
Office Action dated Sep. 29, 2013 in corresponding Chinese Application No. 200780048138.7.
Office Action dated Nov. 6, 2013 in corresponding Korean Application No. 2009-7105340.
Office Action dated Feb. 5, 2013 on Japanese Application No. 2007-337823.
Office Action dated Feb. 1, 2013 on Chinese Patent Application 200780048138.7.
Office Action dated May 15, 2012 in Japanese Application No. JP 2007-044675.
Office Action dated Feb. 4, 2014 in Japanese Application No. 2007-337823.

* cited by examiner

PIGMENT-DISPERSED COMPOSITION, CURABLE COMPOSITION, COLOR FILTER AND PRODUCTION METHOD THEREOF

TECHNICAL FIELD

The present invention relates to a pigment-dispersed composition which may be used for constituting imaging materials such as color filters or color proofs, or photocurable materials such as inks or coating materials; a curable composition which is suitable for the formation of colored regions such as color filters that are used in liquid crystal display elements (LCD), solid state image pick-up elements (CCD, CMOS, etc.) or the like; a color filter employing the curable composition; and production methods thereof.

BACKGROUND ART

Pigments have been conventionally used in a wide variety of applications, as they exhibit vivid color tones and high tinctorial strength. Among these pigments, those presenting practical importance in general are frequently of minute particles, and thus vivid color tones and high tinctorial strength are obtained by preventing the aggregation of the pigment particles and micronizing the particles. However, further micronization of the pigment results in an increase in the surface area, whereby particle aggregation is promoted, and thus many of such dispersions of pigment exhibit high viscosities. For this reason, when these pigment dispersions are prepared in an industrial scale, there occur problems such as that removal of the pigment dispersion from a dispersing machine becomes difficult, transportation through pipelines is not possible, or the pigment dispersion gelates during storage to become unusable.

Thus, it has been known hitherto that various dispersants are used to obtain pigment dispersions or colored photosensitive compositions having excellent fluidity, dispersibility and the like. These dispersants are roughly classified into polymeric dispersants and low molecular weight compound dispersants.

Examples of the polymeric dispersants include polyacrylic acid salts, sodium maleate olefin copolymers, terminal carboxyl group-containing polyesters (see, for example, Japanese Patent Application Publication (JP-B) No. 54-34009), polyesters having an acid group and/or a basic group, prepared from tetrakis(2-hydroxyalkyl)ethylenediamine as a starting material (see, for example, Japanese Patent Application Laid-Open (JP-A) No. 2-245231), macromonomers (oligomers having an ethylenic unsaturated group at the terminal), monomers having a hydroxyl group, copolymers including a carboxyl group-containing monomer and four species of monomers other than the carboxyl group-containing monomer (see, for example, JP-A No. 8-259876), and the like.

As for the low molecular weight compound dispersants, sorbitan fatty acid esters, polyoxyethylene alkylamines, alkyldiamines, alkanolamine derivatives and the like are known (see, for example, U.S. Pat. No. 3,536,510), and there are also exemplary dispersants having pigment nuclei introduced thereinto (see, for example, JP-B No. 5-72943, and JP-A No. 8-48890).

Meanwhile, a colored photosensitive composition containing a pigment is useful as a material for color filters used in solid state image pick-up elements, liquid crystal displays and the like, and in the case of producing a color filter using the colored photosensitive composition, a pigment dispersion process which is excellent in terms of quality, production stability or the like, is being widely employed.

Inter alia, when a color filter employing a pigment is used as a color filter for liquid crystal displays, it is required that the particle size of the colorant (organic pigments, etc.) used is finer for an improvement of contrast (see, for example, JP-A No. 2000-321763). This is due to the fact that light scattering, birefringence and the like caused by the pigment result in the rotation of the polarization axis. If micronization of the pigment is insufficiently carried out, light scattering and absorption by the pigment bring forth a decrease in the light transmittance, thereby the display contrast being lowered, and the curing sensitivity at the time of patterning by exposure is decreased (see, for example, a color filter of 512-color display for 10.4-inch TFT-LCD; Ueki, Ozeki, Fukunaga and Yamanaka, the $7^{th}$ Color Optical Conference, 1990). For this reason, it is required for a colored photosensitive composition containing a dispersed pigment, that the pigment is dispersed in a micronized state.

As the pigment is micronized as described above, the surface area of the pigment is increased, and thus there is a tendency that the use of micronized pigment leads to an increase in the amount of dispersant to be added, which is needed to disperse the pigment in a curable composition. Furthermore, in a curable composition for the color filter application, the content of colorant (organic pigment) occupying among the solids is required to be higher for an improvement of color purity. However, if a dispersant or colorant is incorporated into a curable composition at a high concentration, the contents of photopolymerization initiator and photopolymerizable monomer occupying in the curable composition are relatively decreased. Thus, low energy curability is desired for an improvement in the yield rate through shortening of the exposure time for a curable composition, and on the other hand, there is a problem that it is difficult to obtain the curability in exposed parts.

Also for a curable composition for the use in color filters for solid state image pick-up element, low energy curing is desirable. With regard to a color filter for solid state image pick-up element, since film thickness reduction for colored patterns is in progress under the purpose of image quality improvement through high light harvesting property and high photo color separation property, the pigment concentration in the composition tends to increase along with this film thickness reduction.

Moreover, for a pigment-based color filter, color unevenness is likely to occur because the pigment consists of relatively coarse particles. Therefore, as the micronization of pigment is achieved to reduce this color unevenness, the content of pigment dispersant in the curable composition tends to increase. Accordingly, there is a problem concerning the difficulties in obtaining curability.

In order to cope with the problems such as color unevenness in a colored pattern formed, there has been suggested a technology of using an organic solvent-soluble dye as the colorant, in place of pigment (see, for example, JP-A No. 2003-029018). For such dye-based color filters, an increase in the concentration of dye is accompanied by significant problems such as a polymerization inhibitory effect originating from the dyes, or decreased stability over time as shown through dye precipitation.

As discussed above, with regard to a curable composition for the use in color filters, the contents of the photopolymerization initiator and the photopolymerizable monomer, which are necessary components for curing the curable composition, are limited, and the concentration of colorant has been increased, for both the applications in liquid crystal displays and solid state image pick-up elements. Thus, there have been problems of low sensitivity, unsatisfactory curing, insufficient contact characteristics with substrate, and the like.

In regard to these problems, a technology of improving the sensitivity by imparting polymerizability to a resin which has been introduced mainly to impart film forming property or development performance, is being investigated (see, for example, JP-A No. 2000-321763, JP-A No. 2003-029018, Recent Technological Trend in Color Filters (pp. 85-87, published by Johokiko Co., Ltd.), and Advanced Process Technologies and Chemicals for Color Filters (pp. 129-150, published by CMC Publishing, Ltd.)).

However, even with the resin as described above, satisfactory photosensitivity has not yet been attained. Therefore, in fact, problems such as film shrinkage at cured parts, and a decrease in the color density (decoloration) due to the diffusion of fine pigment particles from the cured parts into the developer solution, still remain unresolved.

Since the exposure sensitivity is insufficient, there is also a problem that curing occurs insufficiently in the deeper parts, such as the vicinity of the interface with a substrate, of a membrane prepared using a curable composition, thereby the adhesiveness to the substrate being poor, and the shape of the pattern becoming inversely tapered. Moreover, for the applications of color filters having a plurality of color patterns, there are also unresolved problems such as that when a pattern of a first color is formed, and then a coating solution for forming a pattern of a second color is applied, the pigment of the first color is diffused into the coating solution of the second color, and the color density is decreased (decolorized).

Such a resin as described above also has problems of complicated synthesis route, fewer variations in the synthesis, and the like.

DISCLOSURE OF INVENTION

The present invention has been made in view of the above circumstances, and provides a pigment-dispersed composition, curable composition, and color filter and production method thereof.

According to a first aspect of the invention, there is provided a pigment-dispersed composition including at least a polymer compound (A-1) having at least one selected from the structural units represented by the following formulae (1) to (3), a pigment (B), and a solvent (C):

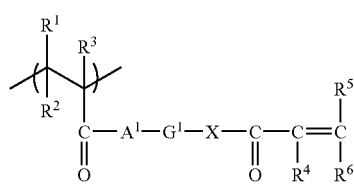

Formula (1)

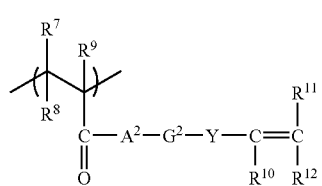

Formula (2)

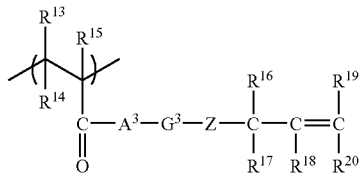

Formula (3)

In the formulae (1) to (3), $R^1, R^2, R^3, R^4, R^5, R^6, R^7, R^8, R^9, R^{10}, R^{11}, R^{12}, R^{13}, R^{14}, R^{15}, R^{16}, R^{17}, R^{18}, R^{19}$ and $R^{20}$ each independently represent a monovalent organic group; $A^1, A^2$ and $A^3$ each independently represent an oxygen atom, a sulfur atom or $—N(R^{21})—$, wherein $R^{21}$ represents an alkyl group which may be substituted; $G^1, G^2$ and $G^3$ each independently represent a divalent organic group; X and Z each independently represent an oxygen atom, a sulfur atom or $—N(R^{22})—$, wherein $R^{22}$ represents an alkyl group which may be substituted; and Y represents an oxygen atom, a sulfur atom, a phenylene group which may be substituted, or $—N(R^{23})—$, wherein $R^{23}$ represents an alkyl group which may be substituted.

According to a second aspect of the invention, there is provided a curable composition including a polymer compound (A-1) having at least one selected from the structural units represented by the above formulae (1) to (3), a pigment (B), a solvent (C), and a photopolymerization initiator (E).

According to a third aspect of the invention, there is provided a color filter including a colored pattern which is formed on a support using the curable composition of the second aspect.

According to a fourth aspect of the invention, there is provided a production method for a color filter, including coating the curable composition of the second aspect on a support to form a colored layer, exposing the coated layer through a patterned mask, and developing the colored layer after the exposure to form a colored pattern.

According to a fifth aspect of the invention, there is provided a pigment-dispersed composition including at least a resin (D) having an acid number of 100 mg KOH/g or more, a dispersion resin (A-2) having an acid number of less than 100 mg KOH/g and an unsaturation equivalent of less than 600, a pigment (B), and a solvent (C).

According to a sixth aspect of the invention, there is provided a curable composition including at least a resin (D) having an acid number of 100 mg KOH/g or more, a dispersion resin (A-2) having an acid number of less than 100 mg KOH/g and an unsaturation equivalent of less than 600, a pigment (B), a solvent (C), and a photopolymerization initiator (E).

According to a seventh aspect of the invention, there is provided a color filter including a colored pattern which is formed on a support using the curable composition of the sixth aspect.

According to an eighth aspect of the invention, there is provided a production method for a color filter, including coating the curable composition of the sixth aspect on a support to form a colored layer, exposing the coated layer through a patterned mask, and developing the colored layer after the exposure to form a colored pattern.

BRIEF DESCRIPTION OF THE DRAWINGS

Exemplary embodiments of the present invention will be described in detail based on the following figures, wherein.

BEST MODE FOR CARRYING OUT THE INVENTION

Figure 1A:
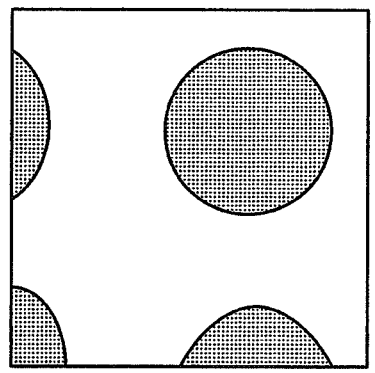
FIG. 1A is a diagram showing a pattern of the worst shape.

Hereinafter, pigment-dispersed composition, curable composition, and color filter and production method thereof of the invention will be described in detail.

<Pigment-Dispersed Composition>

The pigment-dispersed composition according to the first aspect of the invention includes at least a polymer compound (A-1) having at least one selected from the structural units represented by the following formulae (1) to (3), a pigment (B), and a solvent (C), and if necessary, may be constructed using other additional components.

The invention according to the first aspect is based on the following mechanism in which is presumed by being used a specific dispersion resin as a dispersant for pigment. However, the mechanism of the invention is not necessarily definite, but is presumed to be as follows.

That is, in the first aspect of the invention, the specific dispersion resin having unsaturated bonds is added at the time of dispersing the pigment, whereby the pigment is efficiently dispersed within the dispersion resin, and since this dispersion resin is cured by a cross-linking reaction while the pigment is contained therein, diffusion of the pigment into a developer solution or a coating solution is suppressed. If the unsaturation equivalent of this dispersion resin is small, when the resin is formed into a film, the amount of double bonds in the film is increased, and the exposure sensitivity may be improved to a large extent. Thus, when the curable composition of the invention is provided on a support to form a film, curing is achieved well even in the deep parts of the film, such as in the vicinity of the interface of the substrate, and the adhesiveness to the support becomes excellent, whereby the shape of the pattern is inhibited from being inversely tapered. Furthermore, since aggregation of the pigment is inhibited, penetration of a developer solution at uncured, unexposed parts rapidly proceeds, and as a result, removability of the unexposed parts is improved; on the other hand, sufficient curability is obtained at cured, exposed parts, and the influence of the developer solution or the like is suppressed. Therefore, with regard to the pattern formation using the curable composition according to the first aspect of the invention, it is conceived that a combination of excellent curability at the exposed parts and excellent removability at the unexposed parts allows a good pattern having a desired shape of the cross-section to be obtained (in particular, when the layered pattern is cut in a plane which is vertical to the layer surface, the pattern profile of the cut surface is tapered or rectangular in shape).

The pigment-dispersed composition according to the second aspect of the invention includes at least a resin (D) having an acid number of 100 mg KOH/g or more, a dispersion resin (A-2) having an acid number of less than 100 mg KOH/g and an unsaturation equivalent of less than 600, a pigment (B), and a solvent (C), and if necessary, the composition may be formed using other additional components.

The invention according to the second aspect is based on the fact that since a combined use of both a resin having a high acid number and a resin having a small unsaturation equivalent upon dispersing a pigment is advantageous in terms of easy synthesis, and the invention is effective in simultaneously satisfying multiple functions such as dispersibility of the dispersed pigment, development performance, dispersion stability and sensitivity of when a curable composition is prepared. Yet, although the cause for such characteristics is not clear, it is presumed to be as follows.

In the second aspect of the invention, when (A) a resin of high acid number, which imparts development performance or solvent solubility, is used in combination with a resin having unsaturated doubles bonds, which serves as another resin having good compatibility with this resin of high acid number, the "pigment aggregation promoted as the acid groups of the dispersion resin bridge between a plurality of pigment particles," which has been heretofore considered as a problem, is sterically inhibited, and thus the pigment is efficiently dispersed. As the whole system is cured by a cross-linking reaction, with the pigment being contained therein, diffusion of the pigment into a developer solution or a coating solution is suppressed. Since the (B) resin having an unsaturation equivalent of less than 600, which is a resin having unsaturated double bonds, has a high density of unsaturated bonds, when the resin is formed into a film, the amount of double bonds in the film is increased, and the exposure sensitivity may be improved to a large extent. Thus, when the curable composition of the invention is provided on a support to form a film, curing is well achieved even in the deep parts of the film, such as in the vicinity of the interface of the substrate, and the adhesiveness to the support becomes excellent, thereby the shape of the pattern being inhibited from being inversely tapered. Furthermore, since aggregation of the pigment is suppressed by the resin (B), penetration of a developer solution at uncured, unexposed parts proceeds rapidly, and the resin of high acid number (A) has a high acid number and promotes the penetration of a developer solution, while diffusion into a developer solution of the resin (B) and the pigment (C) is promoted, thereby removability of the unexposed parts being improved as a result. On the other hand, sufficient curability is obtained at cured, exposed parts, and the influence of the developer solution or the like is suppressed. Therefore, with regard to the pattern formation using the curable composition according to the second aspect of the invention, it is conceived that a combination of excellent curability at the exposed parts and excellent removability at the unexposed parts allows a good pattern having a desired shape of the cross-section to be obtained. When the curable composition according to the second aspect of the invention is provided on a support to form a film, curing is well achieved even in the deep parts of the film, such as in the vicinity of the interface of the substrate, and the adhesiveness to the support becomes excellent, whereby the shape of the pattern is inhibited from being inversely tapered.

Hereinafter, the respective components constituting the pigment-dispersed composition according to the first aspect and the second aspect of the invention will be described in detail.

(A) Polymer Compound (Dispersion Resin)

The pigment-dispersed composition according to the first aspect of the invention includes (A-1) at least one of the polymer compounds having at least one selected from the structural units represented by the following formulae (1) to (3) (hereinafter, may also be referred to as "dispersion resin according to the first aspect of the invention"). When the polymer compound having a structural unit having an unsaturated double bond moiety, represented by any one of the formulae (1) to (3) is contained, the aggregation of pigment is suppressed, regardless of the size of the amount of pigment, and thus fine dispersibility and stability over time after dispersion of the pigment are improved and furthermore the tinctorial strength is improved.

The pigment-dispersed composition according to the second aspect of the invention includes (A-2) at least one dispersion resin having an acid number of less than 100 mg KOH/g and an unsaturation equivalent of less than 600 (hereinafter, may also be referred to as "dispersion resin according to the second aspect of the invention"). When this dispersion resin is contained together with the resin of high acid number according to the invention that will be described later, the compatibility with the resin of high acid number is high, and thus the solvent solubility of the resin of high acid number is improved. Also, regardless of the size of the amount of pigment, since aggregation of the pigment is suppressed, the fine dispersibility and stability over time after dispersion of the pigment are improved, and furthermore the tinctorial strength is improved.

In addition, the dispersion resin according to the first aspect and the dispersion resin according to the second aspect of the invention may be collectively referred to as a "dispersion resin according to the invention".

The dispersion resin according to the second aspect of the invention has an acid number of less than 100 mg KOH/g and an unsaturation equivalent of less than 600, and is a resin other than the (A) resin of high acid number according to the invention described above. The unsaturation equivalent means the molecular weight of a resin (calculated value) per one unsaturated bond. According to the invention, if the unsaturation equivalent of the dispersion resin contained is 600 or more, the photopolymerizability attained by introducing unsaturated groups is insufficient, and thus photosensitivity cannot be secured. Also, a decrease in the polymerizability leads to a decrease in the adhesiveness to the support as well, and thus a pattern which is tapered or rectangular in shape cannot be obtained.

The acid number of the dispersion resin according to the first aspect of the invention is preferably 20 to 300, more preferably 40 to 200, and even more preferably 60 to 150, from the viewpoint of a balance between dispersion stability, development performance and sensitivity.

The acid number of the dispersion resin according to the second aspect of the invention is less than 100 mg KOH/g. The acid number is preferably 10 mg KOH/g or more and less than 100 mg KOH/g, more preferably 30 mg KOH/g or more and less than 100 mg KOH/g, and even more preferably 50 mg KOH/g or more and less than 100 mg KOH/g, from the viewpoint of a balance between dispersion stability, development performance and sensitivity.

Representative examples of the dispersion resin according to the second aspect of the invention include a resin obtained by reacting a carboxyl group-containing resin with a glycidyl group-containing unsaturated compound such as glycidyl (meth)acrylate or allyl glycidyl ether, or with an unsaturated alcohol such as allyl alcohol, 2-hydroxyacrylate or 2-hydroxymethacrylate; a resin obtained by reacting a carboxyl group-containing resin having a hydroxyl group, with a free isocyanate group-containing unsaturated compound or an unsaturated acid anhydride; a resin obtained by reacting an addition reaction product between an epoxy resin and an unsaturated carboxylic acid, with a polybasic acid anhydride; a resin obtained by reacting an addition reaction product between a conjugated diene copolymer and an unsaturated dicarboxylic acid anhydride, with a hydroxyl group-containing polymerizable monomer; a resin having an unsaturated group introduced by synthesizing a resin having a specific functional group, which undergoes an elimination reaction by a treatment with base and gives an unsaturated group, and treating the resin with a base; and the like.

Among these, a resin obtained by reacting a carboxyl group-containing resin with a glycidyl group-containing unsaturated compound such as glycidyl (meth)acrylate or allyl glycidyl ether; a resin obtained by reacting a resin which has been produced by polymerizing a hydroxyl group-containing (meth)acrylic acid ester compound, with a free isocyanate group-containing (meth)acrylic acid ester, such as (meth)acrylic acid-ethyl 2-isocyanate; a resin having a structural unit represented by any one of the following formulae (1) to (3); a resin having an unsaturated group introduced by synthesizing a resin having a specific functional group, which undergoes an elimination reaction by a treatment with base gives an unsaturated group, and treating the resin with a base; and the like are more preferred.

The dispersion resin according to the second aspect of the invention is preferably a polymer compound having, as an unsaturated double bond moiety, at least one selected from the structural units represented by any one of the following formulae (1) to (3).

Hereinafter, the polymer compound having at least one selected from the structural units represented by any one of the formulae (1) to (3) will be described.

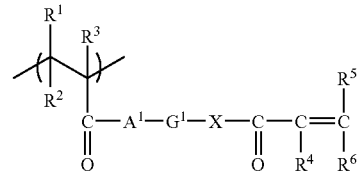

Formula (1)

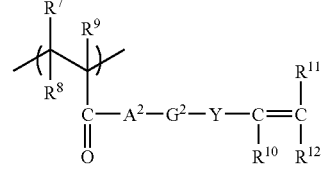

Formula (2)

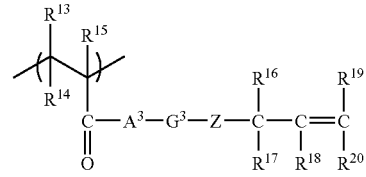

Formula (3)

In the formula (1) to (3), $A^1$, $A^2$ and $A^3$ each independently represent an oxygen atom, a sulfur atom or $-N(R^{21})-$, wherein $R^{21}$ represents an alkyl group which may be substituted; $G^1$, $G^2$ and $G^3$ each independently represent a divalent organic group; X and Z each independently represent an oxygen atom, a sulfur atom or —$N(R^{22})$—, wherein $R^{22}$ represents an alkyl group which may be substituted; Y represents an oxygen atom, a sulfur atom, a phenylene group which may be substituted, or —$N(R^{23})$—, wherein $R^{23}$ represents an alkyl group which may be substituted; and $R^1$ to $R^{20}$ each independently represent a hydrogen atom or a monovalent organic group.

In the formula (1) described above, $R^1$ to $R^3$ each independently represent a hydrogen atom or a monovalent organic group, and a hydrogen atom, an alkyl group which may be substituted, or the like may be included. Among them, $R^1$ and $R^2$ are preferably hydrogen atoms, while $R^3$ is preferably a hydrogen atom or a methyl group.

$R^4$ to $R^6$ each independently represent a hydrogen atom or a monovalent organic group. $R^4$ may include a hydrogen atom, an alkyl group which may be substituted, and the like, and among them, a hydrogen atom, a methyl group and an ethyl group are preferred. $R^5$ and $R^6$ may each independently include a hydrogen atom, a halogen atom, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, or the like. Among them, a hydrogen atom, an alkoxycarbonyl group, an alkyl group which may be substituted, and an aryl group which may be substituted are preferred.

Here, the substituents which may be introduced include a methoxycarbonyl group, an ethoxycarbonyl group, an isopropyloxycarbonyl group, a methyl group, an ethyl group, a phenyl group, and the like.

$A^1$ represents an oxygen atom, a sulfur atom or —$N(R^{21})$—, and X represents an oxygen atom, a sulfur atom or —$N(R^{22})$—. Here, $R^{21}$ and $R^{22}$ may include an alkyl group which may be substituted.

$G^1$ represents a divalent organic group, however is preferably an alkylene group which may be substituted. More preferably, $G^1$ may include an alkylene group having 1 to 20 carbon atoms which may be substituted, a cycloalkylene group having 3 to 20 carbon atoms which may be substituted, an aromatic group having 6 to 20 carbon atoms which may be substituted, and the like, and among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^1$ preferably include those other than a hydroxyl group, among the groups in which a hydrogen atom is bound to a heteroatom, for example, those not containing an amino group, a thiol group or a carboxyl group.

In the formula (2) described above, $R^7$ to $R^9$ each independently represent a hydrogen atom or a monovalent organic group, and $R^7$ to $R^9$ may include a hydrogen atom, an alkyl group which may be substituted, and the like. Among them, $R^7$ and $R^8$ are preferably hydrogen atoms, while $R^9$ is preferably a hydrogen atom or a methyl group.

$R^{10}$ to $R^{12}$ each independently represent a hydrogen atom or a monovalent organic group, and specific examples of this organic group include a hydrogen atom, a halogen atom, a dialkylamino group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, and the like. Among them, a hydrogen atom, an alkoxycarbonyl group, an alkyl group which may be substituted, and an aryl group which may be substituted are preferred.

Here, the substituents which may be introduced include the same groups as those mentioned for the formula (1).

$A^2$ represents an oxygen atom, a sulfur atom or —$N(R^{21})$—, and $R^{21}$ may include a hydrogen atom, an alkyl group which may be substituted, and the like.

$G^2$ represents a divalent organic group, but is preferably an alkylene group which may be substituted. Preferably, $G^2$ includes an alkylene group having 1 to 20 carbon atoms which may be substituted, a cycloalkylene group having 3 to 20 carbon atoms which may be substituted, an aromatic group having 6 to 20 carbon atoms which may be substituted, and the like, and among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^2$ preferably include those other than a hydroxyl group, among the groups in which a hydrogen atom is bound to a heteroatom, for example, those not containing an amino group, a thiol group or a carboxyl group.

Y represents an oxygen atom, a sulfur atom, —$N(R^{23})$— or a phenylene group which may be substituted. Here, $R^{23}$ may include a hydrogen atom, an alkyl group which may be substituted, and the like.

In the formula (3), $R^{13}$ to $R^{15}$ each independently represent a hydrogen atom or a monovalent organic group, and may include a hydrogen atom, an alkyl group which may be substituted, and the like. Among them, $R^{13}$ and $R^{14}$ are preferably hydrogen atoms, while $R^{15}$ is preferably a hydrogen atom or a methyl group.

$R^{16}$ to $R^{20}$ each independently represent a hydrogen atom or a monovalent organic group, and examples of $R^{16}$ $^{to}$ $^{R20}$ may include a hydrogen atom, a halogen atom, a dialkylamino group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, and the like. Among them, a hydrogen atom, an alkoxycarbonyl group, an alkyl group which may be substituted, and an aryl group which may be substituted are preferred. The substituents which may be introduced include the same groups as those mentioned for the formula (1).

$A^3$ represents an oxygen atom, a sulfur atom or —$N(R^{21})$—, while Z represents an oxygen atom, a sulfur atom or —$N(R^{22})$—. $R^{21}$ and $R^{22}$ may include the same groups as those mentioned for the formula (1).

$G^3$ represents a divalent organic group, however is preferably an alkylene group which may be substituted. Preferably, $G^3$ may include an alkylene group having 1 to 20 carbon atoms which may be substituted, a cycloalkylene group having 3 to 20 carbon atoms which may be substituted, an aromatic group having 6 to 20 carbon atoms which may be substituted, and the like. Among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^3$ preferably include those other than a hydroxyl group, among the groups in which a hydrogen atom is bound to a heteroatom, for example, those not containing an amino group, a thiol group or a carboxyl group.

A compound containing the structural units represented by the formulae (1) to (3) in an amount ranging from 20% or more by mole to less than 95% by mole in one molecule, is preferred from the viewpoints of improved curability and reduced development scum. The amount of the structural units is more preferably in the range of 25 to 90% by mole, and even more preferably 30% or more by mole and less than 85% by mole.

The synthesis of the polymer compound having a structural unit represented by any of the formulae (1) to (3) may be performed on the basis of the synthesis methods described in JP-A No. 2003-262958, paragraphs [0027] to [0057]. Among these, synthesis method 1) in the same publication is preferred, and this method will be described in (1) as follows.

Specific examples of the polymer compound having a structural unit represented by any of the formulae (1) to (3) include the following polymer compounds 1 to 17.

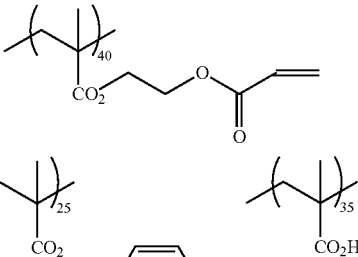
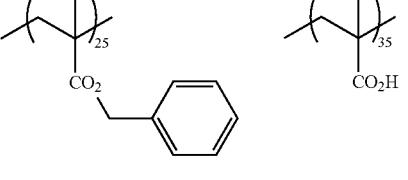
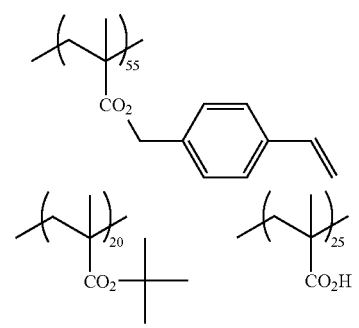
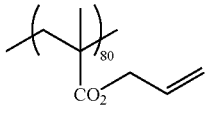
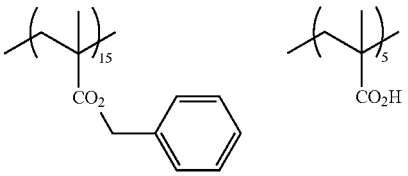
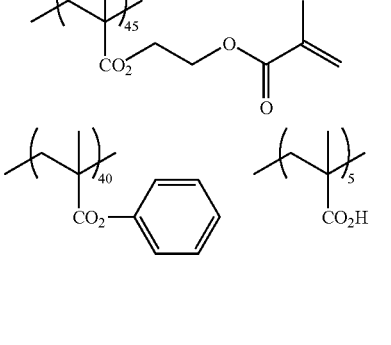
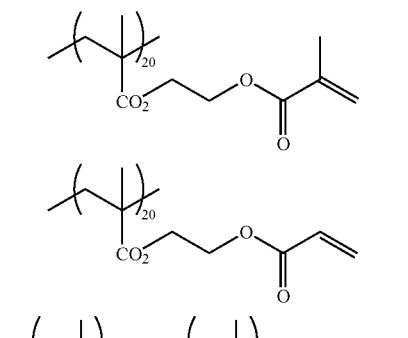

-continued
| | Composition (mol %) | Mw |
|---|---|---|
| 8 | 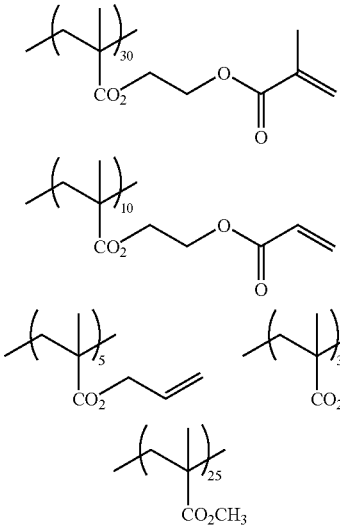 | 9700 |
| 9 | 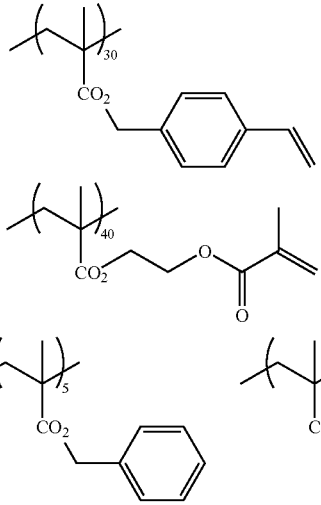 | 87000 |
| 10 | 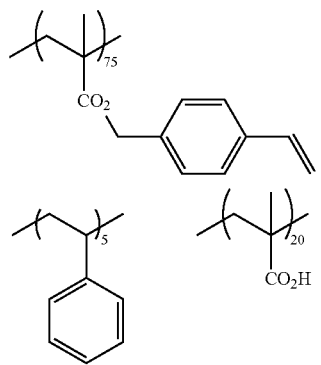 | 25000 |
-continued
| | Composition (mol %) | Mw |
|---|---|---|
| 11 | 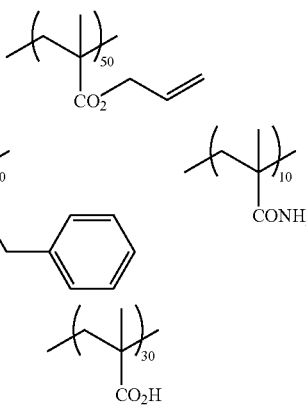 | 35000 |
| 12 | 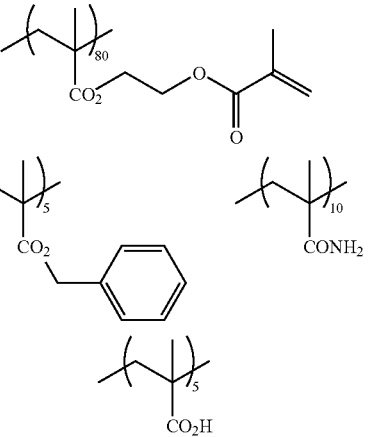 | 5600 |
| 13 | 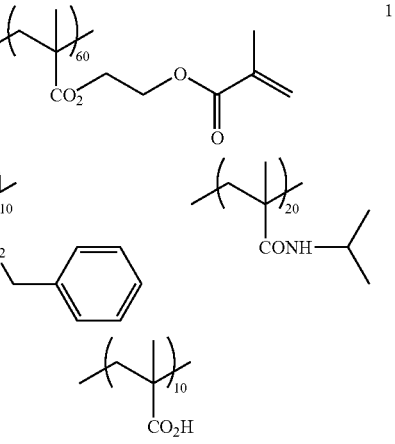 | 18000 |

| | Composition (mol %) | Mw |
|---|---|---|
| 14 | (structure: copolymer with units —CO₂—(CH₂)₂—O—C(=O)—C(CH₃)=CH₂ (40), —CO₂—cyclohexyl (30), —CONH—iPr (20), —CO₂H (10)) | 23000 |
| 15 | (structure: copolymer with units —CO₂—(CH₂)₆—O—C(=O)—C(CH₃)=CH₂ containing ether linkage (55), —CO₂—CH₂—phenyl (10), —CONH₂ (10), —CO₂H (25)) | 58000 |
| 16 | (structure: copolymer with units —CO₂—(CH₂)₂—O—C(=O)—CH=CH₂ (90), —CO₂—CH₂—phenyl (5), —CO₂H (5)) | 76000 |
| 17 | (structure: copolymer with units —CO₂—(CH₂)₂—O—C(=O)—C(CH₃)=CH₂ (70), —CO₂—CH₂—phenyl (20), —CONH₂ (5), —CO₂H (5)) | 2300 |

The dispersion resin according to the first aspect of the invention is preferably a polymer compound having an unsaturation equivalent of less than 600. The dispersion resin according to the second aspect of the invention has an unsaturation equivalent of less than 600.

Here, the unsaturation equivalent means the molecular weight of a resin per one unsaturated bond.

If the unsaturation equivalent of the dispersion resin of the invention is less than 600, good photopolymerizability is achieved by introducing unsaturated groups, photosensitivity may be secured, the adhesiveness to a support is maintained by suppressing a decrease in the polymerizability, and a pattern which is tapered or rectangular in shape is obtained.

The "unsaturation equivalent" in regard to the first aspect and the second aspect of the invention is preferably 580 or less, more preferably 550 or less, and even more preferably 500 or less, from the viewpoints of securing a photosensitivity required in photopolymerization, and achieving the adhesiveness to a support and the formability of a pattern having a tapered or rectangular shape. Furthermore, the lower limit of the unsaturated equivalent is preferably 150. If the unsaturated equivalent is suppressed to a value of 150 or more, an increase in the viscosity is suppressed upon dispersing a pigment, and a composition having better dispersion stability under storage is obtained.

In addition, the unsaturation equivalent may be determined by a calculation based on the molecular weight of the subject resin.

As for the dispersion resin according to the first aspect of the invention, representative resins include, in addition to the polymer compound having at least one selected from the structural units represented by the formulae (1) to (3), for example, a resin obtained by reacting a carboxyl group-containing resin with a glycidyl group-containing unsaturated compound such as glycidyl (meth)acrylate or allyl glycidyl ether, or with an unsaturated alcohol such as allyl alcohol, 2-hydroxyacrylate or 2-hydroxymethacrylate; a resin obtained by reacting a carboxyl group-containing resin having a hydroxyl group, with a free isocyanate group-containing unsaturated compound or an unsaturated acid anhydride; a resin obtained by reacting an addition reaction product between an epoxy resin and an unsaturated carboxylic acid, with a polybasic acid anhydride; a resin obtained by reacting an addition reaction product between a conjugated diene copolymer and an unsaturated dicarboxylic acid anhydride, with a hydroxyl group-containing polymerizable monomer; a resin having an unsaturated group introduced by synthesizing a resin having a specific functional group, which undergoes an elimination reaction by a treatment with base and gives an unsaturated group, and treating the resin with a base; and the like.

Among those described above, a resin obtained by reacting a carboxyl group-containing resin with a glycidyl group-containing unsaturated compound such as glycidyl (meth)acrylate or allyl glycidyl ether; a resin obtained by reacting a resin which has been prepared by polymerizing a hydroxyl group-containing (meth)acrylic acid ester compound, with a free isocyanate group-containing (meth)acrylic acid ester, such as (meth)acrylic acid-ethyl 2-isocyanate; a resin having an unsaturated group introduced by synthesizing a resin having a specific functional group, which undergoes an elimination reaction by a treatment with base and gives an unsaturated group, and treating the resin with a base; and the like are more preferred.

Additionally, the resins obtained by the following synthesis method (1) or (2) may be preferable.

(1) A method of extracting a proton using a base from a polymer employing a compound represented by the following formula (4) as a copolymerizable component, and eliminating L to obtain the desired polymer compound having the structure represented by formula (1).

In the formula (4), L represents an anionic elimination group, and may be preferably a halogen atom, a sulfonic acid ester or the like. $R^3$ to $R^6$, $A^1$, $G^1$ and X have the same meanings as defined above for the formula (1), and as the base used to generate an elimination reaction, any of inorganic compounds and organic compounds may be used. Detailed and preferred embodiments of this method are described in paragraphs [0028] to [0033] of JP-A No. 2003-262958.

Preferred inorganic compound bases include sodium hydroxide, potassium hydroxide, sodium carbonate, sodium hydrogen carbonate, potassium carbonate, potassium hydrogen carbonate and the like. The organic compound bases include metal alkoxides such as sodium methoxide, sodium ethoxide and potassium t-butoxide, organic amine compounds such as triethylamine, pyridine, and diisopropylethylamine, and the like.

(2) A method of obtaining a radical reactive group by subjecting a polymer which used a compound represented by the following formula (5) as a copolymerization component, to an elimination reaction for a specific functional group involving a treatment with base, and thus removing $X^{10}$.

In the formula (5), $A^5$ represents an oxygen atom, a sulfur atom or —N($R^{54}$)—; $A^6$ represents an oxygen atom, a sulfur atom or —$NR^{58}$—; $R^{51}$, $R^{52}$, $R^{53}$, $R^{54}$, $R^{55}$, $R^{56}$, $R^{57}$ and $R^{58}$ each independently represent a hydrogen atom or a monovalent organic group; $X^{10}$ represents a group which is removed by the elimination reaction; $G^5$ represents an organic linking group; and n represents an integer from 1 to 10. Detailed and preferred embodiments of this method are described in detail in JP-A No. 2003-335814.

The resin obtained by the synthesis method of (2) may favorably include the polymer compounds described in JP-A No. 2003-335814, specifically, for example, (i) polyvinyl-based polymer compounds, (ii) polyurethane-based polymer compounds, (iii) polyurea-based polymer compounds, (iv) poly(urethan-eurea)-based polymer compounds, (v) polyester-based polymer compounds, (vi) polyamide-based polymer compounds, (vii) acetal-modified polyvinyl alcohol-based polymer compounds, and specific compounds obtained from each of these descriptions.

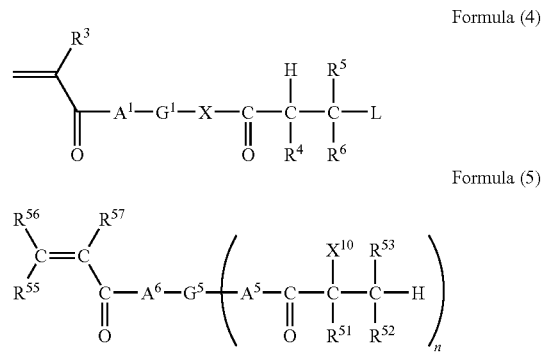

Examples of the compound represented by the above formula (4) include the following compounds (M-1) to (M-12). However, the compound are not limited thereto.

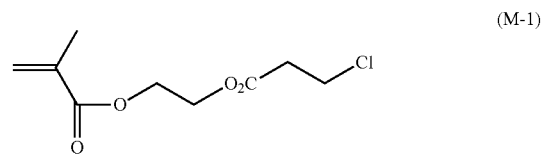

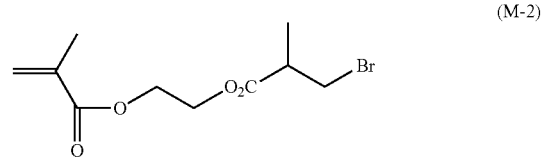

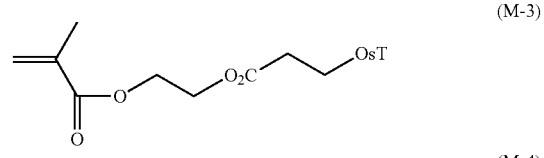

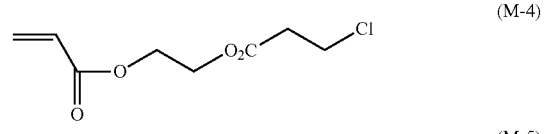

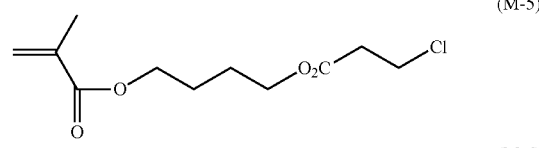

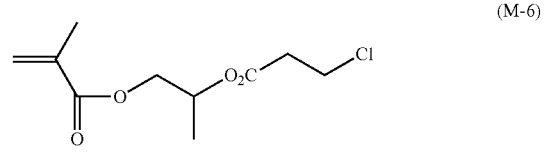

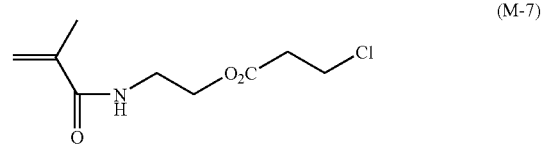

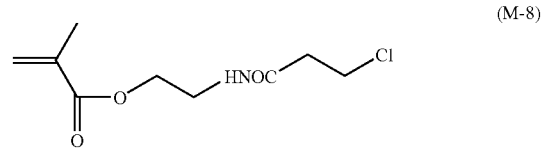

-continued
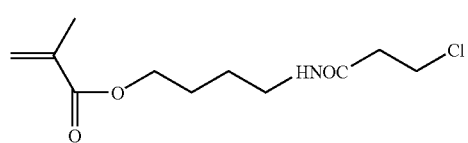 (M-9)
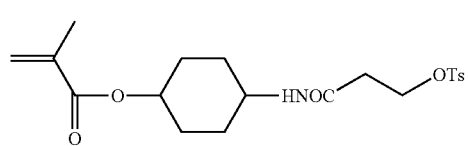 (M-10)
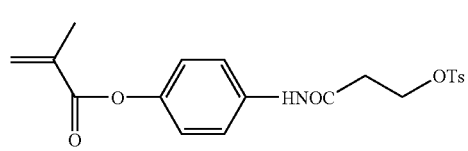 (M-11)
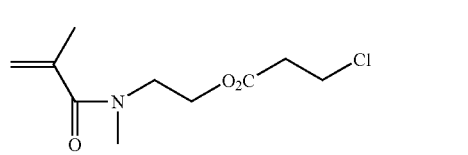 (M-12)
In the following, examples (i-1 to i-52) of the compounds represented by the above formula (5) will be listed below.
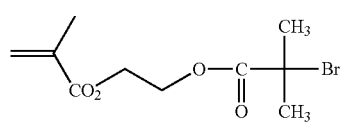 i-1
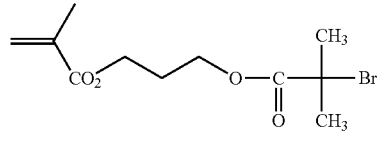 i-2
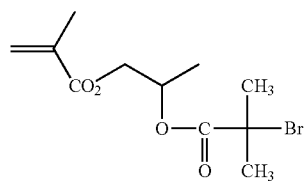 i-3
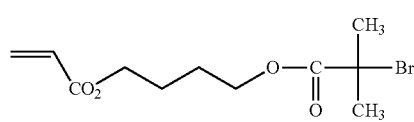 i-4
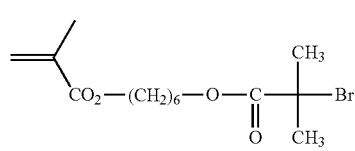 i-5
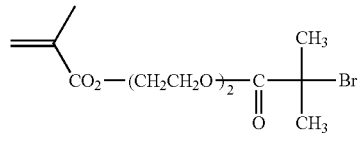 i-6
-continued
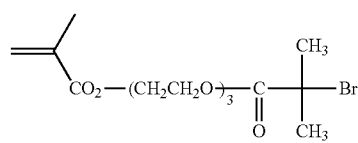 i-7
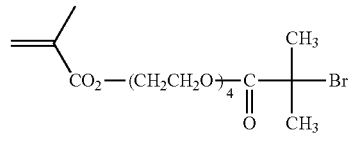 i-8
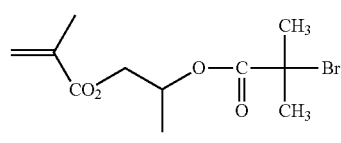 i-9
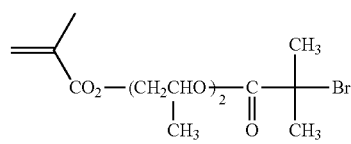 i-10
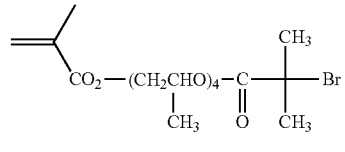 i-11
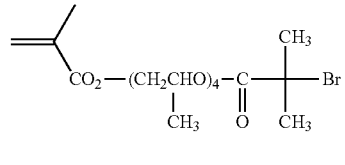 i-12
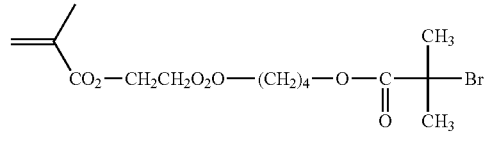 i-13
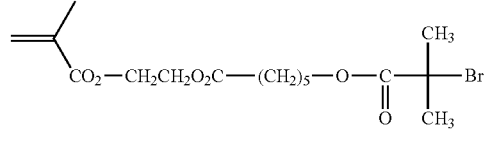 i-14
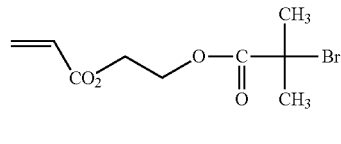 i-15
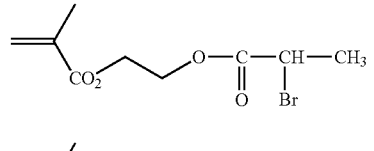 i-16
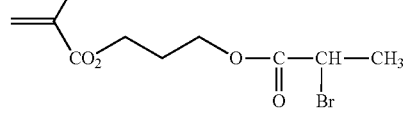 i-17

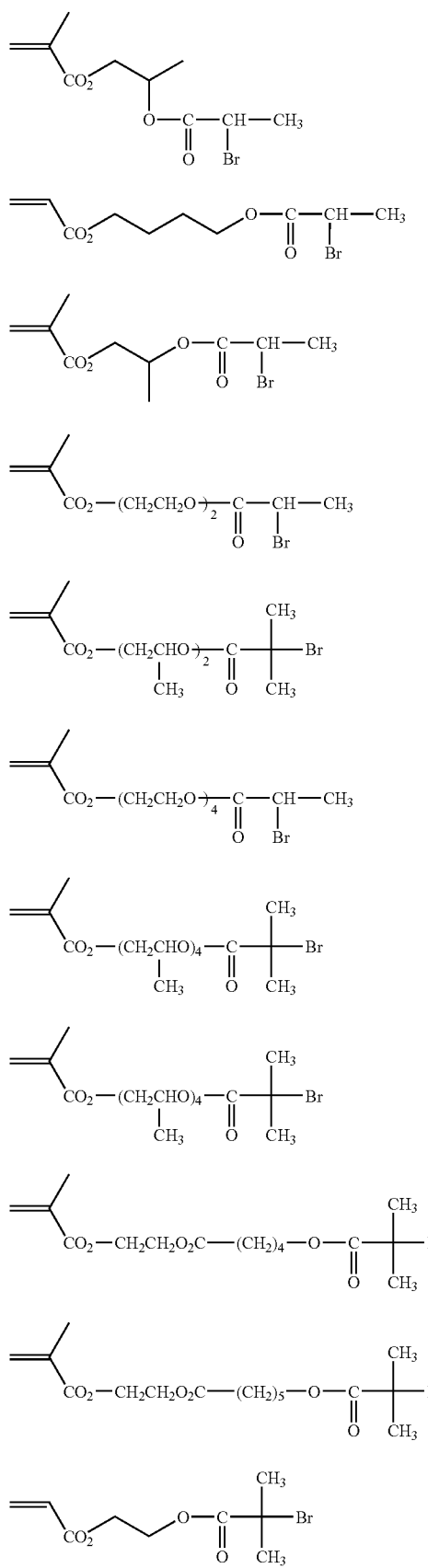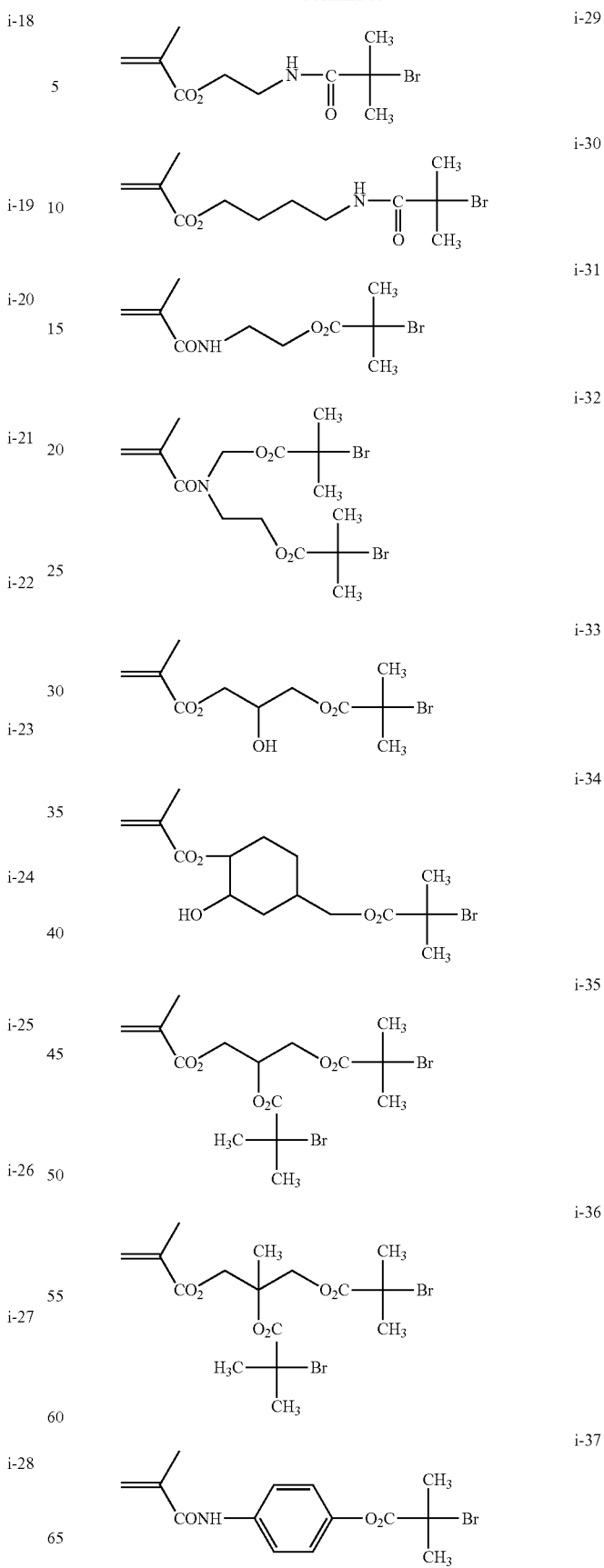

i-38 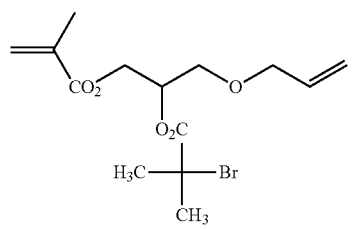

i-39 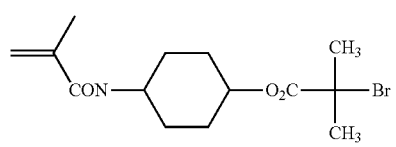

i-40 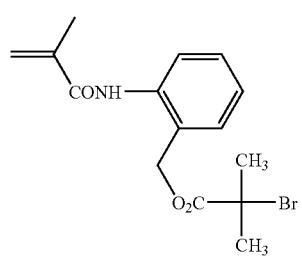

i-41 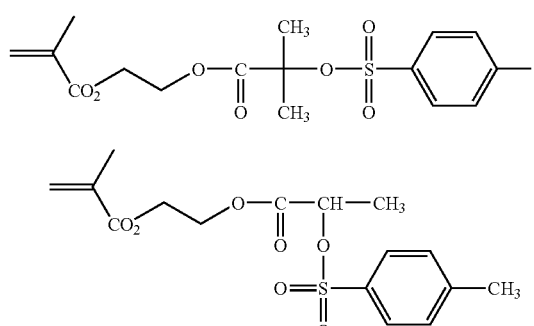

i-42 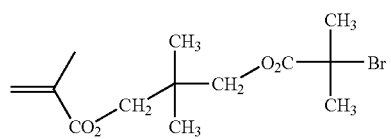

i-43 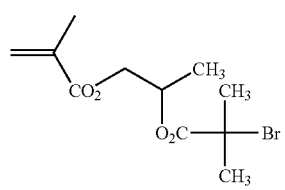

i-44 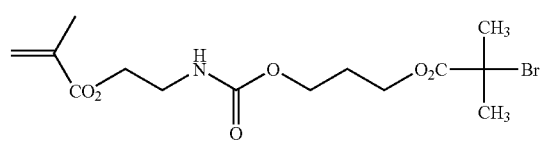

i-45 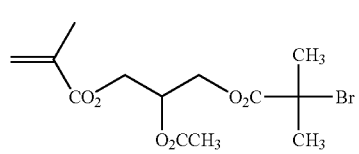

i-46 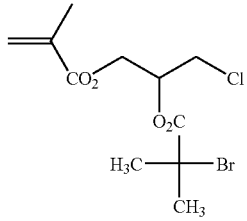

i-47 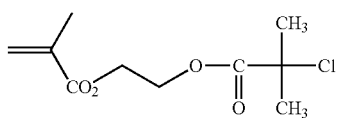

i-48 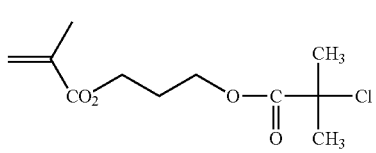

i-49 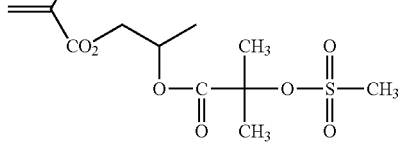

i-50 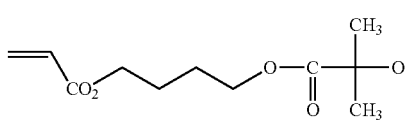

i-51 

i-52 

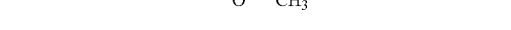

The dispersion resin according to the invention needs to have photopolymerizable unsaturated bonds from the viewpoint of improving the photosensitivity, and it is preferable for the dispersion resin to have COOH, $SO_3H$, $PO_3H_2$, $OSO_3H$ or $OPO_2H_2$ from the viewpoint of enabling alkali development.

The weight-average molecular weight of the dispersion resin according to the first aspect of the invention is preferably 1,000 to 100,000, more preferably 2,000 to 50,000, and even more preferably 3,000 to 20,000, from the viewpoints of dispersion stability, coating property, and development performance. In particular, the weight-average molecular weight (Mw) of the (A) polymer compound having a structural unit represented by any one of formulae (1) to (3) (the dispersion resin according to the invention) is preferably from 3,000 to 20,000. When the weight-average molecular weight of the dispersion resin according to the invention is 3,000 or more, the dynamic strength and thermal fastness of the resist pattern, and the resolution property (rectangular shape property) becomes good. When the weight-average molecular weight is 20,000 or less, the resolution property (rectangular shape property) is good, and the scum remaining after development at unexposed parts may be avoided.

Furthermore, the weight-average molecular weight of the dispersion resin according to the second aspect of the invention is preferably 1,000 to 300,000, more preferably 3,000 to 100,000, even more preferably 5,000 to 50,000, and most preferably 8,000 to 30,000, from the viewpoints of dispersion stability, coating property and development performance.

In addition, the weight-average molecular weight means the molecular weight in the case where the polymer compound as the dispersion resin is of a single structure, while the same term means an average value determined by weight averaging in the case where the polymer compound is one having a molecular weight distribution, such as a polymer or an oligomer.

As for the dispersion resin according to the invention, the entire amount of the resin may be used together with a pigment during dispersion, or a portion of the dispersion resin may be added after dispersion. The dispersion resin of the invention is preferably used in an amount of at least 20 parts by mass or more, based on 100 parts by mass of the pigment.

The content of the dispersion resin in the pigment-dispersed composition according to the invention is preferably 1 to 200% by mass, more preferably 5 to 100% by mass, and even more preferably 5 to 80% by mass, based on the pigment. When the content is within the above-described range, the pigment may be more efficiently dispersed, and prevention of decoloration, exposure sensitivity, adhesiveness to support, and pattern forming property (the property of forming a desired tapered or rectangular cross-section) may be effectively improved.

In the second aspect, the ratio of the "(A-2) dispersion resin having an acid number of less than 100 mg KOH/g and an unsaturation equivalent of less than 600" to the "(D) resin having an acid number of 100 mg KOH/g or more" that will be described later (A-2/D) is preferably 1/100 to 100/1, more preferably 1/50 to 50/1, and most preferably 1/10 to 10/1. When the ratio A-2/D is within the above-described range, the ratio is effective in sterically inhibiting the pigment aggregation which is promoted by the acid group-derived bridging between a plurality of pigment particles, and dispersion of pigment may be performed more efficiently.

In the second aspect of the invention, as for the combination of the (D) resin having an acid number of 100 mg KOH/g or more, and the (A-2) resin having an acid number of less than 100 mg KOH/g and an unsaturation equivalent of less than 600, the following combination exemplary embodiments are suitable.

[1] a combination where (D) is a "resin having an acid number of 120 g KOH/g or more and 800 mg KOH/g or less and a weight-average molecular weight of 3,000 to 100,000, having a structure containing a single bond between carbon atoms, a urethane bond, an ester bond, an ether bond or an amide bond individually or in combination of a plurality in the main chain of the resin, and having one or more acid groups selected from a —COOH group, an —SO$_3$H group and an —OPO$_3$H$_2$ group," and (A-2) is a "resin having an unsaturation equivalent of 580 or less, an acid number of 30 g KOH/g or more and 100 mg KOH/g or less, and a weight-average molecular weight of 3,000 to 100,000, and having a structure containing a single bond between carbon atoms, a urethane bond, an ester bond, an ether bond or an amide bond individually or in combination of a plurality in the main chain of the resin,

[2] a combination where (D) is a "resin having an acid number of 120 g KOH/g or more and 800 mg KOH/g or less and a weight-average molecular weight of 5,000 to 50,000, having a structure containing a single bond between carbon atoms or a urethane bond individually or in combination of a plurality in the main chain of the resin, having a —COOH group as an acid group, being obtained by copolymerizing a plurality of monomers, and containing at least the repeating structural unit represented by the above formula (1)," and (A-2) is a "resin having an unsaturation equivalent of 580 or less, an acid number of 50 g KOH/g or more and 100 mg KOH/g or less, and a weight-average molecular weight of 5000 to 50000, having a structure containing a single bond between carbon atoms or a urethane bond individually or in combination of a plurality in the main chain of the resin, being obtained by copolymerizing a plurality of monomers, and containing at least a structural unit represented by the above formula (1), (2) or (3)."

(B) Pigment

The pigment-dispersed composition of the invention contains at least one pigment. When a pigment is used as the colorant, it is preferable in terms of durability such as heat fastness or light-fastness.

As for the pigment which may be contained in the pigment-dispersed composition of the invention, a variety of conventionally known inorganic pigments or organic pigments may be used, and those obtain high transmittance are preferred.

Inorganic pigments include metal compounds such as metal oxides and metal complex salts, and specific examples thereof include metal oxides of iron, cobalt, aluminum, cadmium, lead, copper, titanium, magnesium, chromium, zinc, antimony and the like, and composite oxides of these metals.

Examples of organic pigments include

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28;

C.I. Pigment Black 1, 7;

carbon black and the like.

In the invention, particularly those pigments having a basic N atom in the structural formula may be preferably used. These pigments having a basic N atom exhibit good dispersibility in the pigment-dispersed composition of the invention. The cause has not been clarified, however it is conjectured that good affinity between a polymer component and the pigment has an influence on the dispersibility.

As the pigment which can be preferably used in the invention, the following can be exemplified, however the invention is not restricted to them.

C.I. Pigment Yellow 11, 24, 108, 109, 110, 138, 139, 150, 151, 154, 167, 180, 185;

C.I. Pigment Orange 36, 71;

C.I. Pigment Red 122, 150, 171, 175, 177, 209, 224, 242, 254, 255, 264;

C.I. Pigment Violet 19, 23, 32;

C.I. Pigment Blue 15:1, 15:3, 15:6, 16, 22, 60, 66;

C.I. Pigment Black 1.

These organic pigments can be used alone, or by variously combining them in order to enhance a color purity. For example, when the pigment-dispersed composition of the invention is used to form colored patterns of color filter, it is preferable to use the combination of pigments in order to enhance a color purity of the colored patterns.

Examples of the combination are shown below. For example, an anthraquinone-based pigment, a perylene-based pigment, or a diketopyrrolopyrrole-based pigment alone as a red pigment, or a mixture of at least one kind of them, and a disazo-based yellow pigment, an isoindoline-based yellow pigment, a quinophthalone-based yellow pigment or a perylene-based red pigment can be used. For example, the anthraquinone-based pigment includes C.I. Pigment Red 177, the perylene-based pigment includes C.I. Pigment Red 155, and C.I. Pigment Red 224, and the diketopyrrolopyrrole-based pigment includes C.I. Pigment Red 254. From a color reproductivity, a mixture with C.I. Pigment Yellow 139 is preferable. A mass ratio between the red pigment and the yellow pigment is preferably 100:5 to 100:50. When the ratio is less than 100:5, it is difficult to suppress light transmittance of 400 nm to 500 nm, and a color purity cannot be enhanced in some cases. In addition, when the ratio is more than 100:50, a main wavelength becomes towards a short wavelength, and a deviation from a NTSC goal hue becomes great in some cases. Particularly, the mass ratio is optimally in a range of 100:10 to 100:30. In the case of a combination of red pigments, the ratio can be adjusted in conformity with a chromaticity.

In addition, as the green pigment, a halogenated phthalocyanine-based pigment can be used alone, or a mixture of this with a disazo-based yellow pigment, a quinophthalone-based yellow pigment, an azomethine-based yellow pigment or an isoindoline-based yellow pigment can be used. As such the example, a mixture of C.I. Pigment Green 7, 36, 37 and C.I. Pigment Yellow 83, C.I. Pigment Yellow 138, C.I. Pigment Yellow 139, C.I. Pigment Yellow 150, C.I. Pigment Red Yellow 180 or C.I. Pigment Red Yellow 185 is preferable. A mass ratio of the green pigment and the yellow pigment is preferably 100:5 to 100:150. The mass ratio is particularly preferably in a range of 100:30 to 100:120.

As the blue pigment, a phthalocyanine-based pigment can be used alone, or a mixture of this with a dioxazine-based purple pigment can be used. For example, a mixture of C.I. Pigment Blue 15:6 and C.I. Pigment Violet 23 is preferable. A mass ratio of the blue pigment and the purple pigment is preferably 100:0 to 100:30, more preferably 100:10 or less.

As the pigment used in the case of using the pigment-dispersed composition of the invention in the formation of black matrix of color filters, carbon, titanium carbon, iron oxide and titanium oxide are used individually or as a mixture, and a combination of carbon and titanium carbon is preferred. The mass ratio of carbon and titanium carbon is preferably in the range of 100:0 to 100:60.

The primary particle size of the pigment is preferably 100 nm or less in the case of using the pigment-dispersed composition for color filters, from the viewpoints of color unevenness or contrast, while the primary particle size is preferably 5 nm or more from the viewpoint of dispersion stability. The primary particle size of the pigment is more preferably 5 to 75 nm, even more preferably 5 to 55 nm, and particularly preferably 5 to 35 nm.

The primary particle size of the pigment may be measured by known methods such as electron microscopy.

Inter alia, the pigment is preferably a pigment selected from anthraquinone series, azomethine series, benzylidene series, cyanine series, diketopyrrolopyrrole series and phthalocyanine series.

The content of the pigment in the pigment-dispersed composition is preferably 30% by mass or more, and more preferably in the range of 40 to 95% by mass, based on the total solids in the composition, from the viewpoints of securing high tinctorial strength, for example, securing high color density and contrast in the case of producing a color filter.

In addition, the pigment-dispersed composition of the invention may use dyes in combination, within the scope of not impairing the effect of the invention. The dye is not particularly limited, and the dyes conventionally known for the use in color filters may be used. For example, coloring matters disclosed in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531 can be used.

As a chemical structure, dyes of a pyrazoleazo series, an anilinoazo series, a triphenylmethane series, an anthraquinone series, an anthrapyridone series, a benzylidene series, an oxonol series, a pyrazolotriazol series, a pyridoneazo series, a cyanine series, a phenothiazine series, a pyrrolopyrazoleazomethine series, a xanthene series, a phthalocyanine series, a benzopyran series, and an indigo series can be used.

(C) Solvent

The pigment-dispersed composition of the invention contains at least one solvent. When a solvent is used, a pigment-dispersed composition in which the pigment is well dispersed, may be prepared.

While the solvent is not particularly restricted so long as the solvent satisfies solubility of each component of the composition and application property of the pigment-dispersed composition, it is preferably selected by taking safety into consideration.

Specific examples of the preferable solvent include esters such as ethyl acetate, n-butyl acetate, isobutyl acetate, amyl formate, isoamyl acetate, isobutyl acetate, butyl propionate, isopropyl butylate, ethyl butylate, buthyl butylate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid alkyl esters such as methyl 3-oxypropionate and ethyl 3-oxypropionate (for example, methyl 3-methoxypropionate, ethyl 3-mehtoxypropionate, methyl 3-ethoxypropionate and ethyl 3-ethoxypropionate), 2-oxypropionic acid alkyl esters such as methyl 2-oxypropionate, ethyl 2-oxypropionate, propyl 2-oxypropionate (for example, methyl 2-methoxypropionate, ethyl 2-methoxypropinate, propyl 2-methoxypropionate, methyl 2-ethoxypropionate, ethyl 2-ethoxypropionate, methyl 2-oxy-2-methyl propionate, ethyl 2-oxy-2-methylpropionate, methyl 2-methoxy-2-methylpropionate and ethyl 2-ethoxy-2-methylpropionate), methyl pyruvate, ethyl pyruvate, propyl pyruvate; methyl acetoacetate; ethyl acetoacetate, methyl 2-oxobutanate and ethyl 2-oxobutanate;

ethers such as diethyleneglycol dimethylether, tetrahydrofuran, ethyleneglycol monomethylether, ethyleneglycol monoethylether, methylcellosolve acetate, ethylcellosolve acetate, diethyleneglycol monomethylether, diethyleneglycol monoethylether, diethyleneglycol monobutylether, propyleneglycol methylether, propyleneglycol methylether acetate, propyleneglycol ethylether acetate, and propyleneglycol propylether acetate;

ketones such as methylethyl ketone, cyclohexanone, 2-heptanone and 3-heptanone;

and aromatic hydrocarbons such as toluene and xylene.

Among them, more preferable examples include methyl 3-ethoxypropionate, ethyl 3-ethoxypropionate, ethylcellosolve acetate, ethyl lactate, diethyleneglycol dimethylether, butyl acetate, methyl 3-methoxypropionate, 2-heptanone, cyclohexanone, ethylcarbitol acetate, butylcarbitol acetate, propyleneglycol methylether and propyleneglycol methylether acetate (PGMEA).

The proportion occupied by the solvent in the pigment-dispersed composition is preferably 20 to 95% by mass, and more preferably 25 to 90% by mass. When the amount of the solvent is within the above-described range, dispersion of the pigment may be uniformly performed, and it is also advantageous in terms of dispersion stability after dispersion.

It is preferable for the pigment-dispersed composition using the dispersion resin according to the present invention, that the pigment particle size distribution as measured by light scattering particle size distribution measurement process, preferably satisfies the conditions (1) and (2) below.

(1) 0.03 μm<D90<0.07 μm
(2) 0.01 μm<Fmax<0.03 μm.

Here, the pigment particle size distribution means the value obtained as measured by the following method.

Specifically, the pigment particle size distribution is defined as the particle diameter measured by preparing a sample by gradually diluting a pigment-dispersed composition with a solvent that is used in the pigment-dispersed composition to be measured, to a pigment concentration of 2%±0.1%, and using this sample to measure the particle diameter with a particle size distribution measuring apparatus based on the dynamic light scattering method (frequency analysis method) [for example, Microtrac Nanotrac UPA-EX150 particle size analyzer (manufactured by Nikkiso Co., Ltd.)].

D90 is defined as the particle diameter (μm) corresponding to a cumulative amount of 90%, with the total amount of particles being 100%, when the cumulative amount by mass is counted from small-sized particles in a pigment-dispersed composition. Fmax is defined as the particle diameter (μm) at which the amount of particles present is the maximum in the particle size distribution of a pigment-dispersed composition.

According to the invention, it is preferable for the pigment particle size distribution that D90 satisfies the relationship of "0.03 μm<D90<0.07 μm." If D90 is larger than 0.03 μm, particle unstabilization over time such as generation of coarse particles or occurrence of gelation may be avoided, and for example, surface roughness of an image which may occur in the case of using the pigment-dispersed composition in the production of color filters for solid state image pick-up element, may be avoided. Also, the rectangular configuration property of the pattern may be maintained. If D90 is smaller than 0.07 μm, surface roughness of an image may be prevented.

Among them, D90 is preferably in the range of 0.035 μm<D90<0.065 μm, and most preferably in the range of 0.04 μm<D90<0.06 μm.

Moreover, under the above-described conditions of D90, the particle diameter at which the amount of particles present is the maximum, Fmax, is preferably in the range of 0.01 μm<Fmax<0.03 μm. If Fmax is larger than 0.01 μm, the occurrence of surface roughness of an image over time in using a pigment-dispersed composition may be prevented, and generation of scum and the like may also be suppressed. If Fmax is smaller than 0.03 μm, the occurrence of surface roughness of an image and generation of scum may be suppressed.

(D) Resin Having an Acid Number of 100 mg KOH/g or More

The pigment-dispersed composition according to the second aspect of the invention includes at least one resin having an acid number of 100 mg KOH/g or more (hereinafter, may be referred to as the "resin of high acid number according to the invention"). The resin of high acid number according to the invention is useful in that development performance or solvent solubility may be imparted. On the other hand, since the resin of high acid number according to the invention is prone to "promote pigment aggregation as the acid groups of the dispersion resin bridge between a plurality of pigment particles," when the resin of high acid number is to be used, the dispersion resin (A-2) according to the second aspect of the invention, which is compatible with this resin of high acid number and has unsaturated doubles bonds, is used in combination, so that the pigment aggregation is sterically inhibited, and the pigment may be efficiently dispersed.

The resin of high acid number according to the invention is a polymer compound containing acid groups and thus having an acid number of 100 mg KOH/g or more, and is not particularly limited as long as it is a resin other than the dispersion resin (A-2) according to the second aspect of the invention described above. However, it is preferable that the selection of this resin is made from the viewpoints of dispersion stability of the pigment, development performance of when a curable composition is prepared, ease in synthesis, and the like.

The acid number of the resin of high acid number is, from the viewpoints of dispersion stability of the pigment and development performance, preferably 120 mg KOH/g or more and 800 mg KOH/g or less, more preferably 140 mg KOH/g or more and 700 mg KOH/g or less, even more preferably 170 mg KOH/g or more and 600 mg KOH/g or less, and most preferably 200 mg KOH/g or more and 500 mg KOH/g or less.

In addition, the acid number is determined by titration using potassium hydroxide.

The resin of high acid number according to the invention is preferably a linear organic high molecular weight polymer which is soluble in organic solvents and is capable of development with a weak alkaline aqueous solution. Such linear organic high molecular weight polymers include polymers having a high molecular weight chain containing a single bond between carbon atoms, a double bond between carbon atoms, a triple bond between carbon atoms, a urethane bond, an ester bond, an ether bond or an amide bond, individually or in combination of a plurality, in the main chain structure. Among them, a polymer having a high molecular weight chain containing a single bond between carbon atoms, a urethane bond, an ester bond, an ether bond or an amide bond, individually or in combination of a plurality, in the main chain structure is preferred. Furthermore, a polymer having a high molecular weight chain containing a single bond between carbon atoms in the main chain structure is more preferred.

Suitable examples of the acid group of the resin of high acid number according to the invention include a —COOH group, an —$SO_3H$ group, a —$PO_3H_2$ group, an —$OPO_3H_2$ group, an —$OSO_3H$ group, an —$OPO_2H_2$ group, and the like. Among them, a resin having one or more selected from the group consisting of a —COOH group, an —$SO_3H$ group and an —$OPO_3H_2$ group in the side chain is particularly preferred.

The resin of high acid number according to the invention may have a repeating structural unit having an acid group, and more specifically, the resin of high acid number preferably has a repeating structural unit represented by the following formula (I).

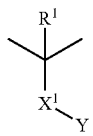

In the formula (I) above, $R^1$ represents a hydrogen atom, a hydrocarbon group having 1 to 6 carbon atoms, —COOH, —CN, —CF$_3$, —CH$_2$OH, —CH$_2$COOH, —CH$_2$COOR$^a$ or —COOR$^b$; $X^1$ represents a divalent organic group; and Y represents a —COOH group, an —SO$_3$H group, a —PO$_3$H$_2$ group, an —OPO$_3$H$_2$ group, an —OSO$_3$H group or an —OPO$_2$H$_2$ group.

Examples of the hydrocarbon group having 1 to 6 carbon atoms, represented by $R^1$, include a methyl group, an ethyl group, a propyl group, a butyl group, a pentyl group and a hexyl group, and among them, a methyl group and an ethyl group are preferred.

Among them, as for $R^1$, a hydrogen atom, a methyl, —COOH, —CN, —CF$_3$, —CH$_2$OH or —CH$_2$COOH is preferred, and a hydrogen atom or a methyl group is more preferred.

The divalent organic group represented by $X^1$ may include hydrocarbon chains having 1 to 100 carbon atoms which may contain in the chain, an atom, a structure or a bond selected from the group consisting of an oxygen atom, a nitrogen atom, a sulfur atom, a silicon atom, a hydrocarbon ring structure having 3 to 10 carbon atoms, a heterocycle, an ether bond, an amino bond, a thioether bond, a urethane bond, a thiourethane bond, an ester bond, a sulfonic acid ester bond, a phosphoric acid ester bond, an amide bond, a urea bond and a thiourea bond, individually or in combination of a plurality.

Among them, a hydrocarbon chain having 1 to 50 carbon atoms which may contain a partial structure selected from the group consisting of a hydrocarbon ring structure having 5 to 6 carbon atoms, an ether bond, a thioether bond, a urethane bond, a thiourethane bond, an ester bond and an amide bond, individually or in combination of a plurality thereof, is preferred, and a hydrocarbon chain having 1 to 40 carbon atoms containing at least two kind of partial structures selected from the group consisting of a hydrocarbon ring structure having 6 carbon atoms, an ether bond, a thioether bond, a urethane bond, a thiourethane bond, an ester bond and an amide bond, is more preferred.

Y in the above formula (I) is preferably a —COOH, an —SO$_3$H or an —OPO$_3$H$_2$, and is more preferably a —COOH group.

The repeating structural unit having an acid group (preferably the repeating structural unit represented by the formula (I)) may be incorporated into the resin of high acid number as one species, or may be incorporated as two or more species. In the case where the resin of high acid number according to the invention has a repeating structural unit having an acid group, the total content of the repeating structural unit having an acid group may be appropriately determined on the basis of the structure, the design of the dispersed composition, the design of the colored layer formed from a curable composition, or the like. However, from the viewpoints of dispersion stability and development performance, the total content is preferably in the range of 15 to 98% by mole, more preferably 20 to 95% by mole, and even more preferably 25 to 80% by mole, based on the total molar amount of the polymer component.

Hereinafter, the various components used in the synthesis of the acid group-containing compound having a structure represented by the formula (I), will be described.

First, examples of the monomer having an acid group, which is intended for the synthesis of an acid group-containing compound having a structure represented by the formula (I), will be given. Additionally, in the present specification, only the monomers having —COOH as the acid group will be mentioned. However, —COOH may also be changed to another acid group such as, for example, an —SO$_3$H, a —PO$_3$H$_2$, an —OSO$_3$H or an —OPO$_2$H$_2$. As the other acid group, a —COOH, an —SO$_3$H, and a —PO$_3$H$_2$ are preferred, and a —COOH is most preferred.

Examples of the monomer may include acrylic acid, methacrylic acid, itaconic acid, crotonic acid, maleic acid, fumaric acid, 4-carboxylstyrene, and the like. And acidic cellulose derivatives having a carboxylic acid group in the side chain may also be used. Also, the compounds obtained by adding a cyclic acid anhydride to a compound having an unsaturated double bond and a hydroxyl group, may also be used. In addition to these, the following structures may be mentioned.

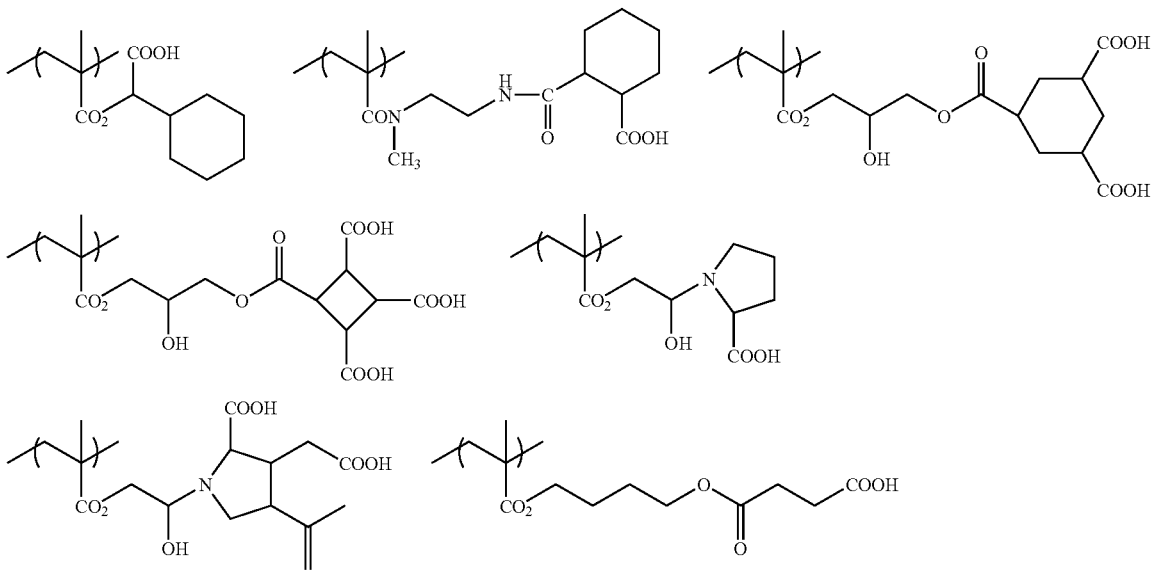

33
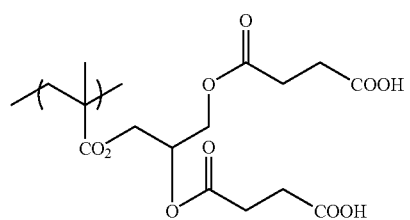
-continued
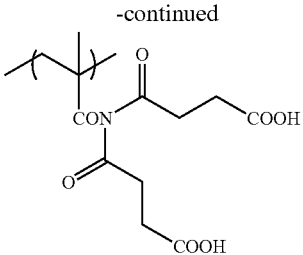
34
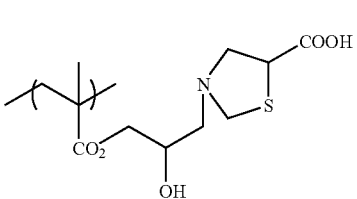
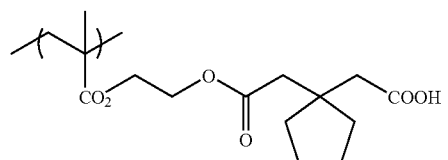
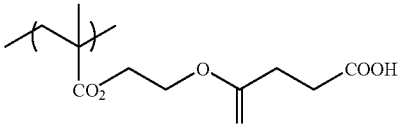
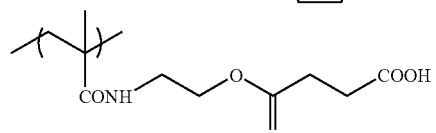
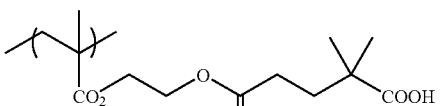
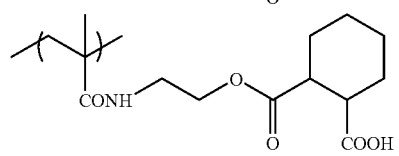
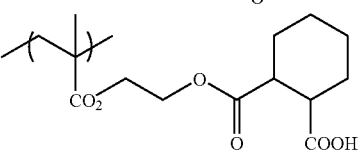
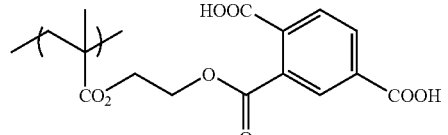
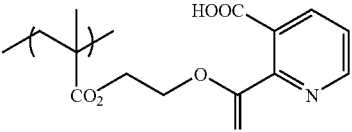
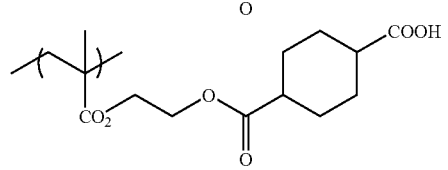
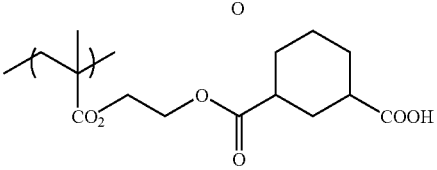
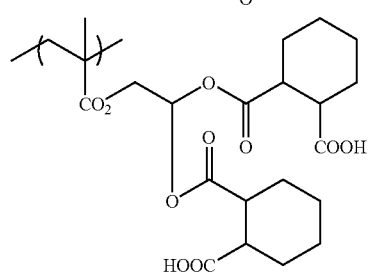
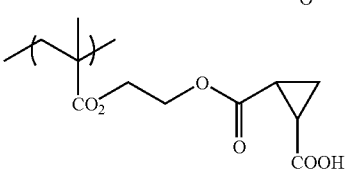
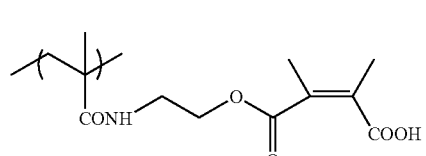
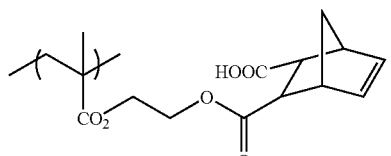
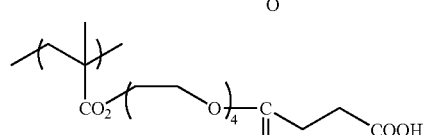
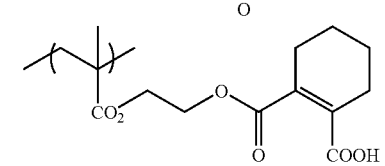
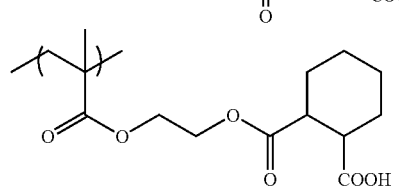
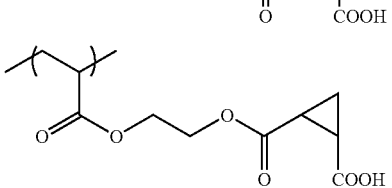

-continued
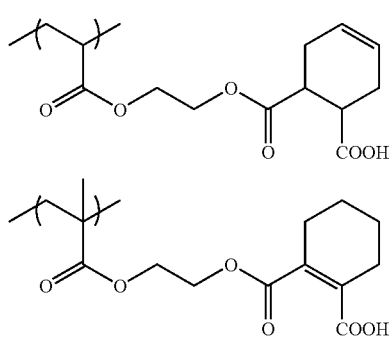
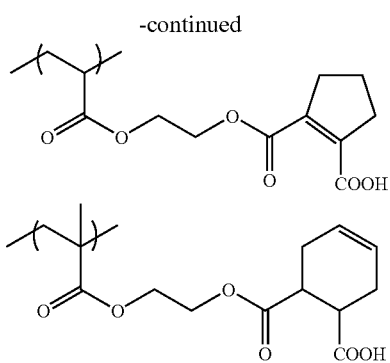
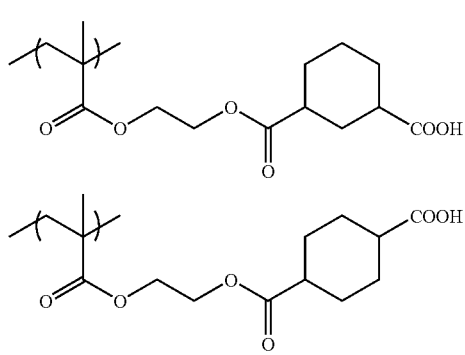
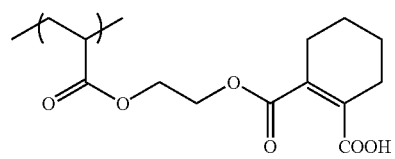
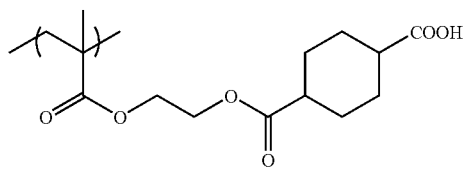
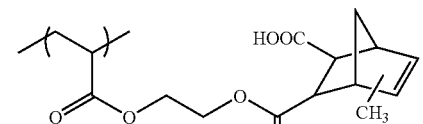
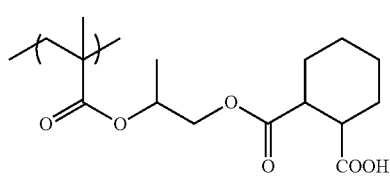
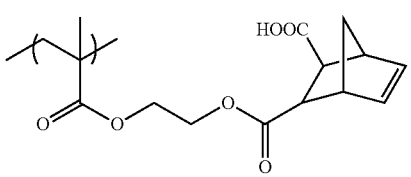
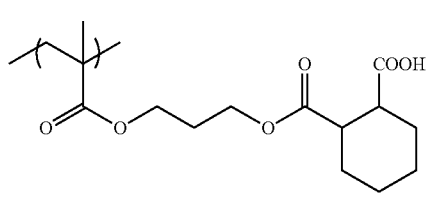
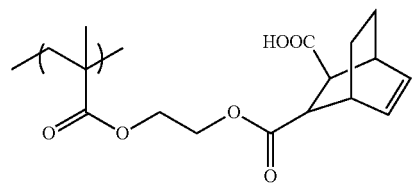
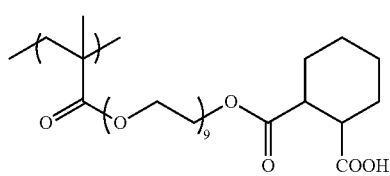
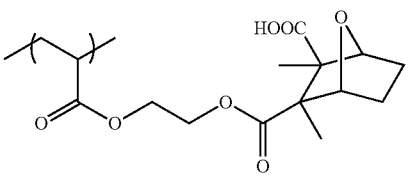
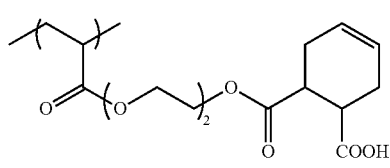
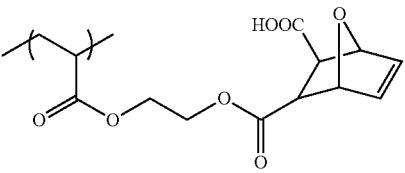
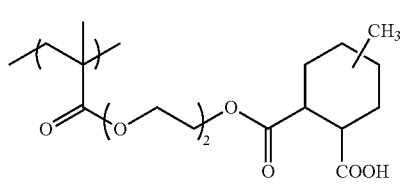
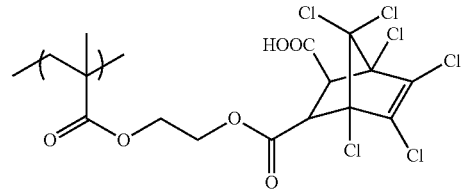

-continued
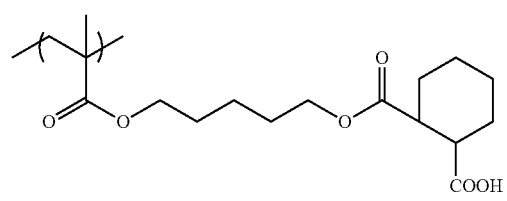
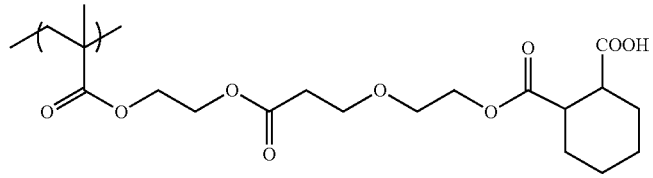
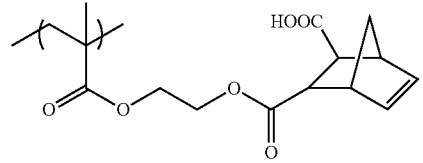
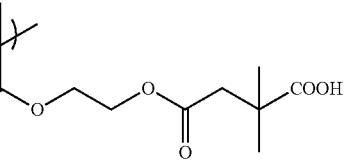
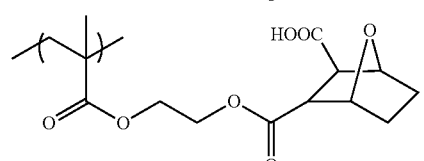
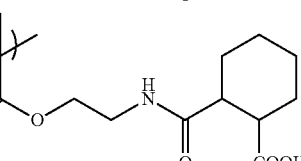
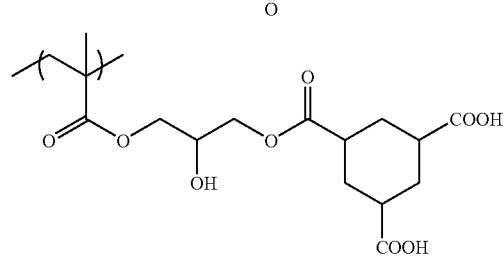
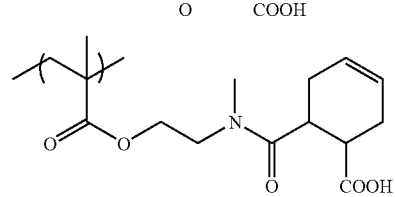
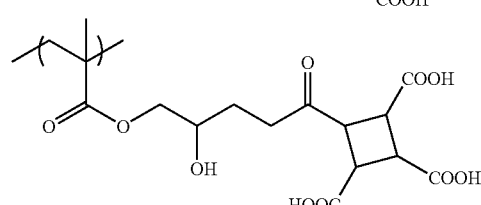
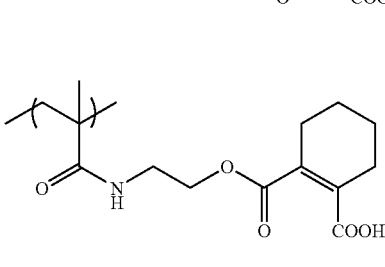
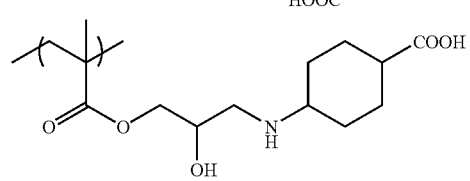
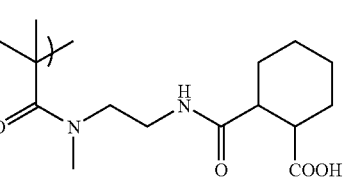
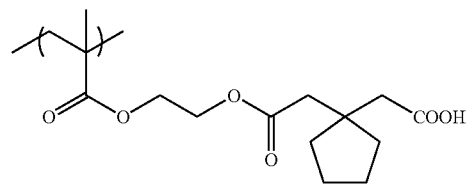
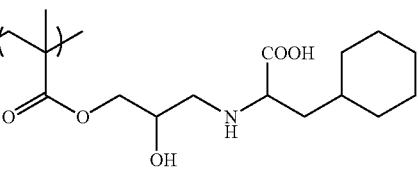
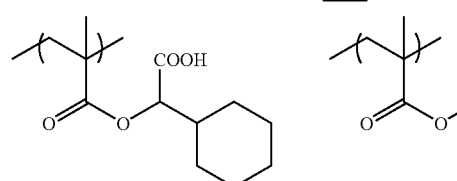
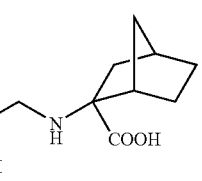
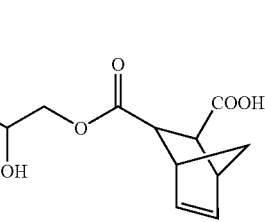
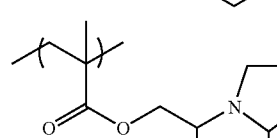
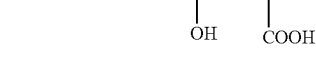

-continued
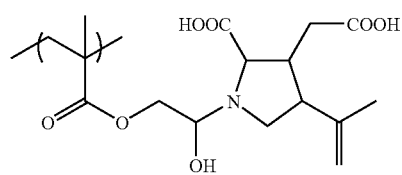
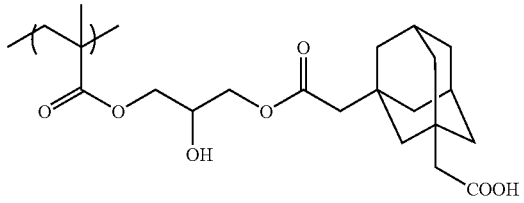
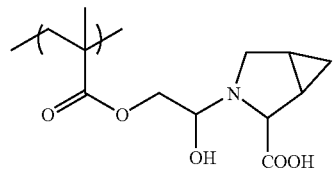
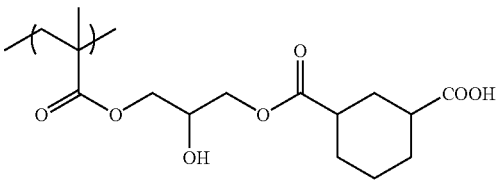
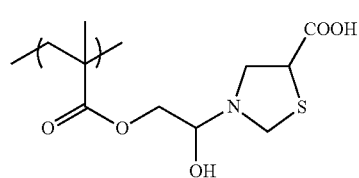
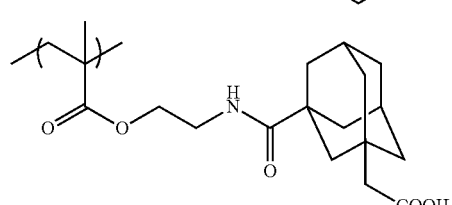
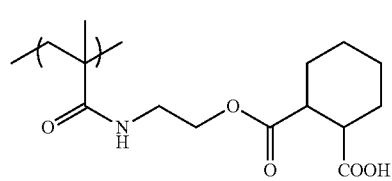
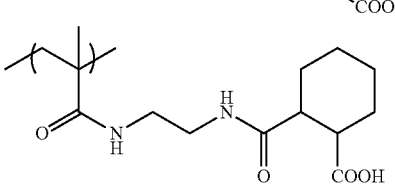
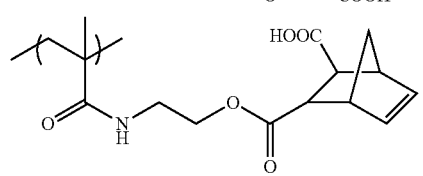
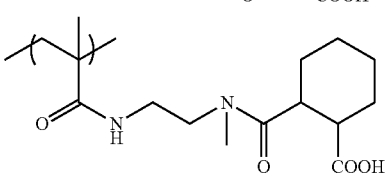
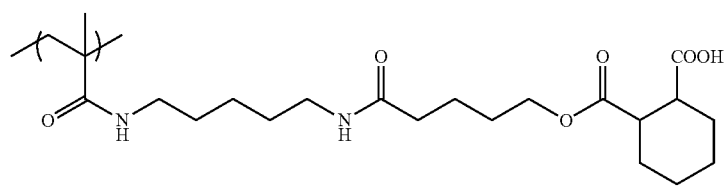
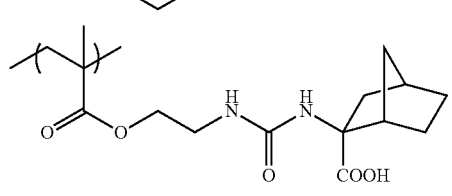
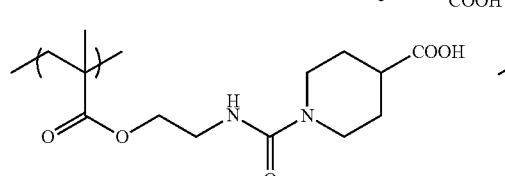
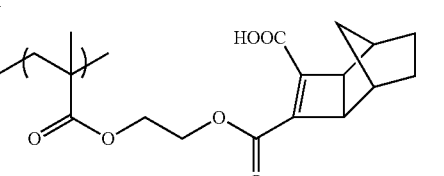
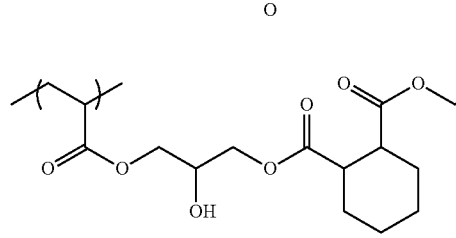
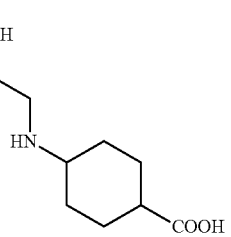

-continued
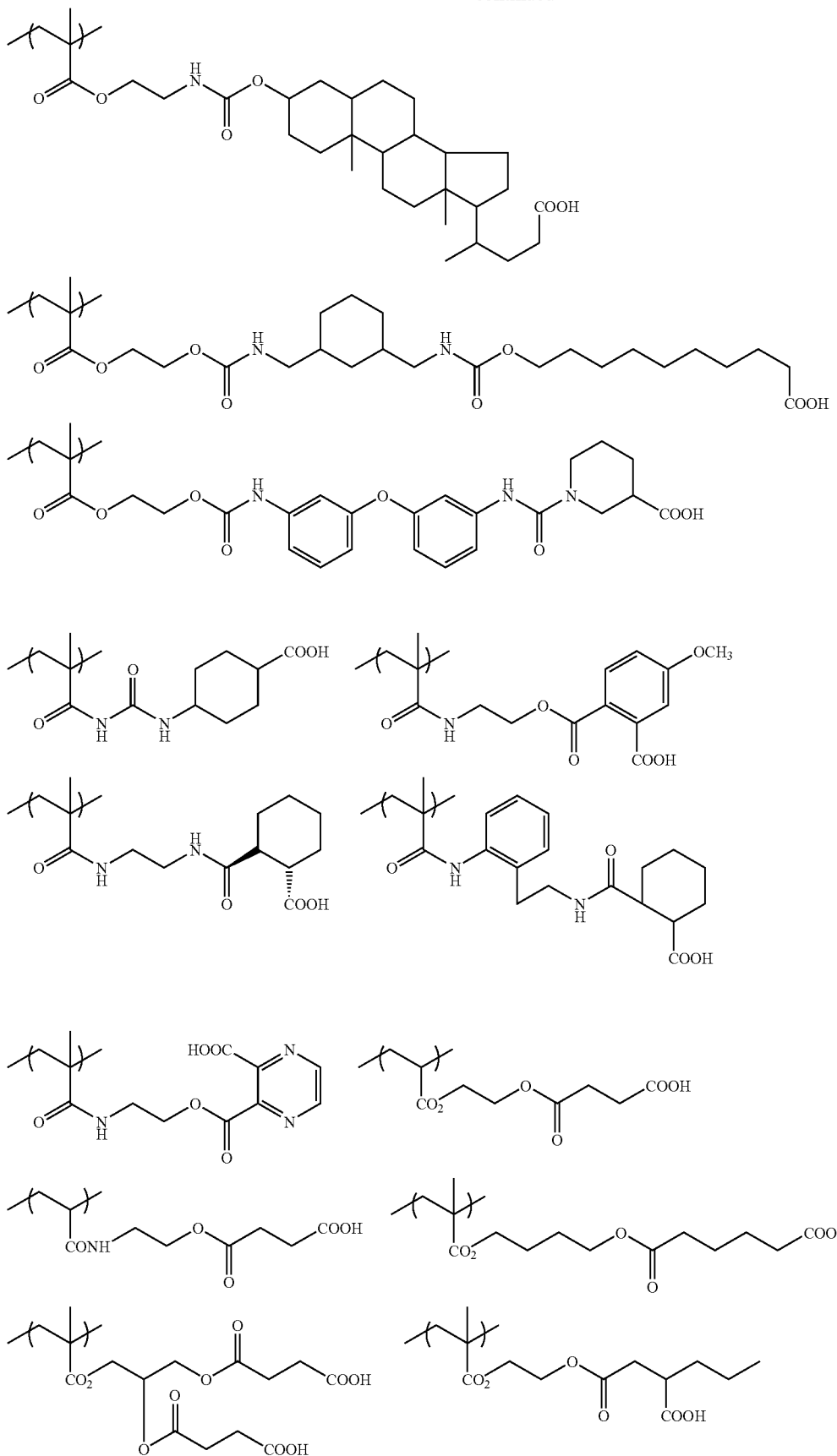

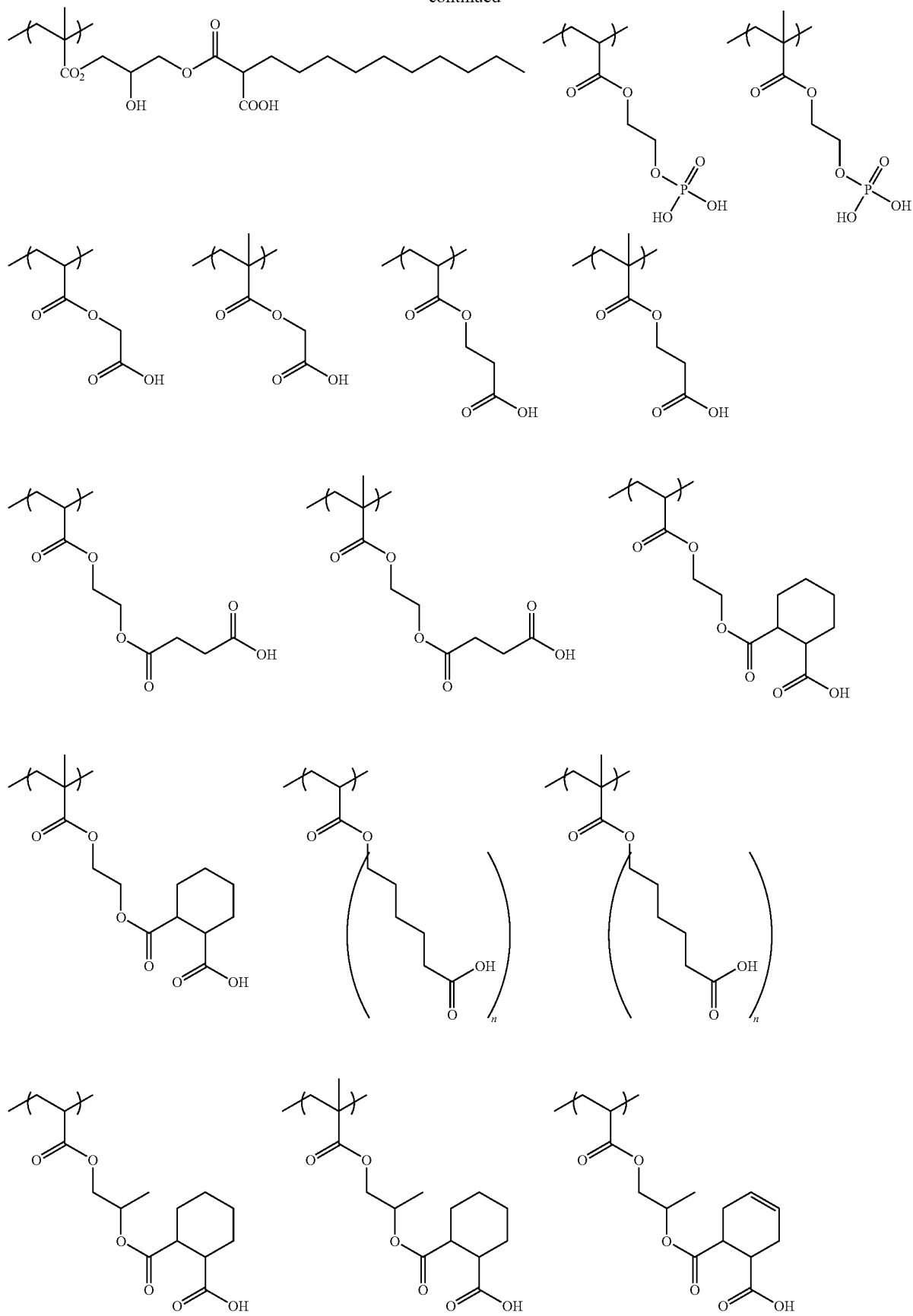

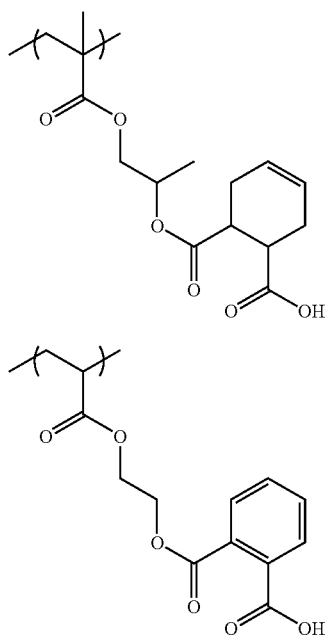
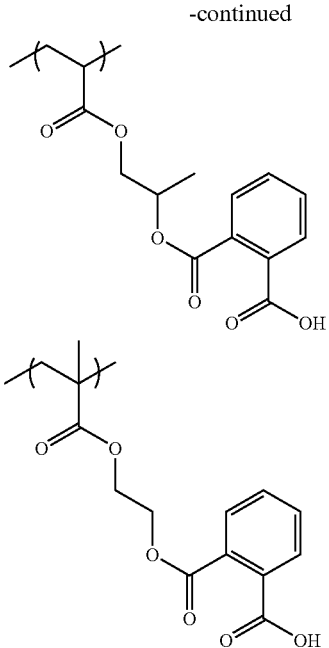
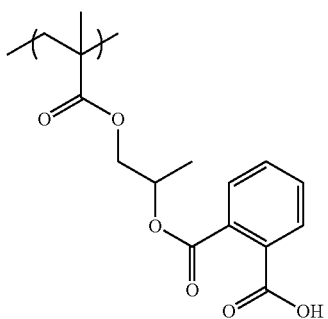

As for the monomer having an acid group, commercially available products may also be used. Examples thereof include P-1A, P-1M, HOA-MS, HO-MS, HO-MP, HO-MPL, HOA-HH, HO-HH (all manufactured by Kyoeisha Chemical Co., Ltd.), A229E (manufactured by Dai-ichi Kogyo Seiyaku Co., Ltd.), Ebecryl β-CEA (manufactured by Daicel-Cytec Company, Ltd.), M-5600, M-5300 (all manufactured by Toagosei Co., Ltd.), A-SA, SA, CB-1 (all manufactured by Shin-Nakamura Chemical Co., Ltd.), V#2000, V#2100, V#2150, V#2180 (all manufactured by Osaka Organic Chemical Industry, Ltd.), and the like.

The resin of high acid number according to the invention may be prepared by polymerizing a monomer having an acid group alone, or by copolymerizing a monomer having an acid group with other monomers. From the viewpoint of dispersion stability, it is preferable that a monomer having an acid group is copolymerized with other monomers. As for the monomer used for copolymerizing with the monomer having an acid group, the following monomers (1) to (12) are suitable:

(1) Monomers having a hydroxyl group, such as acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate, ethyleneoxy-modified products thereof, and hydroxystyrene;

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate;

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate;

(4) Acrylamides or methacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenyl acrylamide, N-ethyl-N-phenylacrylamide, vinylayerylamide, vinylmethacrylamide, N,N-diallylacrylamide, N,N-diallylmethacrylamide, allylacrylamide and allylmethacrylamide;

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) Vinyl esters such as vinyl acetate, vinyl chloroacetate, vinyl butyrate and vinyl benzoate;

(7) Styrenes such as styrene, α-methylstyrene, methylstyrene, chloromethylstyrene and p-acetoxystyrene;

(8) Vinyl ketones such as methyl vinyl ketone, ethyl vinyl ketone, propyl vinyl ketone and phenyl vinyl ketone;

(9) Olefins such as ethylene, propylene, isobutylene, butadiene and isoprene;

(10) N-vinylpyrrolidone, acrylonitrile, methacrylonitrile and the like;

(11) Unsaturated imides such as maleimide, N-acryloyl acrylamide, N-acetylmethacrylamide, N-propionylmethacrylamide and N-(p-chlorobenzoyl) methacrylamide;

(12) Methacrylic acid-based monomers having a heteroatom bound at the α-position, for example, the compounds described in JP-A No. 2002-309057, JP-A No. 2002-311569 and the like.

The resin of high acid number according to the invention is preferably a polymer having a weight-average molecular weight of 1000 to $2 \times 10^5$, as calculated in terms of polystyrene, when measured by a GPC (Gel Permeation Chromatography) method, in view of dispersion stability and development performance. Among them, a polymer having a weight-average molecular weight of 3000 to $1 \times 10^5$ is more preferred, and a polymer having a weight-average molecular weight of 5000 to $5\times10^4$ is particularly preferred.

The content of the resin of high acid number according to the invention in the pigment-dispersed composition is preferably from 1 to 300% by mass, more preferably from 5 to 200% by mass, and most preferably from 10 to 100% by mass, based on the pigment. When the content is within the above-described range, the content is effective in sterically inhibiting the pigment aggregation which is promoted by the acid group-derived bridging between a plurality of pigment particles, and dispersion of pigment may be performed more efficiently.

<Curable Composition>

The curable composition according to the first aspect of the invention includes a polymer compound (A-1) having a structural unit represented by any one of the formulae (1) to (3) (the dispersion resin according to the invention), a pigment (B), a solvent (C), and a photopolymerization initiator (E), and preferably, the curable composition is constituted using the pigment-dispersed composition of the invention and a photopolymerization initiator (E). The curable composition of the invention is preferably constituted by further using a photopolymerizable compound (F), and if necessary, may be constituted using other components.

With regard to the curable composition according to the first aspect of the invention, when the dispersion resin according to the invention is incorporated, the pigment is efficiently dispersed, and good stability over time is obtained regardless of the size of the amount of pigment, as expected in the above. Thus, diffusion of the pigment into a developer solution or a coating solution may be suppressed, and decoloration is prevented. Furthermore, if the unsaturation equivalent is small, when the curable composition is formed into a film, the amount of double bonds in the film is increased, and the exposure sensitivity is improved to a large extent, while the penetration of a developer solution becomes good at uncured, unexposed parts, thus the removability by developer may being increased. Therefore, it is conceived that a good pattern with the desired shape of cross-section (particularly, tapered or rectangular shape) is obtained, and the contact characteristics with substrate becomes good.

Among the components constituting the curable composition according to the first aspect of the invention, with regard to the (A-1) polymer compound having a structural unit represented by any one of formulae (1) to (3) (the dispersion resin according to the invention), the (B) pigment, and the (C) solvent, details are the same as in the case of the pigment-dispersed composition described above, and so are the preferred embodiments.

The content of the (A-1) polymer compound having a structural unit represented by any one of the formulae (1) to (3) (the dispersion resin according to the invention) in the curable composition according to the first aspect is preferably from 1 to 200% by mass, more preferably from 5 to 100% by mass, and even more preferably 5 to 80% by mass, based on the pigment. When the content is within the above-described range, the pigment may be more efficiently dispersed, and the prevention of decoloration, exposure sensitivity, contact characteristics with substrate and pattern forming property (the property of forming a desired cross-section tapered or rectangular in shape) may be effectively improved.

The content of the pigment in the curable composition according to the first aspect is preferably 20% by mass or more, and more preferably from 30 to 90% by mass, based on the total solids in the composition. When the content of the pigment is within the above-described range, the content is effective in securing high tinctorial strength, for example, in the case of producing a color filter.

Furthermore, the proportion of the solvent occupying in the curable composition according to the first aspect is preferably from 20 to 90% by mass, and more preferably from 25 to 85% by mass. When the amount of solvent is within the above-described range, it is advantageous in terms of coating property and stability over time.

The curable composition according to the second aspect of the invention includes a resin (D) having an acid number of 100 mg KOH/g or more, a dispersion resin (A-2) having an acid number of less than 100 mg KOH/g and an unsaturation equivalent of less than 600, a pigment (B), a solvent (C), and a photopolymerization initiator (E), and preferably, the curable composition is constituted using the pigment-dispersed composition according to the second aspect of the invention and a photopolymerization initiator (E). Furthermore, the curable composition according to the second aspect of the invention is preferably constituted by further using a photopolymerizable compound (F), and if necessary, may be constituted using other components.

With regard to the curable composition according to the second aspect of the invention, when the resin of high acid number according to the invention and the dispersion resin according to the invention are all incorporated, as expected in the above, the pigment aggregation which is promoted as acid groups bridge between a plurality of pigment particles, may be sterically inhibited, and thus the pigment is efficiently dispersed. Furthermore, regardless of the size of the amount of pigment, good stability over time is obtained, and diffusion of the pigment into a developer solution or a coating solution may be prevented, thus decoloration being prevented. The dispersion resin (A-2) according to the second aspect of the invention has a high unsaturated bond density, and when the resin is used to form a film, the amount of double bonds in the film is increased, the exposure sensitivity is enhanced to a larger extent, and a good pattern giving a desired shape of cross-section (particularly, tapered or rectangular in shape) is obtained, thus the contact characteristics with substrate may become good. Moreover, the aggregation of the pigment is suppressed by the dispersion resin (A-2), and thus the penetration of the developer solution proceeds rapidly at uncured, unexposed parts. Furthermore, the penetration of the developer solution is promoted by high acid number of the resin of high acid number (D), thereby diffusion of the resin (A-2) and pigment (B) into the developer solution is promoted, and the removability of unexposed parts and the curability of cured exposed parts are increased, so that the influence of the developer solution or the like is suppressed.

Among the components constituting the curable composition according to the second aspect of the invention, with regard to the (D) resin having an acid number of 100 mg KOH/g or more, the (A-2) dispersion resin having an acid number of less than 100 mg KOH/g and an unsaturation equivalent of less than 600, the (B) pigment and the (C) solvent, details are the same as in the case of the pigment-dispersed composition described above, and so are the preferred embodiments.

The content of the (D) resin having an acid number of 100 mg KOH/g or more in the curable composition according to the second aspect, is preferably from 1 to 500% by mass, more preferably from 5 to 300% by mass, and even more preferably from 10 to 200% by mass, based on the pigment. When the content is within the above-described range, the solvent solubility and development performance, and the pattern forming property (the property of forming a desired cross-section having a tapered or rectangular shape) may be effectively improved.

The content of the "(A-2) dispersion resin having an acid number of less than 100 mg KOH/g and an unsaturation equivalent of less than 600" in the curable composition according to the second aspect, is preferably from 1 to 300% by mass, more preferably from 5 to 200% by mass, and even more preferably from 5 to 100% by mass, based on the pigment. When the content is within the above-described range, the pigment aggregation due to the acid groups of the (A-2) resin of high acid number according to the invention is mainly suppressed, and thus the pigment may be dispersed more efficiently. Also, the unsaturated bond density is high, and the prevention of decoloration, exposure sensitivity, contact characteristics with substrate, and pattern forming property (the property of forming a desired cross-section having a tapered or rectangular shape) may be effectively improved.

The content of the (B) pigment in the curable composition according to the second aspect is preferably 20% by mass or more, more preferably from 30 to 95% by mass, more preferably from 35 to 90% by mass, and most preferably from 40 to 85% by mass, based on the total solids in the composition. When the content of the pigment is within the above-described range, the content is effective in securing high tinctorial strength, for example, in the case of producing a color filter.

The proportion of the (C) solvent in the curable composition according to the second aspect is preferably from 20 to 90% by mass, and more preferably from 25 to 85% by mass. When the amount of solvent is within the above-described range, it is advantageous in view of the coating property and stability over time.

Hereinafter, the respective components other than the constituents (A) to (D) of the curable composition of the invention will be specifically illustrated.

(E) Photopolymerization Initiator

The curable composition of the invention includes at least one photopolymerization initiator. The photopolymerization initiator is a compound which is decomposed by light, to initiate and promote the polymerization of the (A-1) polymer compound having a structural unit represented by any one of the formulae (1) to (3) (the dispersed resin according to the first aspect of the invention) and a photopolymerizable compound (F) that will be described later, according to the first aspect of the invention, or the polymerization of the (D) resin having an acid number of 100 mg KOH/g or more, the (A-2) dispersion resin having an acid number of less than 100 mg KOH/g and an unsaturation equivalent of less than 600, and a photopolymerizable compound (F) that will be described later, according to the second aspect of the invention. The photopolymerization initiator preferably has absorption in the region of wavelength from 300 to 500 nm.

The photopolymerization initiator may be used alone as one species, or may be used in combination of two or more species.

Examples of the photopolymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic borate compounds, disulfone compounds, oxime compounds, onium salt compounds, acylphosphine-based compounds, alkylamino compounds, and the like.

Hereinafter, each of these compounds will be illustrated in detail.

Specific examples of the organic halogenated compounds include the compounds described in Wakabayashi et al., "Bull. Chem. Soc. Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, and a book by M. P. Hutt, "Journal of Heterocyclic Chemistry" Vol. 1, No. 3 (1970). In particular, oxazole compounds substituted with a trihalomethyl group, and s-triazine compounds may be mentioned.

The s-triazine compounds suitably include s-triazine derivatives in which at least one mono-, di- or trihalogen-substituted methyl group is bound to an s-triazine ring, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

The oxydiazole compounds include 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, 2-trichloromethyl-5-(4-styryl)styryl-1,3,4-oxodiazole, and the like.

Examples of the carbonyl compounds include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxantone derivatives such as thioxantone, 2-ethylthioxantone, 2-isopropylthioxantone, 2-chlorothioxantone, 2,4-dimethylthioxantone, 2,4-diethylthioxantone, and 2,4-diisopropylthioxantone; benzoic acid ester derivatives such as ethyl p-dimethylaminobenzoate and ethyl p-diethylaminobenzoate; and the like.

The ketal compounds include benzyl methyl ketal, benzyl-β-methoxyethyl ethyl acetal and the like.

The benzoin compounds include m-benzoin isopropyl ether, benzoin isobutyl ether, benzoin methyl ether, methyl-o-benzoyl benzoate and the like.

The acridine compounds include 9-phenylacridine, 1,7-bis(9-acridinyl)heptane and the like.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)

butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinyl peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tosyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Examples of the azo compounds include the azo compounds described in JP-A No. 8-108621, and the like.

Examples of the coumarin compounds include 3-methyl-5-amino-((s-triazin-2-yl)amino)-3-phenylcoumarin, 3-chloro-5-diethylamino-((s-triazin-2-yl)amino)-3-phenylcoumarin, 3-butyl-5-dimethylamino-((s-triazin-2-yl)amino)-3-phenylcoumarin, and the like.

The azide compounds include the organic azide compounds described in U.S. Pat. Nos. 2,848,328, 2,852,379 and 2,940,853, 2,6-bis-(4-azidobenzylidene)-4-ethylcyclohexanone (BAC-E), and the like.

The metallocene compounds include various titanocene compounds described in JP-A Nos. 59-152396, 61-151197, 63-41484, 2-249, 2-4705 and 5-83588, for example, dicyclopentadienyl-Ti-bis-phenyl, dicyclopentadienyl-Ti-bis-2,6-difluorophenyl-1-yl, dicyclopentadienyl-Ti-bis-2,4-difluorophenyl-1-yl, dicyclopentadienyl-Ti-bis-2,4,6-trifluorophenyl-1-yl, dicyclopentadienyl-Ti-bis-2,3,5,6-tetrafluorophenyl-1-yl, dicyclopentadienyl-Ti-bis-2,3,4,5,6-pentafluorophenyl-1-yl, dimethylcyclopentadienyl-Ti-bis-2,6-difluorophenyl-1-yl, dimethylcyclopentadienyl-Ti-bis-2,4,6-trifluorophenyl-1-yl, dimethylcyclopentadienyl-Ti-bis-2,3,5,6-tetrafluorophenyl-1-yl, dimethylcyclopentadienyl-Ti-bis-2,3,4,5,6-pentafluorophenyl-1-yl; the iron-arene complexes described in JP-A Nos. 1-304453 and 1-152109; and the like.

The hexaarylbiimidazole compounds include, for example, various compounds described in JP-B No. 6-29285, U.S. Pat. Nos. 3,479,185, 4,311,783, 4,622,286, and the like, and specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

Specific examples of the organic borate compounds include the organic boric acid salts described in JP-A Nos. 62-143044, 62-150242, 9-188685, 9-188686, 9-188710, 2000-131837, 2002-107916, Japanese Patent No. 2764769 and Japanese Patent Application No. 2000-310808, Kunz, Martin, "Rad Tech '98, Proceedings, Apr. 19-22, 1998, Chicago", and the like; the organic boron-sulfonium complexes or organic boron-oxosulfonium complexes described in JP-A Nos. 6-157623, 6-175564 and 6-175561; the organic boron-iodonium complexes described in JP-A Nos. 6-175554 and 6-175553; the organic boron-phosphonium complexes described in JP-A No. 9-188710; the organic boron-transition metal coordination complexes described in JP-A Nos. 6-348011, 7-128785, 7-140589, 7-306527 and 7-292014; and the like.

The disulfone compounds include the compounds described in JP-A Nos. 61-166544, 2002-328465 (Japanese Patent Application No. 2001-132318), and the like.

As for the oxime compounds, any compound having a —C=N—O-bond in the molecule may be used without limitation. Preferably, the oxime compound is a compound represented by the formula (I) or formula (II).

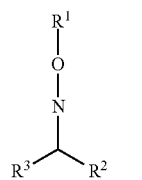

formula (I)

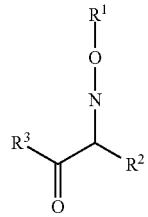

formula (II)

In the formulae (I) and (II), $R^1$ is a monovalent organic group, and preferably an organic group having a carbonyl group or a sulfo group in the structure. From the viewpoints of sensitivity and stability, $R^1$ is preferably a monovalent organic group represented by the following formula (III) or formula (IV).

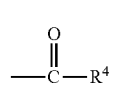

formula (III)

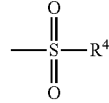

formula (IV)

In the formula (III) and formula (IV), $R^4$ represents a monovalent organic group, and specifically, an alkyl group having 1 to 20 carbon atoms, an alkenyl group, an alkynyl group, a cycloalkyl group, a cycloalkenyl group, a cycloalkynyl group, an aryl group, a heterocyclic group or an alkoxy group is preferred.

These may be further substituted, and the substituents that may be introduced include a halogen atom, a hydroxyl group, an alkyl group, an alkenyl group, an alkynyl group, a cycloalkyl group, a cycloalkenyl group, a cycloalkynyl group, an aryl group, a heterocyclic group, a cyano group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, and substituents having these groups.

Among these, the substituent represented by formula (III) is most preferred in terms of stability over time, sensitivity and productivity, and it is the case where $R^4$ is an alkyl group or an aryl group.

In the formulae (I) and (II), $R^2$ represents a hydrogen atom or a monovalent organic group. In the case where $R^2$ is a monovalent organic group, the organic group may include an alkyl group having 1 to 20 carbon atoms, an alkenyl group, an alkynyl group, a cycloalkyl group, a cycloalkenyl group, a cycloalkynyl group, an aryl group, a heterocyclic group, an alkoxy group, and the like.

These may have further substituents, and the substituents that may be introduced may include a halogen atom, a hydroxyl group, an alkyl group, an alkenyl group, an alkynyl group, a cycloalkyl group, a cycloalkenyl group, a cycloalkynyl group, a cyano group, an aryl group, a heterocyclic group, an alkoxy group, an aryloxy group, a thioalkoxy group, a thioaryloxy group, a carboxyl group, an alkoxycarbonyl group, a sulfa group, a sulfonamide group, a urea group, a thiourea group, an amino group, an amide group, a carbonyl group, a nitro group, or substituents having these groups.

$R^3$ represents a monovalent organic group. Examples of the monovalent organic group may include an alkyl group having 1 to 20 carbon atoms, an alkenyl group, an alkynyl group, a cycloalkyl group, a cycloalkenyl group, a cycloalkynyl group, an aryl group, a heterocyclic group, and an alkoxy group.

These may have further substituents, and the substituents that may be introduced include a halogen atom, a hydroxyl group, an alkyl group, an alkenyl group, an alkynyl group, a cycloalkyl group, a cycloalkenyl group, a cycloalkynyl group, an aryl group, a cyano group, a heterocyclic group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, or substituents having these groups.

Among the above-described groups, $R^3$ is preferably an aryl group or a heterocyclic group from the viewpoint of sensitivity. When $R^3$ is an aryl group, it is preferably substituted with a substituent having a nitrogen atom or a sulfur atom. Also, when $R^3$ is a heterocyclic group, it preferably contains a nitrogen atom, an oxygen atom or a sulfur atom.

Moreover, the oxime compounds may include compounds described in J. C. S. Perkin II (1979) 1653-1660, J. C. S. Perkin II (1979) 156-162, Journal of Photopolymer Science and Technology (1995) 202-232, and JP-A No. 2000-66385; and the compounds described in JP-A No. 2000-80068 and Japanese Patent Application National Publication (Laid-Open) No. 2004-534797; and the like.

Examples of the onium compounds include the diazonium salts described in S. I. Schlesinger, Photogr. Sci. Eng., 18, 387 (1974), T. S. Bal et al., Polymer, 21, 423 (1980); the ammonium salts described in U.S. Pat. No. 4,069,055, JP-A No. 4-365049 and the like; the phosphonium salts described in U.S. Pat. Nos. 4,069,055 and 4,069,056; the iodonium salts described in EP No. 104,143, U.S. Pat. Nos. 339,049 and 410,201, JP-A Nos. 2-150848 and 2-296514; and the like.

The iodonium salts that may be appropriately used in the invention are diaryliodonium salts, and from the viewpoint of stability, a diaryliodonium salt which is substituted with two or more of electron donating groups such as an alkyl group, an alkoxy group or an aryloxy group, is preferred. Furthermore, as another preferred form of sulfonium salt, an iodonium salt in which one of the substituents of a triarylsulfonium salt has a coumarin or anthraquinone structure, and which has absorption at 300 nm or longer, is preferred.

The sulfonium salt that may be appropriately used in the invention may include the sulfonium salts described in EP Nos. 370,693, 390,214, 233,567, 297,443 and 297,442, U.S. Pat. Nos. 4,933,377, 161,811, 410,201, 339,049, 4,760,013, 4,734,444 and 2,833,827, D.E. Patent Nos. 2,904,626, 3,604,580 and 3,604,581. From the viewpoint of stable sensitivity, a sulfonium salt substituted with an electron withdrawing group is preferred. As for the electron withdrawing group, one having a Hammett value of greater than 0 is preferred. Preferred electron withdrawing groups include a halogen atom, carboxylic acid and the like.

Another preferred sulfonium salt may include a sulfonium salt in which one of the substituents of a triarylsulfonium salt has a coumarin or anthraquinone structure, and which has absorption at 300 nm or longer. Another preferred sulfonium salt may include a sulfonium salt in which a triarylsulfonium salt has an aryloxy group or an arylthio group as the substituent, and which has absorption at 300 nm or longer.

As the onium salt compounds, onium salts such as the selenonium salts described in J. V. Crivello et al., Macromolecules, 10(6), 1307 (1977), and J. V. Crivello et al., J. Polymer Sci., Polymer Chem. Ed., 17, 1047 (1979); and the arsonium salts described in C. S. Wen et al., Teh, Proc. Conf. Rad. Curing ASIA, p.478 Tokyo, Oct (1988), may also be used.

The acylphosphine-based compounds include Irgacure 819, Darocure 4265 and Darocure TPO, all manufactured by Ciba Specialty Chemicals Inc., and the like.

Examples of the alkylamino compounds include the compounds having a dialkylaminophenyl group or the alkylamine compounds described in JP-A No. 9-281698, paragraph [0047], JP-A Nos. 6-19240 and 6-19249, and the like. Specifically, the compounds having a dialkylaminophenyl group include compounds such as ethyl p-dimethylaminobenzoate, or dialkylaminophenylcarbaldehydes such as p-diethylaminobenzcarboaldehyde and 9-durolidylcarbaldehyde, and the alkylamine compounds include triethanolamine, diethanolamine, triethylamine and the like.

As for the (E) photopolymerization initiator used in the invention, from the viewpoint of exposure sensitivity, a compound selected from the group consisting of triazine-based compounds, alkylamino compounds, benzyldimethylketal compounds, α-hydroxyketone compounds, α-aminoketone compounds, acylphosphine-based compounds, phosphine oxide-based compounds, metallocene compounds, oxime-based compounds, biimidazole-based compounds, onium-based compounds, benzothiazol-based e compounds, benzophenone-based compounds, acetophenone-based compounds and derivatives thereof, cyclopentadiene-benzene-iron complex and salts thereof, halomethyloxadiazole compounds, and 3-aryl-substituted coumarin compounds, is preferred.

More preferably, triazine-based compounds, alkylamino compounds, α-aminoketone compounds, acylphosphine-based compounds, phosphine oxide-based compounds, oxime-based compounds, biimidazole-based compounds, onium-based compounds, benzophenone-based compounds and acetophenone-based compounds may be mentioned, and at least one kind compound selected from the group consisting of triazine-based compounds, alkylamino compounds, oxime-based compounds and biimidazole-based compounds is more preferred.

Particularly in the case of producing a solid state image pick-up element, it is most preferable to use an oxime-based photopolymerization initiator from the viewpoints of the sensitivity of the curable composition and stable production.

The content of the (E) photopolymerization initiator in the curable composition is preferably from 0.1 to 50% by mass, more preferably from 0.5 to 30% by mass, and particularly preferably from 1 to 20% by mass, based on the total solids of the composition. In particular, when the curable composition of the invention is used for the formation of colored patterns of color filters, the content of the (E) photopolymerization initiator is preferably from 1 to 40% by mass, more preferably from 2 to 30% by mass, and even more preferably from 3 to 20% by mass, based on the total solids contained in the curable composition, from the viewpoints of photosensitivity, contact characteristics with substrate and the degree of curing.

(F) Photopolymerizable Compound

The curable composition of the invention preferably includes, as a photopolymerizable compound, a compound having an ethylenic unsaturated double bond, except the (A-1) polymer compound having a structural unit represented by any one of the formulae (1) to (3) according to the first aspect of the invention, or the (D) resin having an acid number of 100 mg KOH/g or more and the (A-2) dispersion resin having an acid number of less than 100 mg KOH/g and an unsaturation equivalent of less than 600 according to the second aspect of the invention.

The "compound having an ethylenic unsaturated double bond" that may be used in the invention is different from the dispersion resin according to the first aspect of the invention (A-1) for the curable composition according to the first aspect of the invention, or the resin of high acid number (D) according to the invention and the dispersion resin according to the second aspect of the invention (A-2) for the curable composition associated with the second aspect of the invention, and is an addition polymerizable compound having at least one ethylenic unsaturated double bond. The compound is selected from compounds having at least one, preferably two or more, terminal ethylenic unsaturated bonds. Such the compound group is widely known in the art, and in the invention, these can be used without any restriction. These have a chemical form such as a monomer, a prepolymer, that is, a dimer, a trimer and an oligomer, and a mixture thereof as well as a copolymer thereof. Examples of the monomer and the copolymer thereof include unsaturated carboxylic acids (e.g. acrylic acid, methacrylic acid, itaconic acid, crotonic acid, isocrotonic acid, maleic acid, etc.), and esters, and amides thereof. Preferably, esters of unsaturated carboxylic acid and an aliphatic polyhydric alcohol compound, and amides of unsaturated carboxylic acid and an aliphatic polyvalent amino compound are used. In addition, addition reaction products of unsaturated carboxylic acid esters or amides having a nucleophilic substituent such as a hydroxyl group, an amino group, and a mercapto group, and monofunctional or polyfunctional isocyanates of epoxies, and dehydration condensation reaction products with monofunctional or polyfunctional carboxylic acids are also suitably used. In addition, addition reaction products of unsaturated carboxylic acid esters or amides having an electrophilic substituent such as an isocyanate group, and an epoxy group, and monofunctional or polyfunctional alcohols, amines or thiols, and substitution reaction products of unsaturated carboxylic acid esters or amides having an eliminable substituent such as a halogen group, and a tosyloxy group, and monofunctional or polyfunctional alcohols, amines or thiols are also preferable. As another example, a compound group in place of the unsaturated carboxyl acids are substituted with unsaturated phosphonic acid, styrene or vinyl ether may be used.

As a specific example of a monomer of an ester of an aliphatic polyhydric alcohol compound and unsaturated carboxylic acid, there are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid EO-modified triacrylate.

There are methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

There are itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. There are crotonic acid esters such as ethylene glycol dicrotonate, tetramethylene glycol dicrotonate, and pentaerythritol dicrotonate. There are isocrotonic acid esters such as ethylene glycol diisocrotonate, pentaerythritol diisocrotonate, and sorbitol tetraisocrotonate. There are maleic acid esters such as ethylene glycol dimaleate, triethylene glycol dimaleate, pentaerythritol dimaleate, and sorbitol tetramaleate.

As an example of other ester, for example, aliphatic alcohol-based esters described in JP-B No. 51-47334, and JP-A No. 57-196231, esters having an aromatic skeleton described in JP-A No. 59-5240, JP-A No. 59-5241, and JP-A No. 2-226149, and esters containing an amino group described in JP-A No. 1-165613 are also preferably used. Further, the aforementioned ester monomers may be also used as a mixture.

In addition, as a specific example of a monomer of amide of an aliphatic polyhydric amine compound and unsaturated carboxylic acid, there are methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Examples of other preferable amide-based monomer include monomers having a cyclohexylene structure described in JP-B No. 54-21726.

In addition, a urethane-based addition-polymerization compound which is produced using an addition reaction between isocyanate and a hydroxyl group is also preferable, and specific examples of such the compound include a vinylurethane compound containing two or more polymerizable vinyl groups in one molecule, in which a vinyl monomer containing a hydroxyl group represented by the following formula (A) is added to a polyisocyanate compound having two or more isocyanate groups in one molecule described in JP-B No. 48-41708.

$$CH_2=C(R^{10})COOCH_2CH(R^{11})OH \qquad \text{Formula (A):}$$

(In the formula (A), $R^{10}$ and $R^{11}$ represent H or $CH_3$)

In addition, urethane acrylates described in JP-A No. 51-37193, JP-B No. 2-32293, and JP-B No. 2-16765, and urethane compounds having an ethylene oxide-based skeleton described in JP-B No. 58-49860, JP-B No. 56-17654, JP-B No. 62-39417, and JP-B No. 62-39418 are also preferable. Furthermore, by using addition-polymerization compounds having an amino structure or a sulfide structure in a molecule, described in JP-A No. 63-277653, JP-A No. 63-260909, and JP-A No. 1-105238, a photopolymerizable composition, which is very excellent in a photosensitive speed, can be obtained.

Other examples include polyfunctional acrylates and methacrylates such as polyester acrylates, and epoxy acrylates obtained by reaction of an epoxy resin and (meth)acrylic acid, described in each gazette of JP-A No. 48-64183, JP-B No. 49-43191, and JP-B No. 52-30490. In addition, examples include specified unsaturated compounds described in JP-B No. 46-43946, JP-B No. 1-40337, and JP-B No. 1-40336, and vinylphosphonic acid-based compounds described in JP-A No. 2-25493. In some cases, a structure containing a perfluoroalkyl group described in JP-A No. 61-22048 is preferably used. Furthermore, compounds which are introduced as a photocurable monomer and oligomer in Journal of Adhesion Society of Japan, vol. 20, No. 7, p. 300-308 (1984) can be also used.

Regarding these addition-polymerization compounds, details of usage such as a structure thereof, whether they are used alone or in combination, and an addition amount can be arbitrarily set depending on performance design of a final sensitive material. For example, details are selected from the following viewpoint.

In respect of a sensitivity, a structure having a higher unsaturated group content per molecule is preferable and, in many cases, di- or higher functional is preferable. In addition, in order to increase a strength of an image part, that is, a cured film, a tri- or higher functional is favorable and, further, a method of regulating both of a sensitivity and a strength by using a different functional number a different polymerizable group (e.g. acrylic acid ester, methacrylic acid ester, styrene-based compound, vinyl ether-based compound) in combination is also effective. From a viewpoint of a curing sensitivity, it is preferable to use a compound containing 2 or more (meth)acrylic acid ester structures, it is more preferable to use a compound containing 3 or more structures, and it is most preferable to use a compound containing 4 or more structures. And, from a viewpoint of a curing sensitivity, and developability of an unexposed part, it is preferable that an EO-modified compound is contained. And, from a viewpoint of a curing sensitivity, and a strength of an exposed part, it is preferable that a urethane bond is contained.

In addition, for compatibility and dispersibility with other component (e.g. polymer, photopolymerization initiator, pigment, etc.)) in a polymerizable layer, a method of selecting and using the addition-polymerization compound is an important factor, and for example, compatibility is improved by using a low purity compound, or using two or more kinds in combination, in some cases. Alternatively, for the purpose of improving adhesion of a substrate, a specified structure can be selected.

From the above viewpoint, preferable examples include bisphenol A diacrylate, EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, EO-modified pentaerythritol tetraacrylate, and EO-modified dipentaerythritol hexaacrylate. As a commercially available product, urethane oligomer UAS-10, UAB-140 (manufactured by Sanyo Kokusaku Pulp), DPHA-40H (manufactured by Nippon Kayaku Co., Ltd.), UA-306H, UA-306T, UA-306I, AH-600, T-600, and AI-600 (manufactured by Kyoeisha Chemical CO., LTd.), UA-7200 (manufactured by SHIN-NAKAMURA CHEMICAL CO., LTD.) are preferable.

Among these, EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl) isocyanurate, EO-modified pentaerythritol tetraacrylate, and EO-modified dipentaerythritol hexaacrylate are more preferable. As a commercially available product, DPHA-40H (manufactured by Nippon Kayaku Co., Ltd.), UA-306H, UA-306T, UA-3061, AH-600, T-600, and AI-600 (manufactured by Kyoeisha Chemical CO., LTd.) are more preferable.

A content of the (F) photopolymerizable compound is preferably 1 to 90% by mass, more preferably 5 to 80% by mass, further preferably 10 to 70% by mass, based on the total solids of the curable composition of the invention. In particular, when the curable composition of the invention is used in the formation of colored patterns in color filters, the content of the (F) photopolymerizable compound is preferably from 5 to 50% by mass, more preferably from 7 to 40% by mass, and even more preferably from 10 to 35% by mass, based on the total solids of the curable composition of the invention, from the viewpoint of further improving the photosensitivity, contact characteristics with substrate and the degree of curing.

Furthermore, with regard to the curable composition according to the first aspect of the invention, when the (A-1) polymer compound having a structural unit represented by any one of the formulae (1) to (3) (the dispersion resin according to the first aspect of the invention) and the (F) photopolymerizable compound, which is other than the (A-1) dispersion resin according to the invention, are used in combination, the content ratio [(A-1)/(F); mass ratio] is preferably 10/1 to 1/100, more preferably 5/1 to 1/10, and even more preferably 3/1 to 1/5, from the viewpoints of sensitivity and stability over time.

With regard to the curable composition according to the second aspect of the invention, when the (A-2) dispersion resin having an acid number of less than 100 mg KOH/g and an unsaturated equivalent of less than 600 (the dispersion resin according to the second aspect of the invention) and the (F) photopolymerizable compound, which is other than the (A-2) dispersion resin according to the invention, are used in combination, the content ratio [(A-2)/(F); mass ratio] is preferably 100/1 to 1/100, more preferably 50/1 to 1/10, and even more preferably 30/1 to 1/5, from the viewpoints of sensitivity and stability over time.

Next, further components that may be also used in the curable composition of the invention will be illustrated.

(G) Sensitizing Agent

The curable composition of the invention may also include a sensitizing agent (G), for the purpose of improving the efficiency of radical generation by the (E) photopolymerizable initiator, and shifting the exposure wavelength to a longer wavelength. As for the sensitizing agent that may be used for the invention, a sensitizing agent which sensitizes the (E) photopolymerization initiator by means of an electron transfer mechanism or an energy transfer mechanism, is preferable.

The sensitizing agent that may be used for the invention may include sensitizing agent which belongs to the compound families listed below and has an absorption wavelength in the wavelength region of 300 nm to 450 nm.

Preferred examples of the sensitizing agent include those belonging to the following compound families and having an absorption wavelength in the region of 330 nm to 450 nm.

Examples include polynuclear aromatic compounds (e.g. phenanthrene, anthracene, pyrene, perylene, triphenylene, 9,10-dialkoxyanthracene), xanthenes (e.g. fluorescein, eosine, erythrosine, rhodamine B, rosebengal), thioxanthones (isopropylthioxanthone, diethylthioxanthone, chlorothioxanthone), cyanines (e.g. thiacarbocyanine, oxacarbocyanine), merocyanines (e.g. merocyanine, carbomerocyanine), phthalocyanines, thiazines (e.g. thionine, methylene blue, toluidine blue), acridines (e.g. acridine orange, chloroflavin, acriflavine), anthraquinones (e.g. anthraquinone), squaliums (e.g. squalium), acridine orange, coumarins (e.g. 7-diethylamino-4-methylcoumarin), ketocoumarin, phenothiazines, phenazines, styrylbenzenes, azo compound, diphenylmethane, triphenylmethane, distyrylbenzenes, carbazoles, porphyrin, Spiro compound, quinacridone, indigo, styryl, pyrylium compound, pyromethene compound, pyrazolotriazole compound, benzothiazole compound, barbituric acid derivative, thiobarbituric acid derivative, acetophenone, benzophenone, thioxanthone, aromatic ketone compound such as Michler's ketone, and heterocycle compound such as N-aryloxazolidinone, and further examples include compounds described in EP No. 568,993, U.S. Pat. Nos. 4,508,811, 5,227,227, JP-A No. 2001-125255, and JP-A No. 11-271969.

Examples of a more preferable sensitizer include compounds represented by the following formulae (i) to (iv).

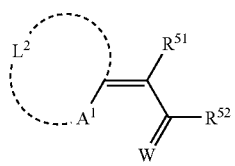

(i)

In the formula (i), $A^1$ represents a sulfur atom or $NR^{50}$, $R^{50}$ represents an alkyl group or an aryl group, $L^2$ is taken together with adjacent $A^1$ and an adjacent carbon atom to represent a non-metal atomic entity forming a basic nucleus of a coloring matter, $R^{51}$ and $R^{52}$ each independently represent a hydrogen atom or a monovalent non-metal atomic entity, $R^{51}$ and $R^{52}$ may be taken together to form an acidic nucleus of a coloring matter, and W represents an oxygen atom or a sulfur atom.

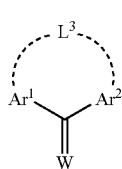

(ii)

In the formula (ii), $Ar^1$ and $Ar^2$ each independently represent an aryl group, and are connected via a bond by -$L^3$-, wherein $L^3$ represents —O— or —S—. W is as defined in the formula (i).

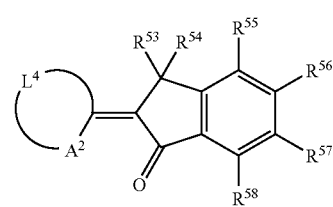

(iii)

In the formula (iii), $A^2$ represents a sulfur atom or $NR^{59}$, $L^4$ is taken together with adjacent $A^2$ and a carbon atom to represent a non-metal atomic entity forming a basic nucleus of a coloring matter, $R^{53}$, $R^{54}$, $R^{55}$, $R^{56}$, $R^{57}$ and $R^{58}$ each independently represent a monovalent non-metal atomic entity, and $R^{59}$ represents an alkyl group or an aryl group.

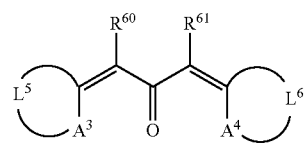

(iv)

In the formula (iv), $A^3$ and $A^4$ each independently represent —S— or —$NR^{62}$— or —$NR^{63}$—, $R^{62}$ and $R^{63}$ each independently represent a substituted or unsubstituted alkyl group, or a substituted or unsubstituted aryl group, $L^5$ and $L^6$ each independently are taken together with adjacent $A^3$ and $A^4$ and an adjacent carbon atom to represent a non-metal atomic entity forming a basic nucleus of a coloring matter, and $R^{60}$ and $R^{61}$ each independently are a monovalent non-metal atomic entity, or may be taken together to form an aliphatic or aromatic ring.

In addition, examples of a preferable sensitizing agent, which can be contained in the curable composition of the invention, include at least one kind selected from compounds represented by the following formulae (IV) to (VI), in addition to the above-described components.

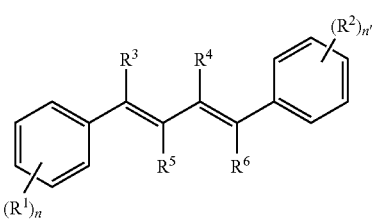

(IV)

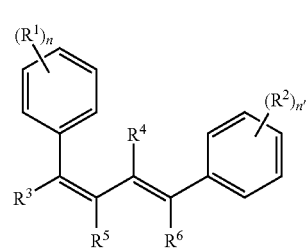

(V)

In the formula (IV) or the formula (V), $R^1$ and $R^2$ each independently represent a monovalent substituent, $R^3$, $R^4$, $R^5$ and $R^6$ each independently represent a hydrogen atom or a monovalent substituent, n denotes an integer of 0 to 5, and n' denotes an integer of 0 to 5, provided that n and n' do not represent 0 at the same time. When n is 2 or more, plural $R^1$s may be the same or different. When n' is 2 or more, plural $R^2$s may be the same or different.

The compound represented by the formula (IV) is preferably the compound represented by the following formula (IV-1) from a viewpoint of a sensitivity, and the coloring property when a pigment is contained.

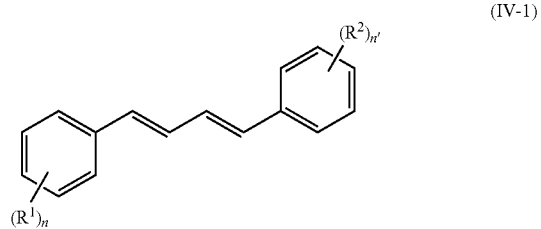

In the formula (IV-1), $R^1$ and $R^2$ each independently represent a monovalent substituent, n denotes an integer of 0 to 5, and n' denotes an integer of 1 to 5. When n is 2 or more, plural $R^1$s may be the same or different and, when n' is 2 or more, plural $R^2$s may be the same or different.

In the formula (IV-1), the monovalent substituent represented by $R^1$ and $R^2$ has the same meaning as that of the monovalent substituent represented by $R^1$ and $R^2$ in the formula (IV), and a preferable range is similar.

The compound represented by the formula (IV) or the formula (V) has a molar extinction coefficient $\epsilon$ at a wavelength 365 nm of preferably 500 $mol^{-1} \cdot L \cdot cm^{-1}$ or more, $\epsilon$ at a wavelength 365 nm of more preferably 3000 $mol^{-1} \cdot L \cdot cm^{-1}$ or more, $\epsilon$ at a wavelength 365 nm of most preferably 20000 $mol^{-1} \cdot L \cdot cm^{-1}$ or more. When a value of a molar extinction coefficient $\epsilon$ at each wavelength is in the above range, the effect of improving a sensitivity is high, being preferable from a viewpoint of the light absorption efficiency.

Herein, a molar extinction coefficient $\epsilon$ is obtained by using, as a sample, a coloring matter solution prepared to a concentration of 0.01 g/l in a 1-methoxy-2-propanol solution, measuring a transmission spectrum of the sample at 365 nm, and obtaining an absorbance from a UV-visible absorption spectrum of the sample. As the measurement apparatus, UV-Vis-MR Spectrophotometer Cary5G-type spectrophotometer manufactured by Varian was used.

Preferable examples of the compound represented by the formula (IV) or the formula (V) are shown below, however the sensitizer used in the curable composition of the invention is not restricted to them.

In the present specification, a chemical formula is described by a simplified structural formula in some cases and, particularly, a solid line not expressly showing an element or a substituent represents a hydrocarbon group. In the following examples, Me represents a methyl group, Et represents an ethyl group, Bu represents a butyl group, n-Bu represents a n-butyl group, and Ph represents a phenyl group.

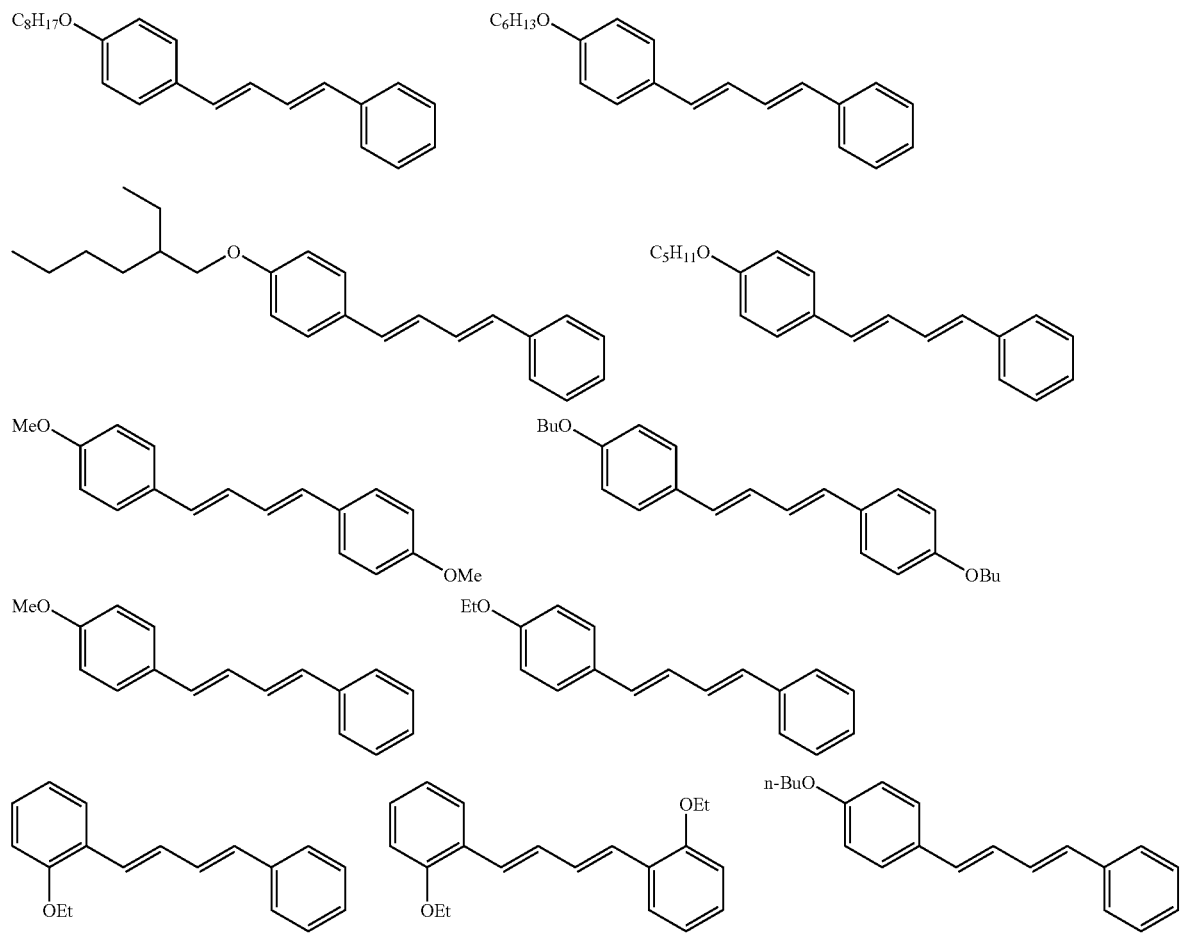

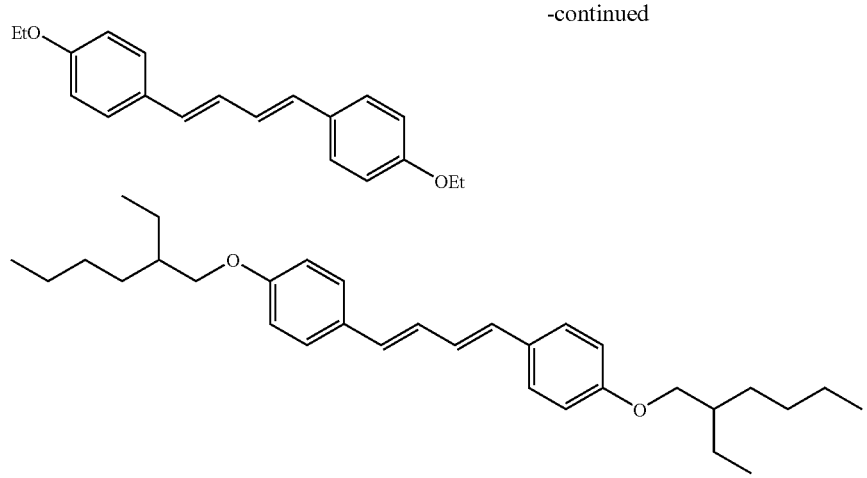
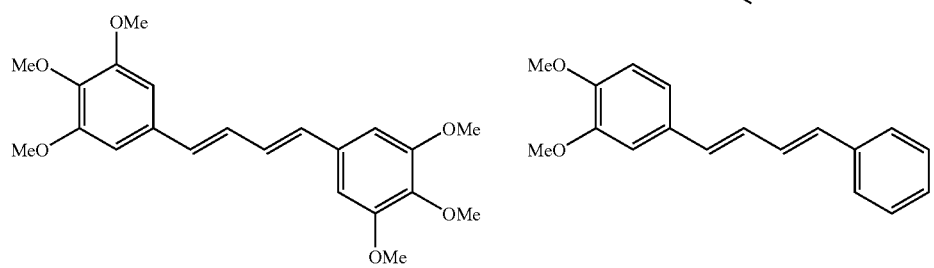
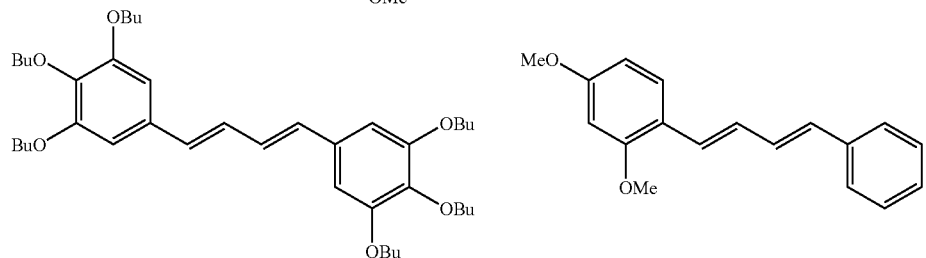
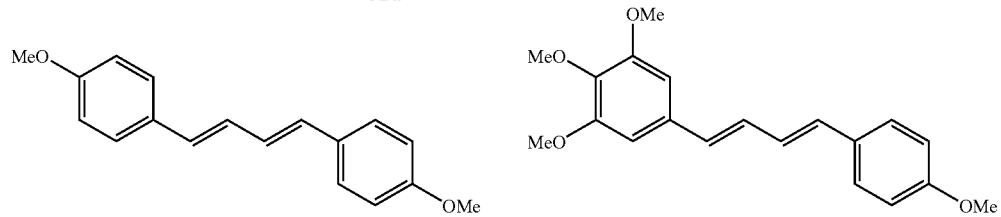
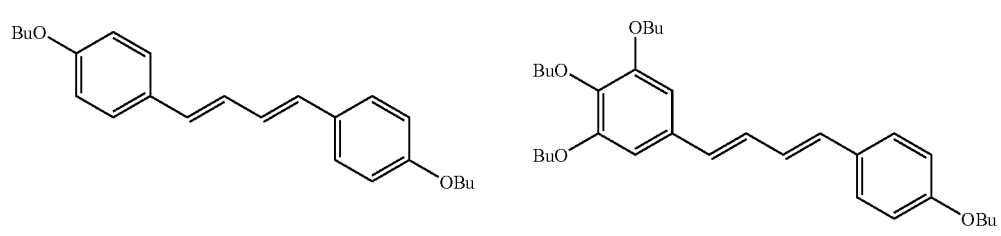
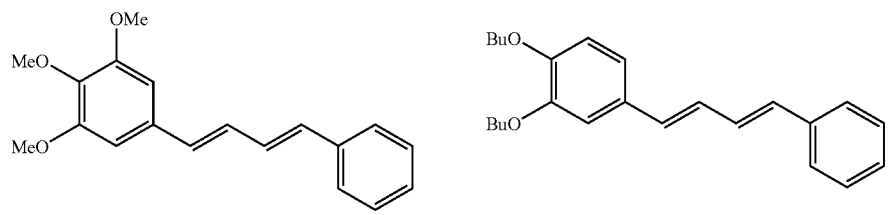

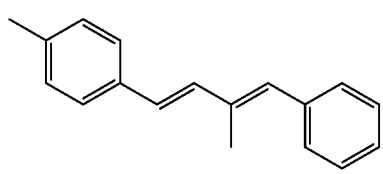
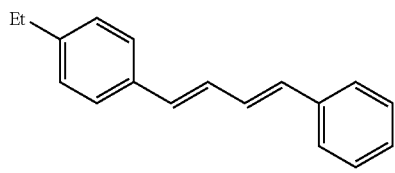
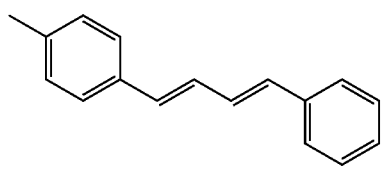
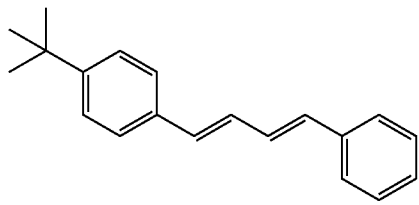
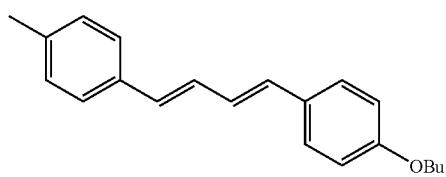
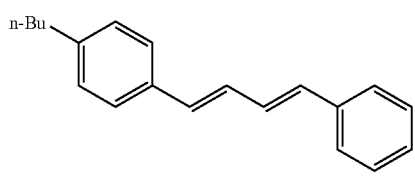
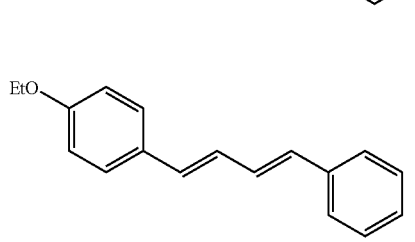
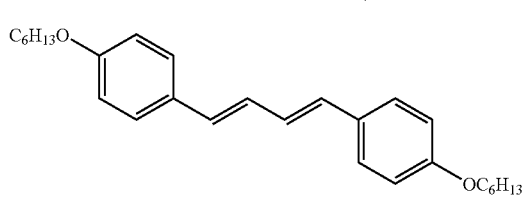
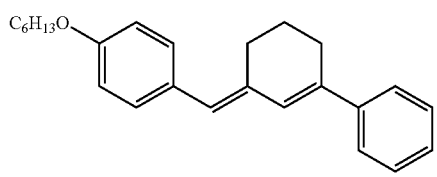
-continued
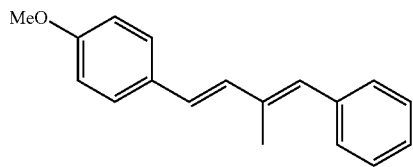
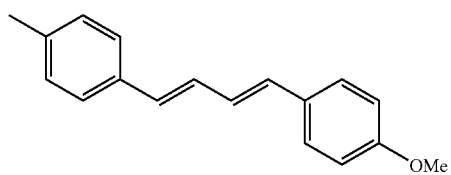
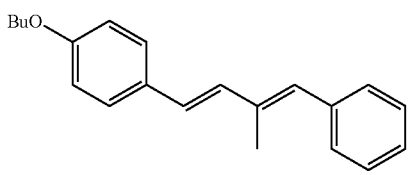
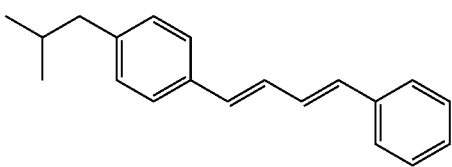
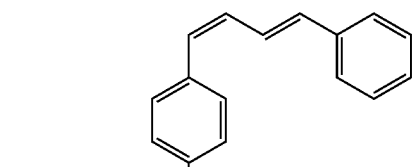
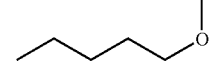
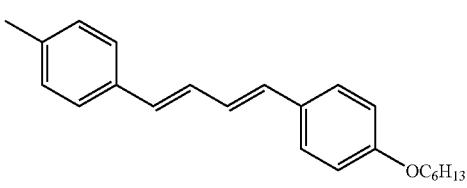
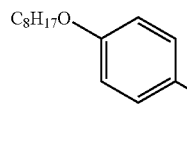
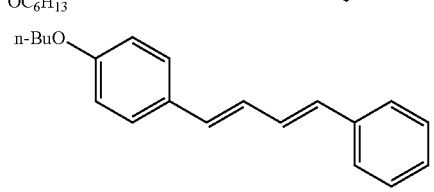

-continued
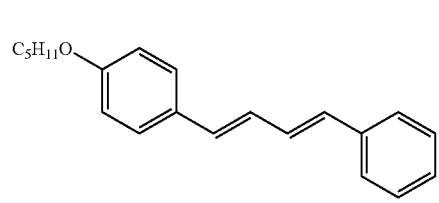
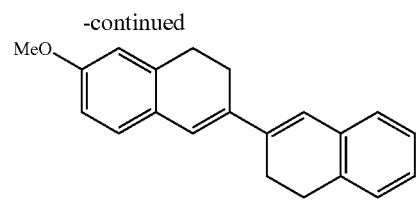
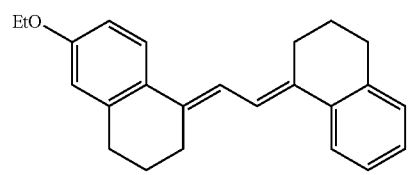
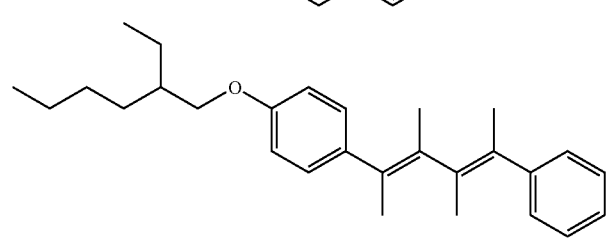
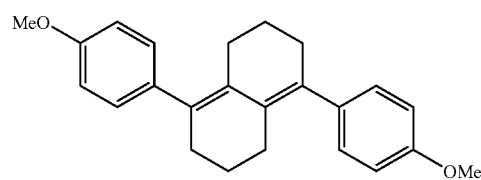
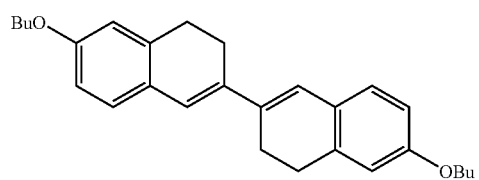
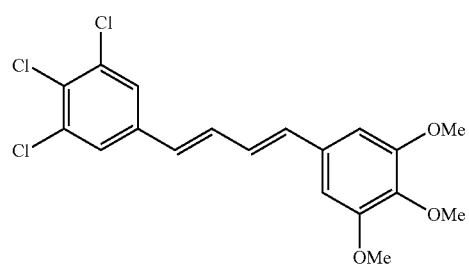
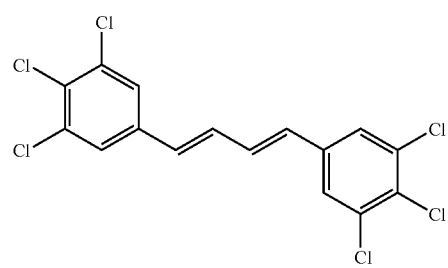
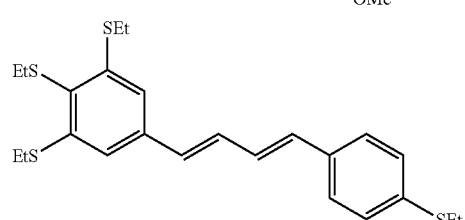
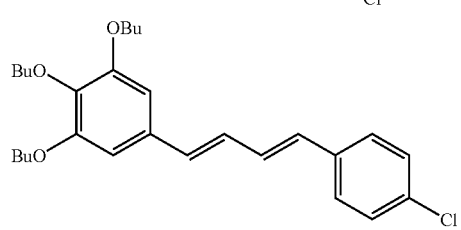
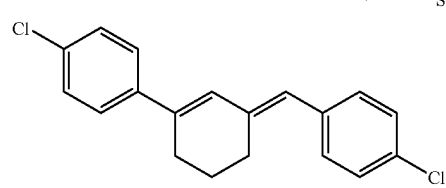
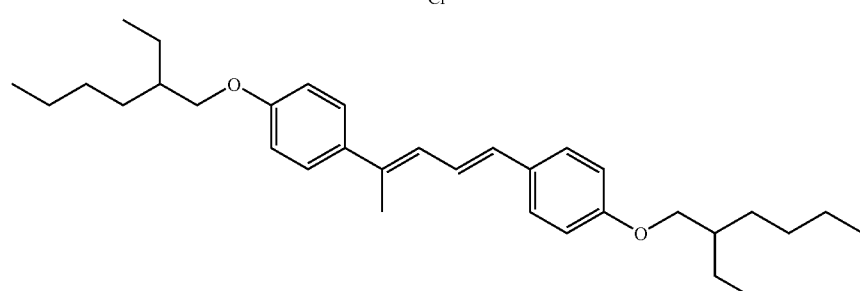
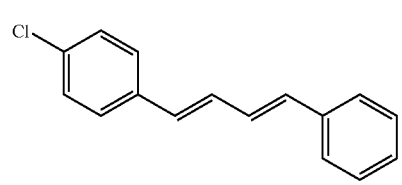
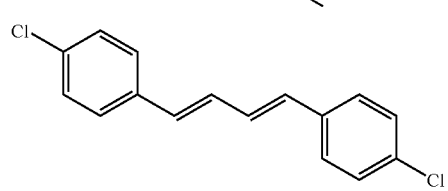

-continued
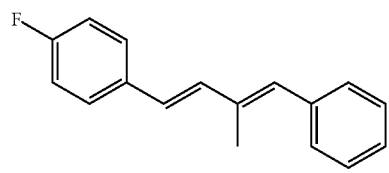
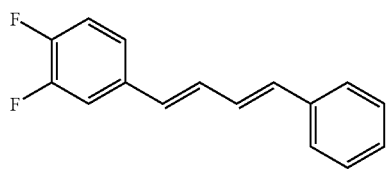
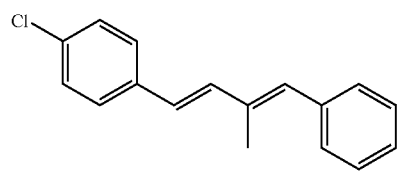
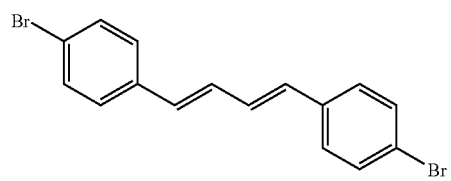
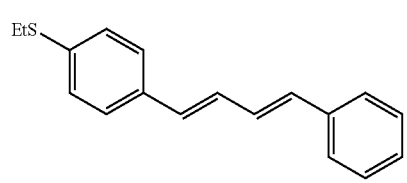
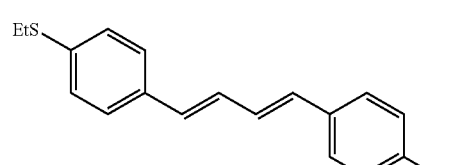
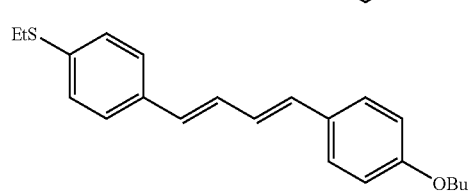
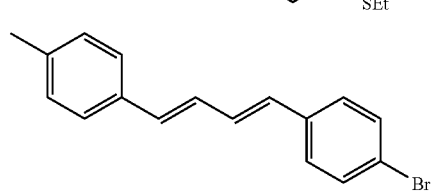
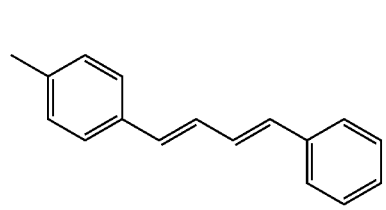
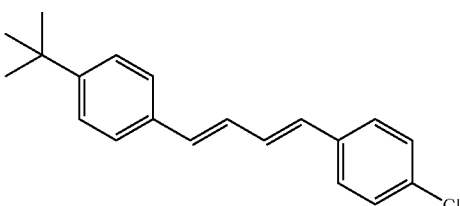
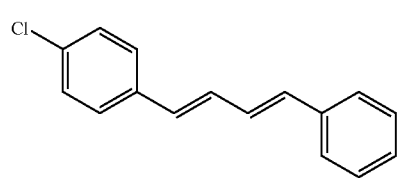
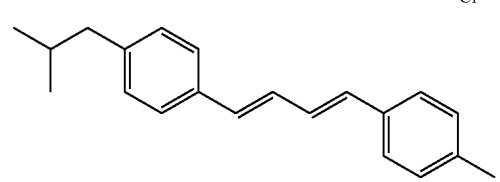
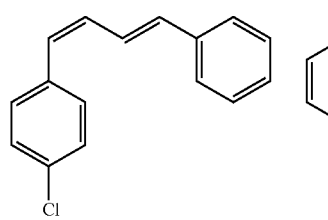
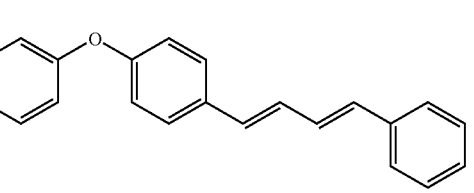
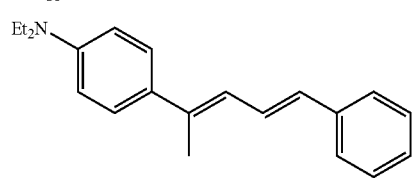
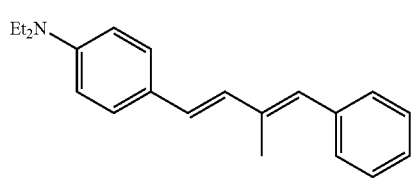
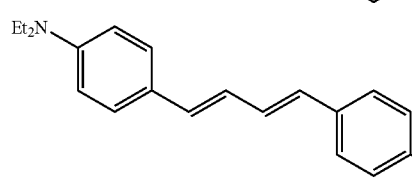
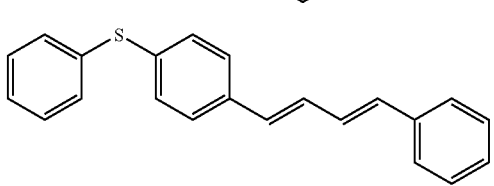

-continued
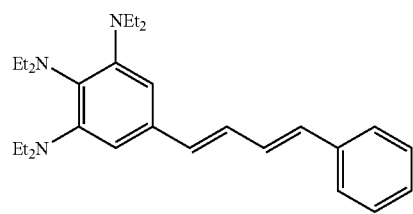
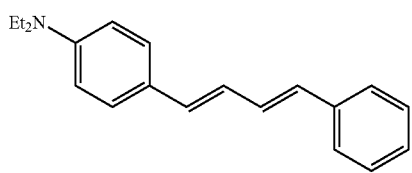
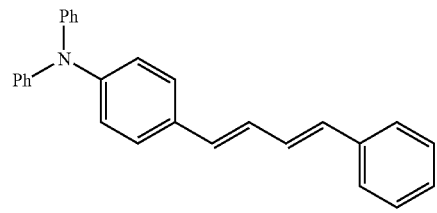
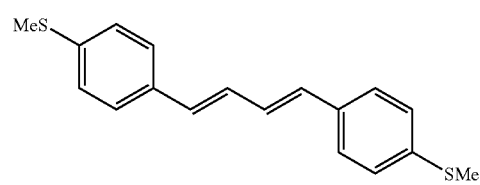
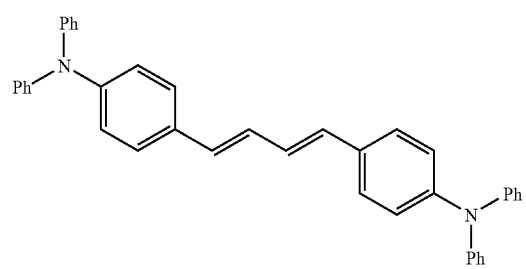
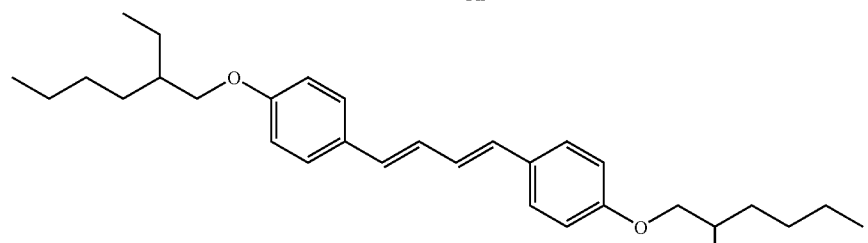
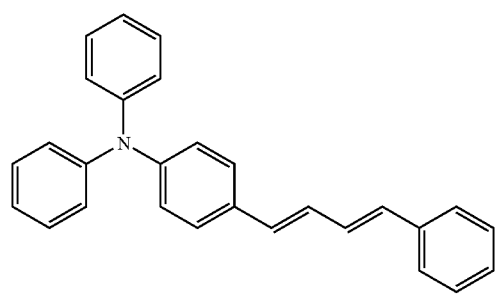
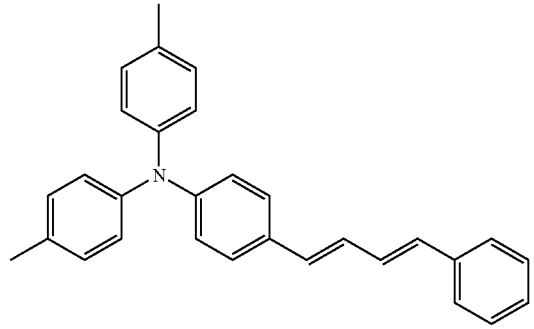
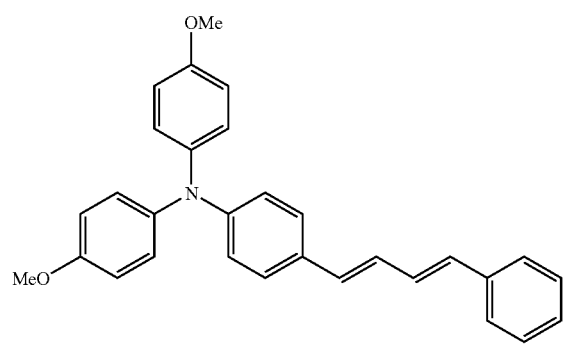
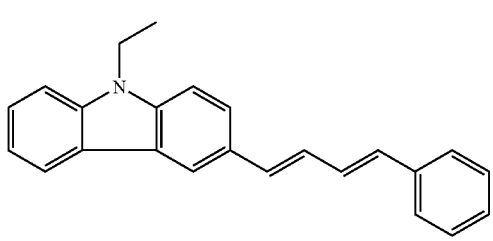

-continued
73
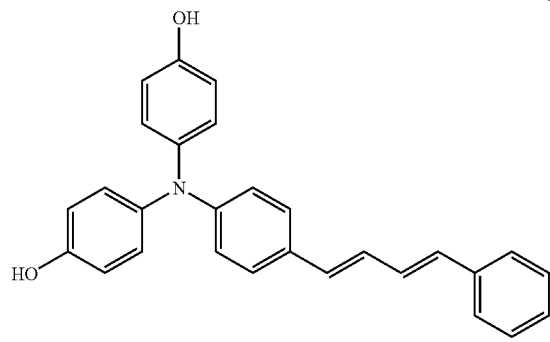
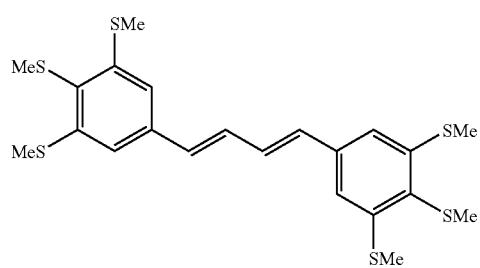
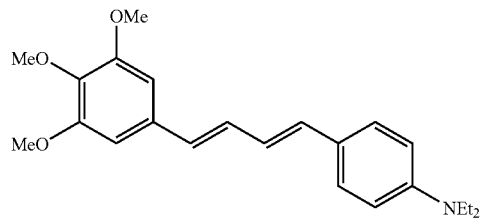
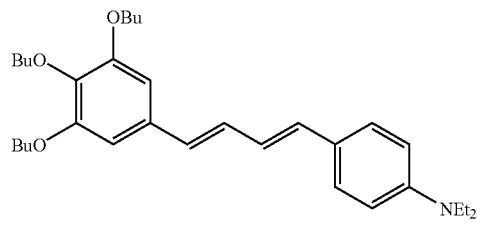
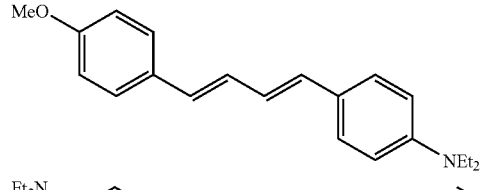
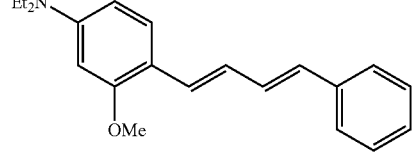
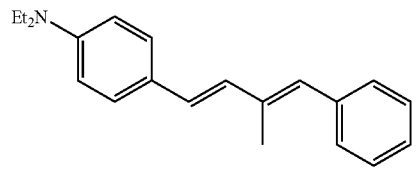
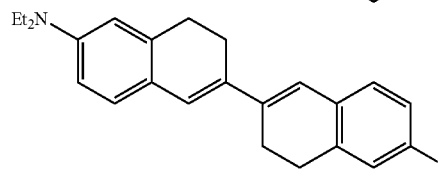
74
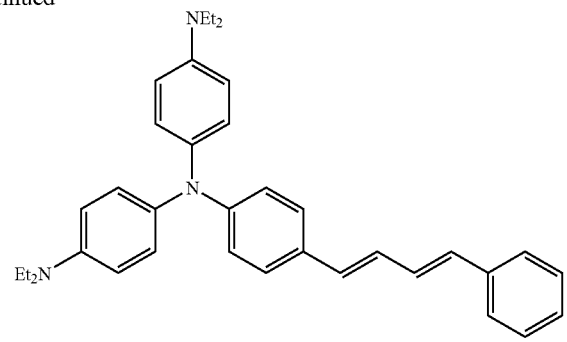
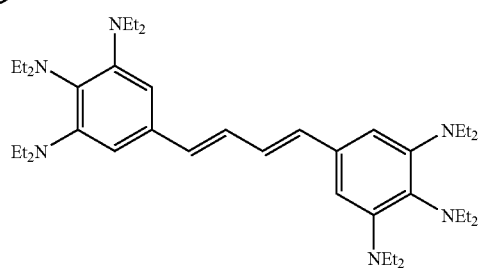
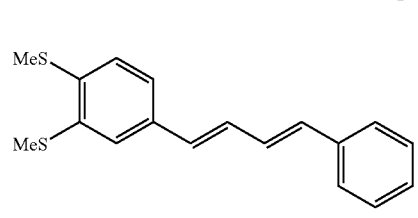
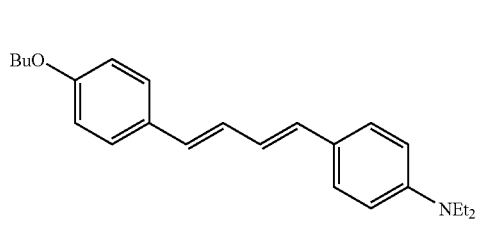
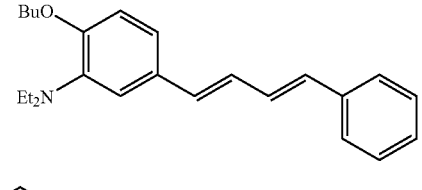
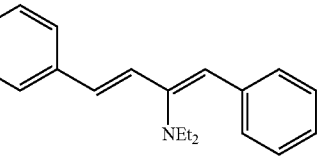
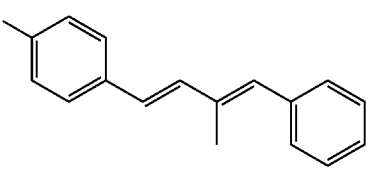
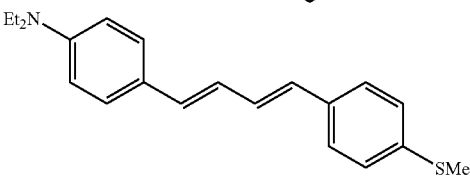

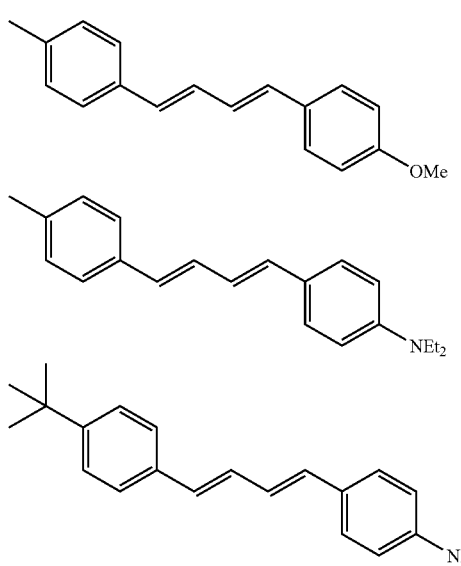
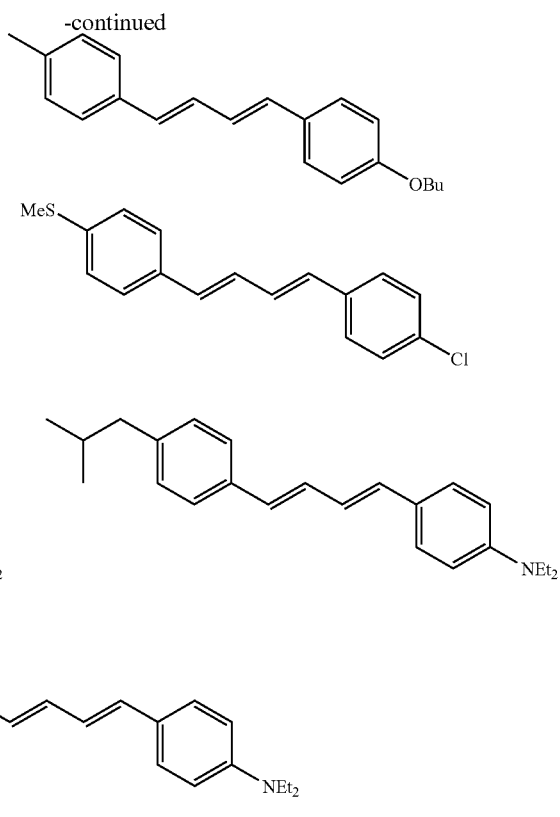
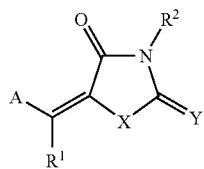

(VI)

In the formula (VI), A represents an aromatic ring or a heterocycle optionally having a substituent, X represents an oxygen atom, a sulfur atom, or —N($R^3$)—, and Y represents an oxygen atom, a sulfur atom, or —N($R^3$)—. $R^1$, $R^2$, and $R^3$ each independently represent a hydrogen atom or a monovalent non-metal atomic entity, and A, $R^1$, $R^2$ and $R^3$ may be taken together to form an aliphatic or aromatic ring.

In the formula (VI), $R^1$, $R^2$ and $R^3$ each independently represent a hydrogen atom, or a monovalent non-metal atom group. When $R^1$, $R^2$ and $R^3$ each represent a monovalent non-metal atom, they are each preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group, or a halogen atom.

In the compound represented by formula (VI), Y is preferably an oxygen atom or —N($R^3$)—, from the viewpoint of improving the decomposition efficiency of the photopolymerization initiator. $R^3$ represents a hydrogen atom, or a monovalent non-metal atom group. Furthermore, Y is most preferably —N($R^3$)—.

Hereinafter, preferred specific examples (VI1) to (VI124) of the compound represented by formula (VI) will be presented below, but the invention is not intended to be limited thereto. It is not clear about an isomer involving a double bond binding an acidic nucleus and a basic nucleus, and the invention is not intended to be limited to any one of the isomers.

(VI1)

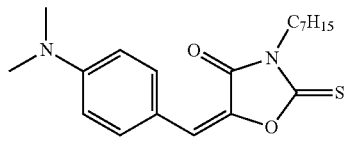

(VI2)

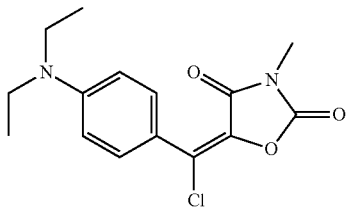

-continued
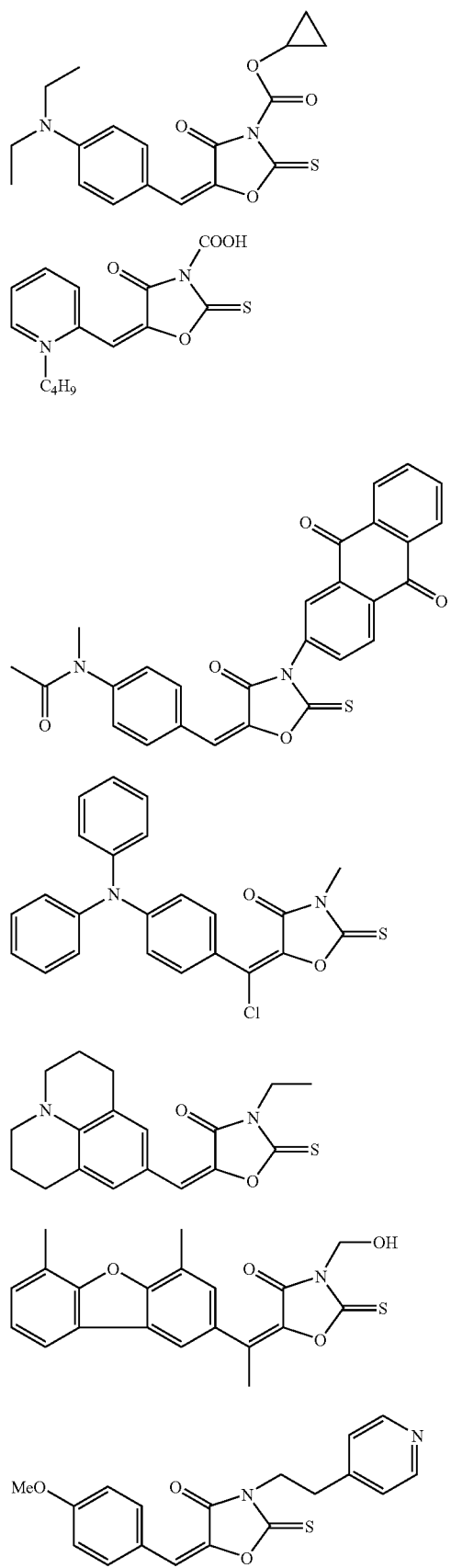
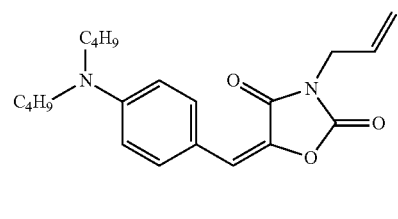
(VI3)
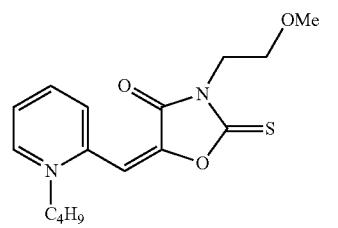
(VI4)
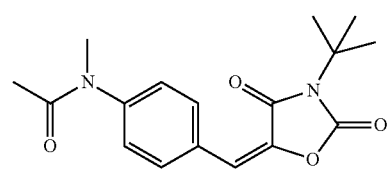
(VI5)
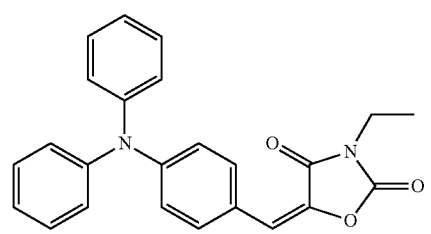
(VI6)
(VI7)
(VI8)
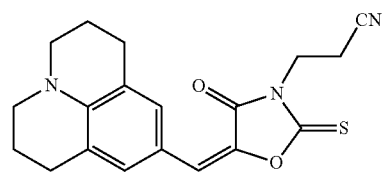
(VI9)
(VI10)
(VI11)
(VI12)
(VI13)
(VI14)
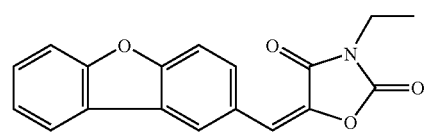
(VI15)
(VI16)
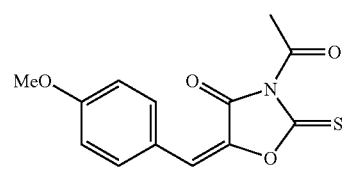

-continued
(VI17)
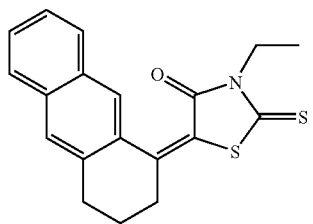
(VI18)
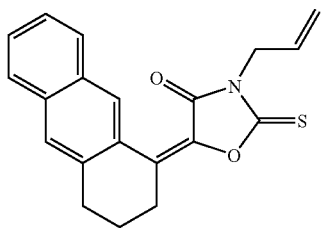
(VI19)
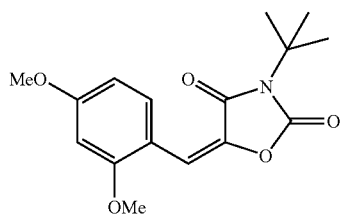
(VI20)
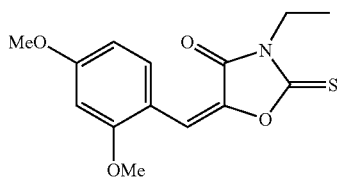
(VI21)
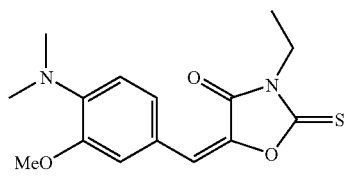
(VI22)
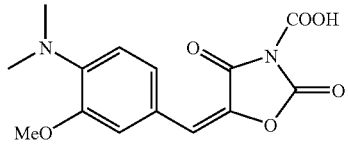
(VI23)
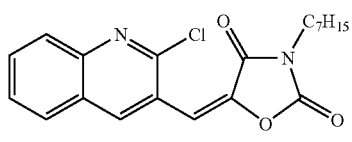
(VI24)
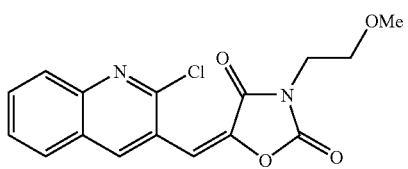
(VI25)
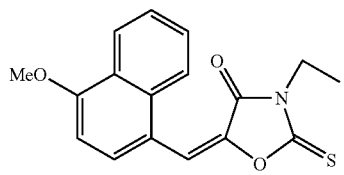
(VI26)
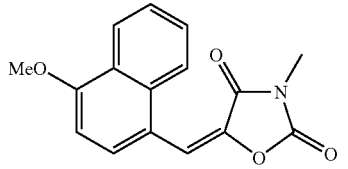
(VI27)
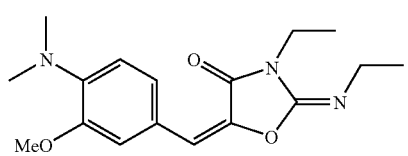
(VI28)
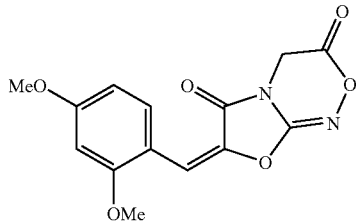
(VI29)
(VI30)
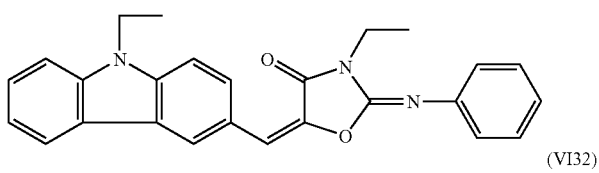
(VI31)
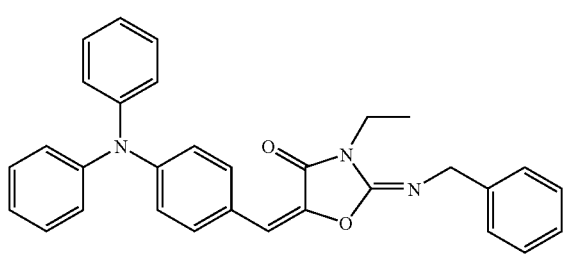
(VI32)
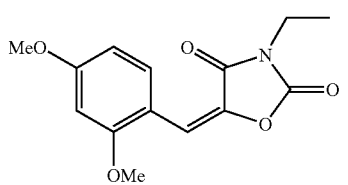

(VI33)
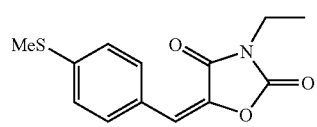
(VI35)
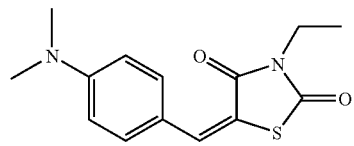
(VI37)
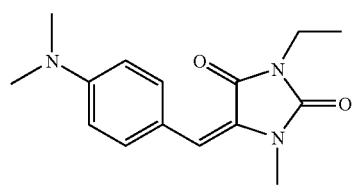
(VI39)
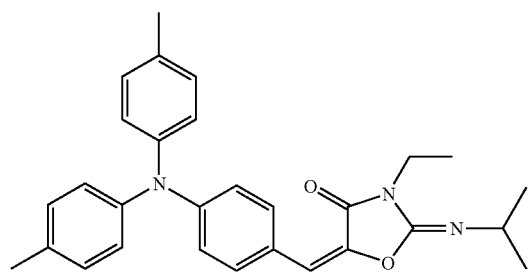
(VI41)
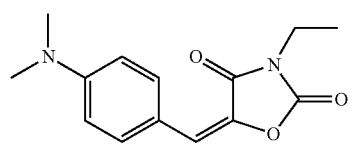
(VI43)
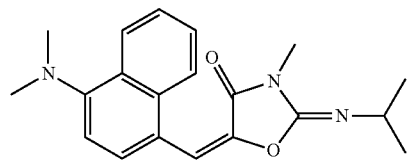
(VI45)
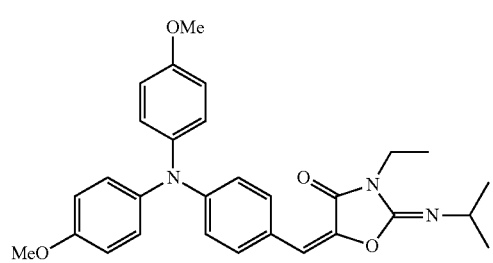
-continued
(VI34)
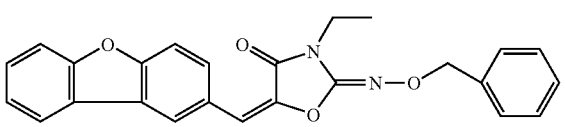
(VI36)
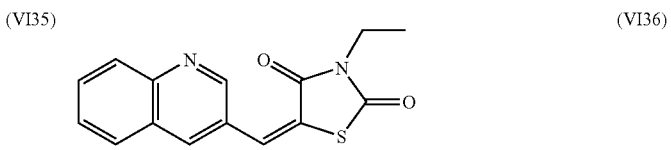
(VI38)
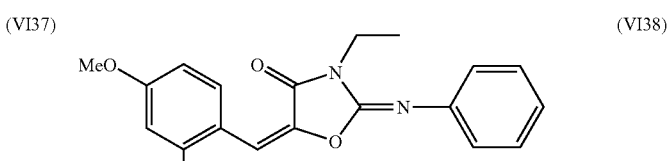
(VI40)
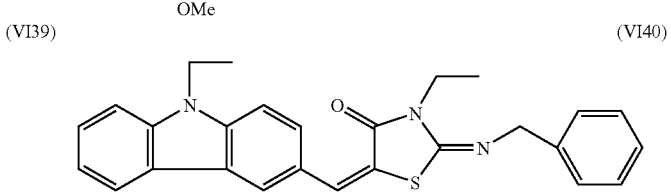
(VI42)
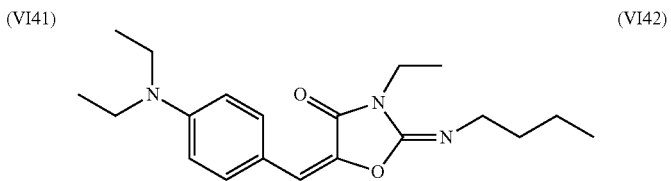
(VI44)
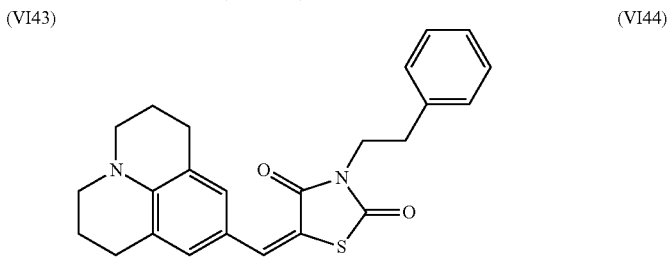
(VI46)
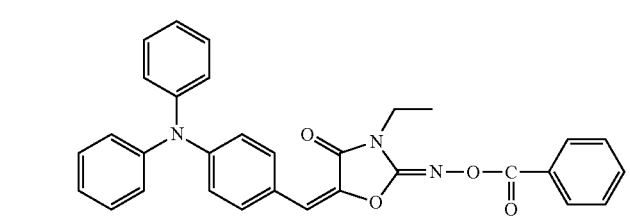

(VI47)
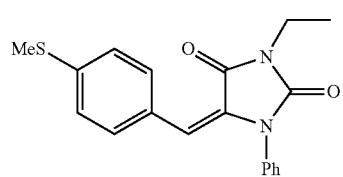
(VI48)
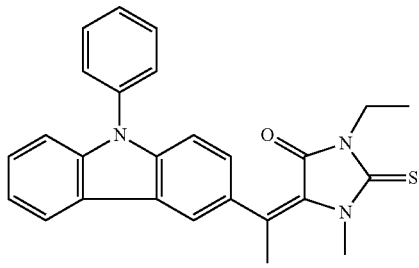
(VI49)
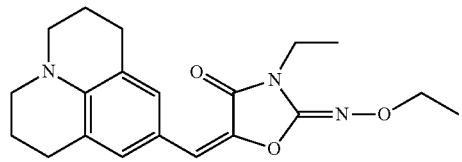
(VI50)
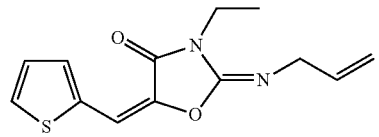
(VI51)
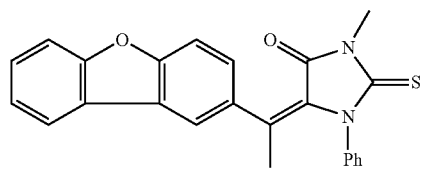
(VI52)
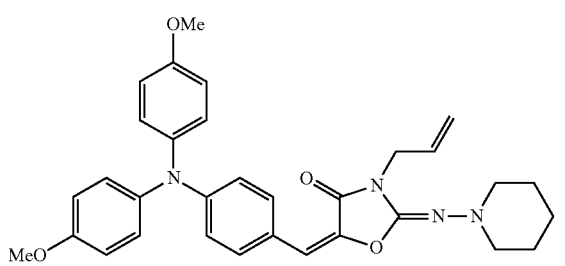
(VI53)
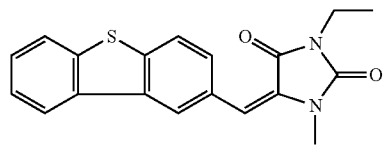
(VI54)
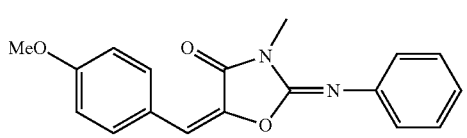
(VI55)
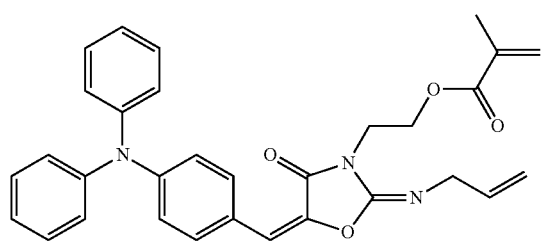

-continued
(VI59)
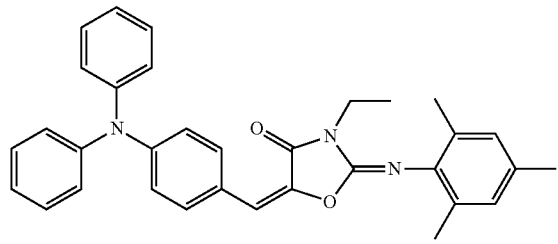
(VI60)
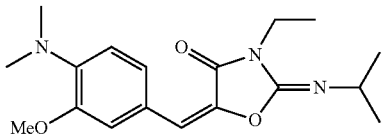
(VI61)
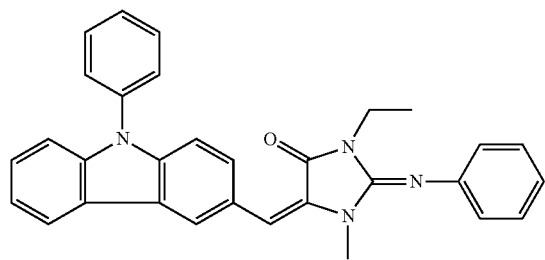
(VI62)
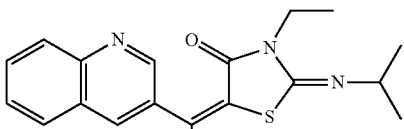
(VI63)
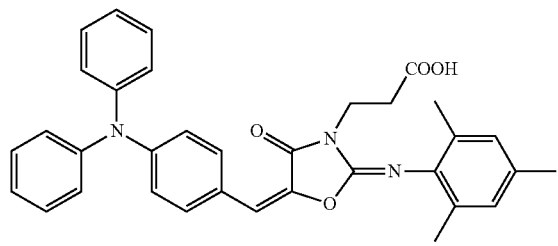
(VI64)
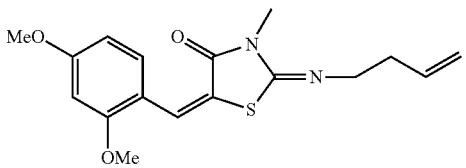
(VI65)
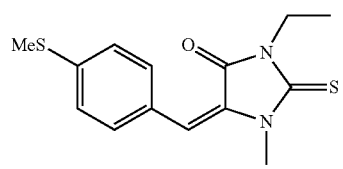
(VI66)
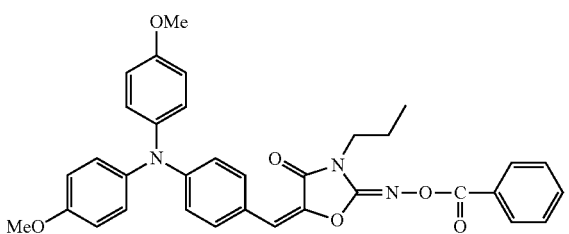
(VI67)
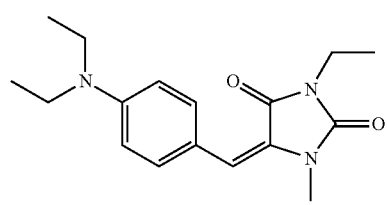
(VI68)
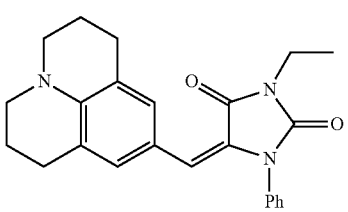
(VI69)
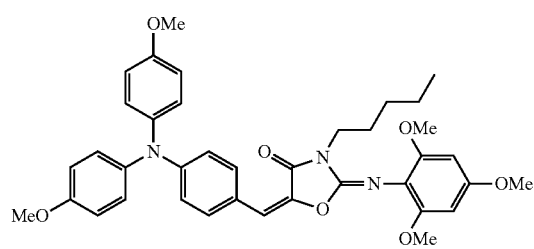
(VI70)
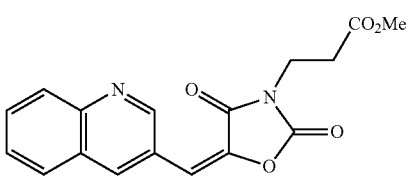

-continued
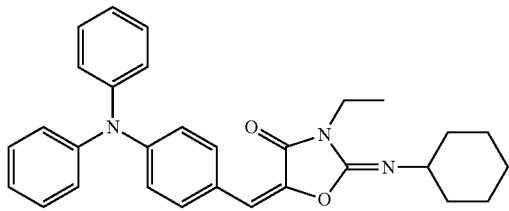
(VI71)
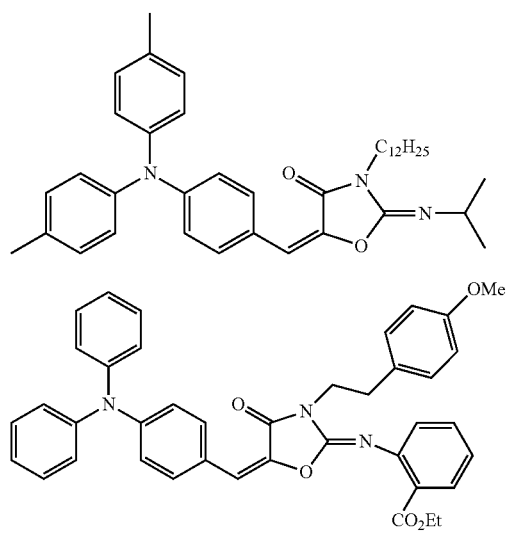
(VI73)
(VI72)
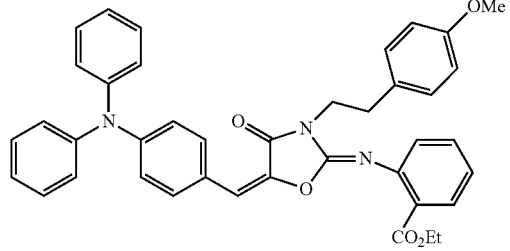
(VI74)
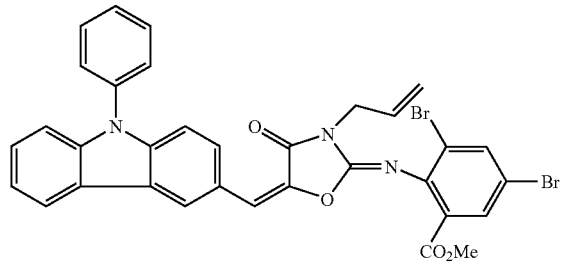
(VI75) (VI76)
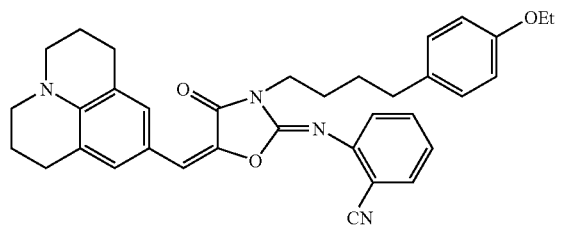
(VI77) (VI78)
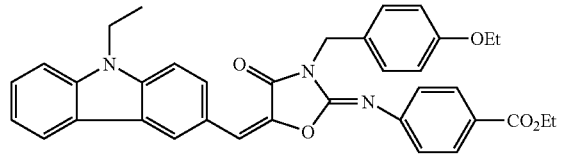
(VI79) (VI80)
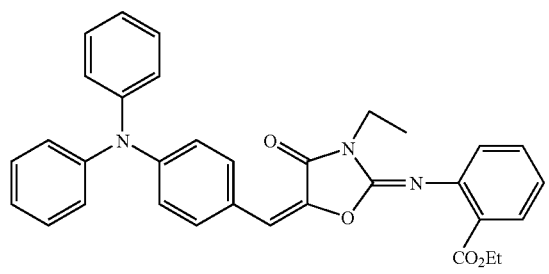
(VI81)
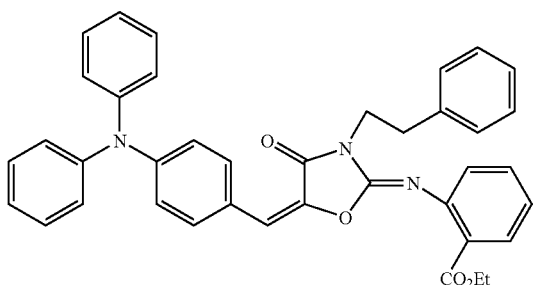
(VI82)

-continued
(VI83)
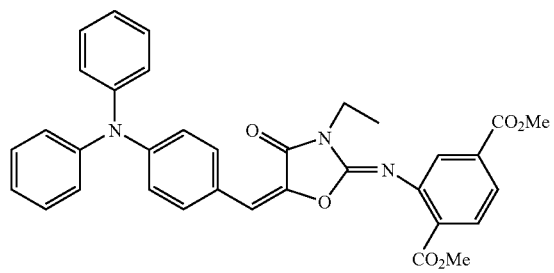
(VI84)
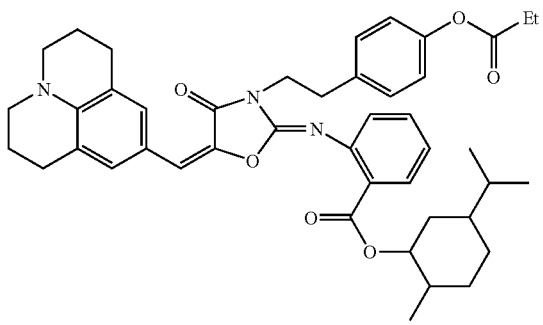
(VI85)
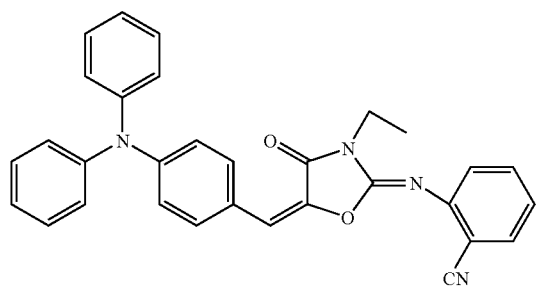
(VI86)
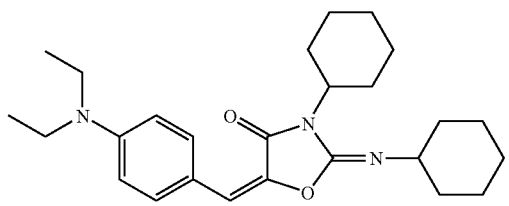
(VI87)
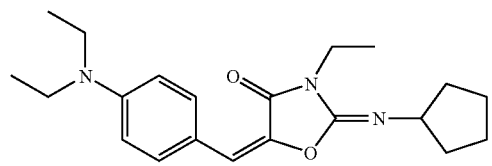
(VI88)
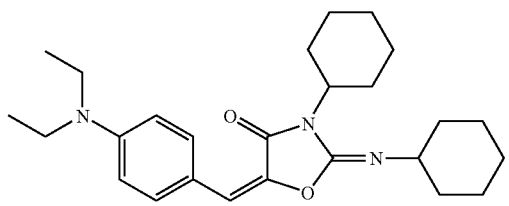
(VI89)
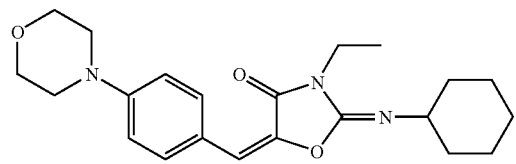
(VI90)
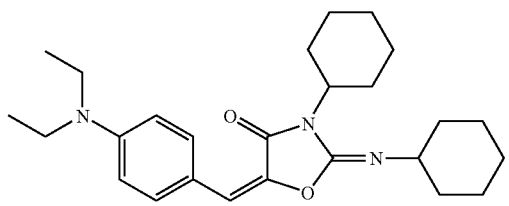
(VI91)
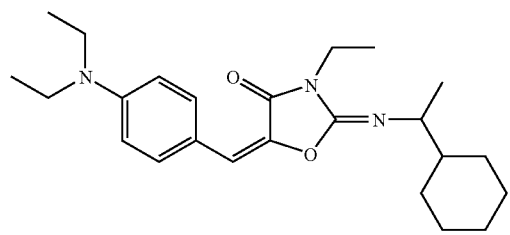
(VI92)
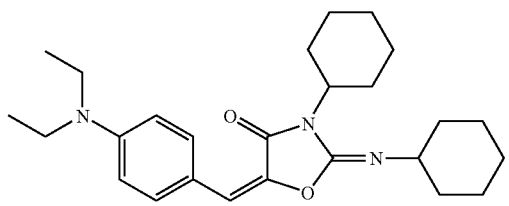
(VI93)
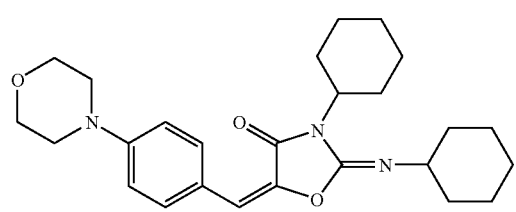
(VI94)
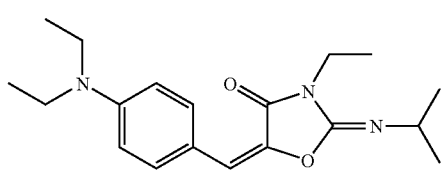

-continued
(VI95)
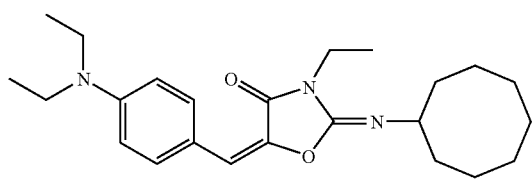
(VI96)
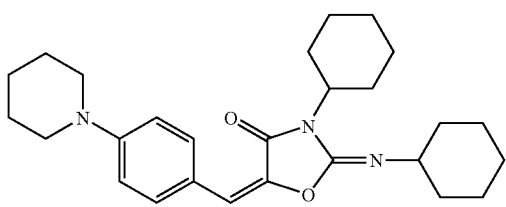
(VI97)
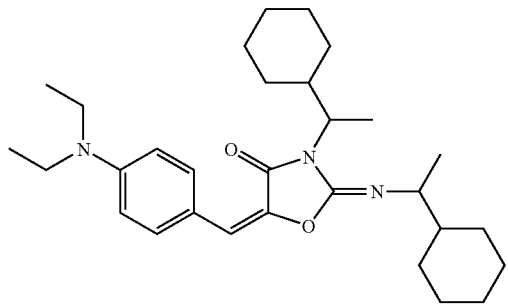
(VI98)
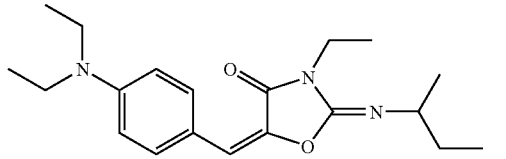
(VI99)
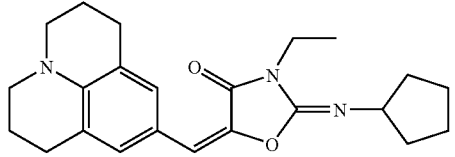
(VI100)
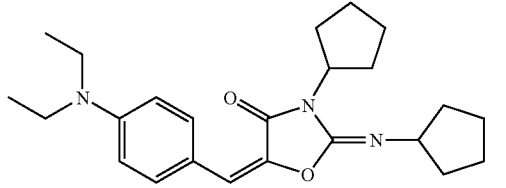
(VI101)
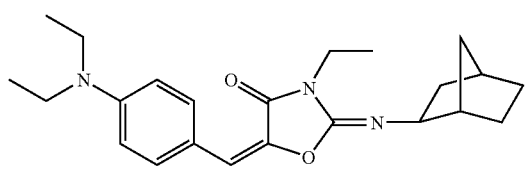
(VI102)
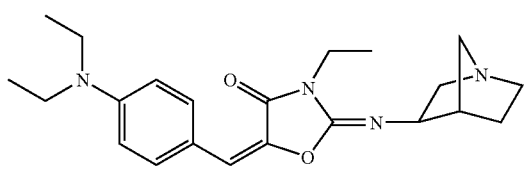
(VI103)
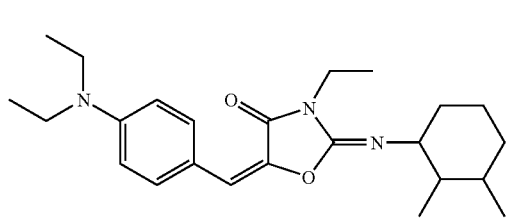
(VI104)
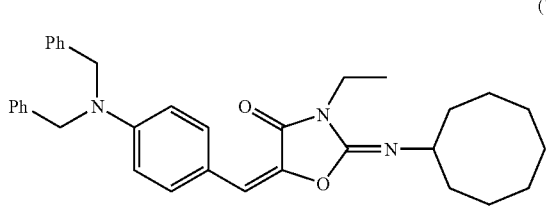
(VI105)
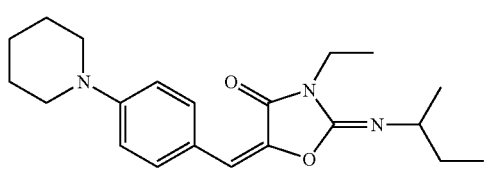
(VI106)
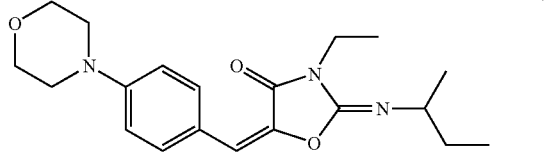
(VI107)
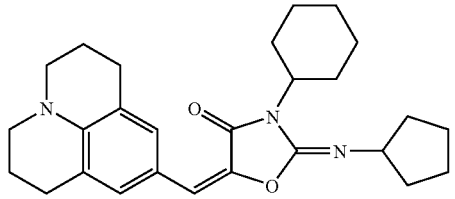
(VI108)
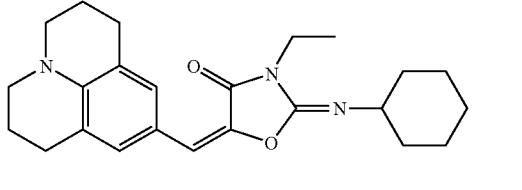

-continued
(VI109)
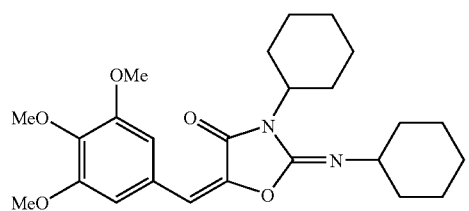
(VI110)
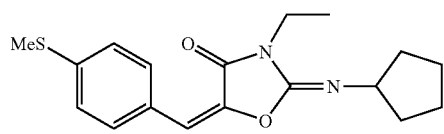
(VI111)
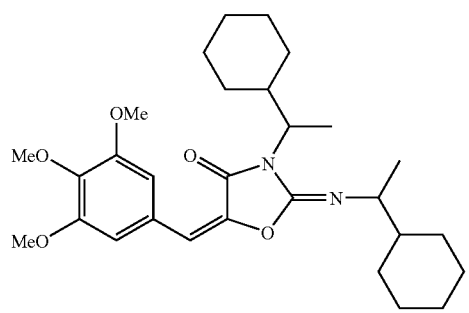
(VI112)
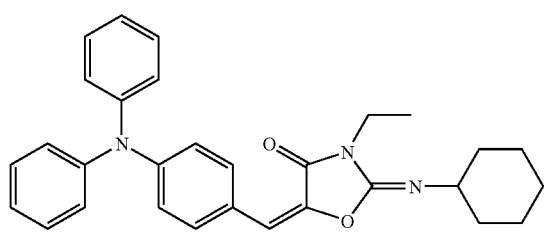
(VI113)
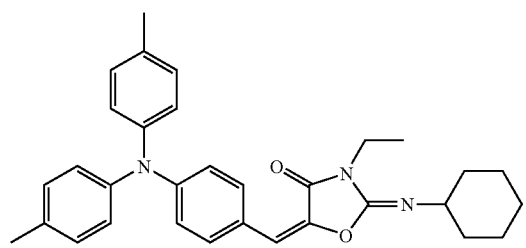
(VI114)
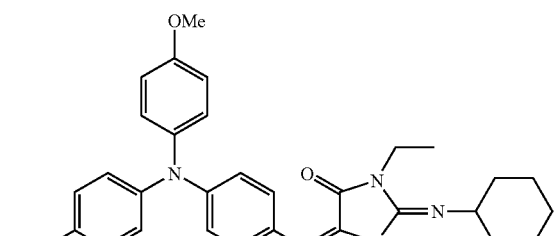
(VI115)
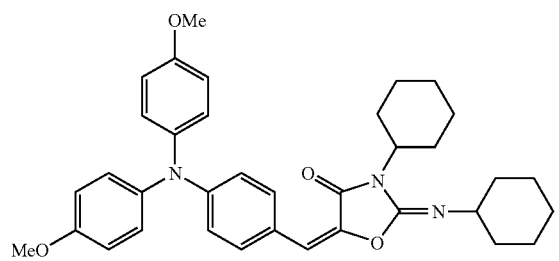
(VI116)
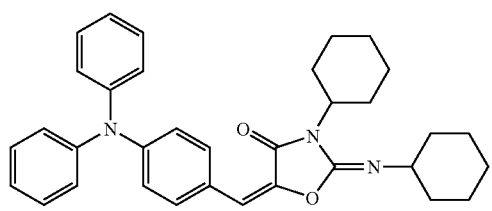
(VI117)
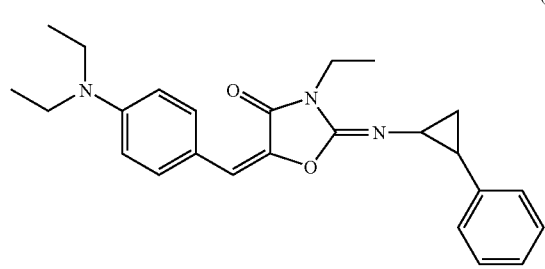
(VI118)
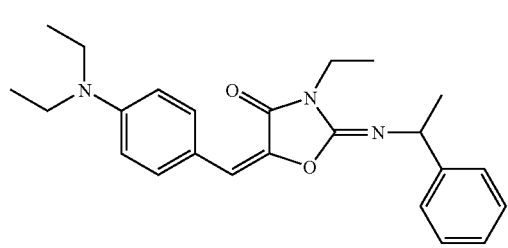
(VI119)
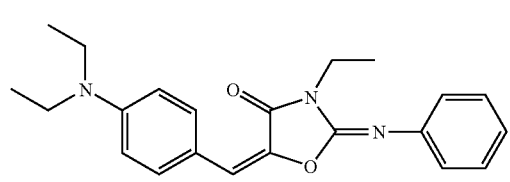
(VI120)
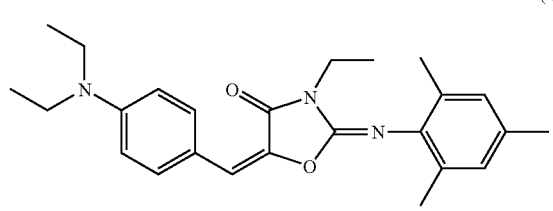

(VI121)

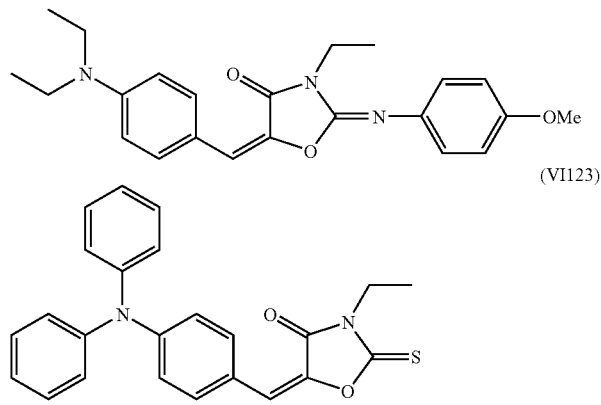

(VI122)

(VI123)

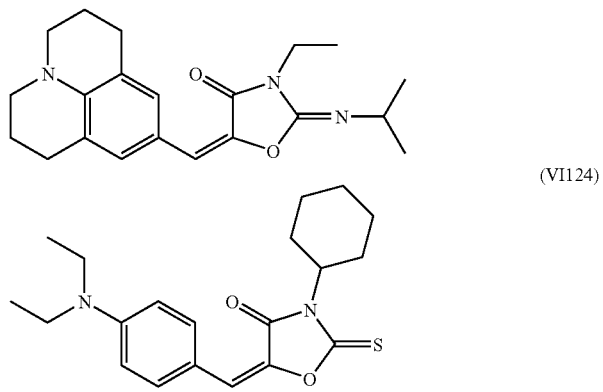

(VI124)

The sensitizing dye according to the invention may also be subjected to various chemical modifications for further ameliorating the properties of the curable composition.

For example, when a sensitizing dye is coupled with an addition polymerizable compound structure (for example, an acryloyl group or a methacryloyl group) by a method such as covalent bonding, ionic bonding or hydrogen bonding, strength increment for the exposed film, or inhibition of unnecessary precipitation of the sensitizing dye from the film after exposure may be carried out.

Furthermore, when the sensitizing dye is coupled with a partial structure which is capable of inducing radical generation in the photopolymerization initiator (for example, a reductively decomposable site such as halogenated alkyl, onium, peroxide or biimidazole, or an oxidatively cleavable site such as borate, amine, trimethylsilylmethyl, carboxymethyl, carbonyl or imine), photosensitivity may be significantly increased, particularly in the case where the concentration of the initiator is low.

The compounds represented by the above-described formulae (IV) to (VI) markedly exhibit their effect when added in the case where the concentration of pigment is very high in the curable composition, and the light transmittance of the colored pattern (photosensitive layer) to be formed is extremely low, for example, in the case where the light transmittance of the photosensitive layer at 365 nm is 10% or less when the curable composition of the invention is used in the formation of a colored pattern in a color filter, more specifically, when the colored pattern is formed without adding a sensitizing dye. Particularly in the formulae (IV) to (VI), the compound represented by the formula (VI) is most preferred, and specifically, the compounds of (VI56) to (VI122) are most preferred.

The sensitizing agent may be used individually as one species, or may be used in combination of two or more species.

The content of the (G) sensitizing agent in the curable composition of the invention is preferably from 0.1 to 20% by mass, and more preferably from 0.5 to 15% by mass, based on the total solids of the curable composition, from the viewpoints of the light absorption efficiency and initiation decomposition efficiency at deeper parts, as well as in the case of using the sensitizing agent in the formation of colored patterns in color filters.

(H) Binder Polymer

The curable composition according to the first aspect of the invention may include a binder polymer, in addition to the (A-1) polymer compound having a structural unit represented by any one of the formulae (1) to (3), for the purpose of improving the film properties and the like. Also, the pigment-dispersed composition according to the second aspect of the invention may include a binder polymer, in addition to the (D) resin having an acid number of 100 mg KOH/g or more, and the (A-2) dispersion resin having an acid number of less than 100 mg KOH/g and an unsaturated equivalent of less than 600.

As the binder polymer, it is preferable to use a linear organic polymer. As such "linear organic polymer", any known polymer may be used. Additionally, for example, in the case of applying the curable composition of the invention to the use of forming a pattern through pattern exposure and curing of the exposed parts, followed by removal of the unexposed parts by means of water or alkali development, a linear organic polymer which is soluble or swellable in water or in weak alkali water is selected, preferably in order to enable development with water or development with weak alkali water. The linear organic polymer is selected and used, not only as a film forming agent, but also in accordance with the type of the developer such as water, weak alkali water or organic solvent. For example, when a water-soluble organic polymer is used, development with water is made possible. Such linear organic polymers may include radical polymers having a carboxylic acid group in the side chain, for example, those described in JP-A No. 59-44615, JP-B Nos. 54-34327, 58-12577 and 54-25957, JP-A Nos. 54-92723, 59-53836 and 59-71048. That is, the linear organic polymers may include a resin obtained by homopolymerizing or copolymerizing a monomer having a carboxyl group; a resin obtained by homopolymerizing or copolymerizing a monomer having an acid anhydride, and subjecting the acid anhydride unit to hydrolysis, semi-esterification or semi-amidation; an epoxy acrylate obtained by modifying an epoxy resin with an unsaturated monocarboxylic acid and an acid anhydride; and the like. The monomers having a carboxyl group include acrylic acid, methacrylic acid, itaconic acid, crotonic acid, maleic acid, fumaric acid, 4-carboxylstyrene and the like, while the monomers having an acid anhydride include maleic anhydride and the like.

Likewise, acidic cellulose derivatives having a carboxylic acid group in the side chain may also be used. In addition to these, a product obtained by adding a cyclic acid anhydride to a polymer having a hydroxyl group, and the like are useful.

As described above, when the radical polymer having a carboxylic acid group in the side chain is a copolymer, monomers other than the previously mentioned monomers may also be used as the compound to be copolymerized. Examples of the other monomers include the compounds of the following (1) to (12):

(1) Acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutylacrylate, 2-hydroxyethyl methacrylate, 2-hydroxypropyl methacrylate, 3-hydroxypropyl methacrylate and 4-hydroxybutyl methacrylate;

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-aryloxyethyl acrylate and propargyl acrylate;

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-aryloxyethyl methacrylate and propargyl methacrylate;

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide;

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) Vinyl esters such as vinyl acetate, vinyl chloroacetate, vinyl butyrate and vinyl benzoate;

(7) Styrenes such as styrene, α-methylstyrene, methylstyrene, chloromethylstyrene and p-acetoxystyrene;

(8) Vinyl ketones such as methyl vinyl ketone, ethyl vinyl ketone, propyl vinyl ketone and phenyl vinyl ketone;

(9) Olefins such as ethylene, propylene, isobutylene, butadiene and isoprene;

(10) N-vinylpyrrolidone, acrylonitrile, methacrylonitrile, etc;

(11) Unsaturated imides such as maleimide, N-acryloyl acrylamide, N-acetyl methacrylamide, N-propionyl methacrylamide and N-(p-chlorobenzoyl)methacrylamide;

(12) Methacrylate-based monomers in which a heteroatom is bound at the α-position, for example, the compounds described in Japanese Patent Application Nos. 2001-115595 and 2001-115598, and the like.

Among these, (meth)acrylic resins having an allyl group or a vinyl ester group and a carboxyl group in the side chain, and alkali-soluble resins having a double bond in the side chain as described in JP-A Nos. 2000-187322 and 2002-62698, or alkali-soluble resins having an amide group in the side chain as described in JP-A No. 2001-242612, are excellently balanced in the film strength, sensitivity and development performance, and are thus suitable.

Furthermore, the urethane-based binder polymers containing an acid group as described in JP-B Nos. 7-12004, 7-120041, 7-120042 and 8-12424, JP-A Nos. 63-287944, 63-287947 and 1-271741, Japanese Patent Application No. 10-116232 and the like, or the urethane-based binder polymers having an acid group and a double bond in the side chain as described in JP-A No. 2002-107918, are excellent in the strength, and thus are advantageous in terms of suitability for low exposure.

The acetal-modified polyvinyl alcohol-based binder polymers having an acid group as described in EP No. 993966, EP No. 1204000, JP-A No. 2001-318463 and the like, are excellently balanced in the film strength and development performance, and are thus suitable.

In addition to these, polyvinyl pyrrolidone, polyethylene oxide and the like are also useful as the water-soluble linear organic polymer. In view of increasing the strength of the cured layer, alcohol-soluble nylon, polyether of 2,2-bis-(4-hydroxyphenyl)-propane and epichlorohydrin, and the like are also useful.

The weight-average molecular weight of the binder polymer (H) is preferably 5,000 or more, and more preferably in the range of 10,000 to 300,000, while the number-average molecular weight is preferably 1,000 or more, and more preferably in the range of 2,000 to 250,000. The polydispersity (weight-average molecular weight/number-average molecular weight) is preferably 1 or more, and more preferably in the range of 1.1 to 10.

These resins may be any of random polymers, block polymers, graft polymers and the like.

The binder polymer (H) may be synthesized according to conventionally known methods. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethylacetamide, toluene, ethyl acetate, methyl lactate, ethyl lactate, dimethylsulfoxide, 1-methyl-2-pyrrolidone, water and the like. These solvents are used individually or as a mixture of two or more species.

The radical polymerization initiator used in synthesizing the binder polymer that may be used for the invention may include known compounds such as azo-based initiators and peroxide initiators.

The content of the binder polymer (H) in the curable composition, in the case where the curable composition of the invention is used in the formation of colored patterns in color filters, is preferably from 5 to 60% by mass, more preferably from 7 to 50% by mass, and most preferably from 10 to 40% by mass, based on the total solids in the curable composition.

With regard to the first aspect, when the (A-1) polymer compound having a structural unit represented by any one of the formulae (1) to (3) (the dispersion resin according to the first aspect of the invention), and (H) a binder polymer other than the (A-1) dispersion resin according to the first aspect of the invention are used in combination, the content ratio [(A-1)/(H); mass ratio] is preferably 100/1 to 1/10, more preferably 50/1 to 1/5, and even more preferably 20/1 to 1/1, from the viewpoints of stability over time and development performance.

With regard to the second aspect, when the (D) resin of high acid number according to the invention and the (A-2) dispersion resin according to the second aspect of the invention, and (H) a binder polymer other than the (D) and (A-2) are used in combination, the content ratio [((D)+(A-2))/(H); mass ratio] is preferably 100/1 to 1/10, more preferably 50/1 to 1/5, and even more preferably 20/1 to 1/1, from the viewpoints of stability over time and development performance.

(1) Dispersant

In the curable composition of the invention, it is preferable to add a dispersant, in addition to the above-described components, from the viewpoint of further enhancing the dispersibility of the (B) pigment.

Examples of the dispersant (pigment dispersant) which can be used in the invention include polymer dispersants [e.g. polyamidoamine and a salt thereof, polycarboxylic acid and a salt thereof, high-molecular unsaturated acid ester, modified polyurethane, modified polyester, modified poly(meth)acrylate, (meth)acryl-based copolymer, naphthalenesulfonic acid formalin condensate], polyoxyethylene alkyl phosphate ester, polyoxyethylenealkylamine, alkanolamine, and a pigment derivative.

The polymer dispersant can be further classified into a straight polymer, a terminal-modified polymer, a graft polymer, and a block polymer depending on a structure thereof.

The polymer dispersant is adsorbed on a surface of the pigment, and acts so as to prevent re-aggregation. For this reason, examples of a preferable structure include a terminal-modified polymer, a graft polymer and a block polymer, which have an anchoring site for a pigment surface. On the other hand, the pigment derivative has the effect of promoting adsorption of the polymer dispersant by modifying a pigment surface.

Examples of pigment dispersant include "Disperbyk-101 (polyamidoamine phosphate), 107 (carboxylic acid ester), 110 (copolymer containing acid group), 130 (polyamide), 161, 162, 163, 164, 165, 166, 170 (high-molecular copolymer)" manufactured by BYK Chemie, "BYK-P104, P105 (high-molecular unsaturated polycarboxylic acid), BYK2001", "EFKA4047, 4050, 4010, 4165 (polyurethane-based), EFKA4330, 4340 (block copolymer), 4400, 4402 (modified polyacrylate), 5010 (polyester amide), 5765 (high-molecular-weight polycarboxylic acid salt), 6220 (fatty acid polyester), 6745 (phthalocyanine derivative), 6750 (azo pigment derivative)" manufactured by EFKA, "Ajispur PB821, PB822" manufactured by Ajinomoto Fine Techno Co., Inc., "Flowlen TG-710 (urethane oligomer)" manufactured by Kyoeisha Chemical Co., Ltd., "Polyflow No. 50E, No. 300 (acryl-based copolymer)", "Disperon KS-860, 873SN, 874, #2150 (aliphatic polyvalent carboxylic acid), #7004 (polyetherester), DA-703-50, DA-705, DA-725" manufactured by Kusumoto Chemicals Ltd., "Demol RN, N (naphthalenesulfonic acid formalin polycondensate), MS, C, SN-B (aromatic sulfonic acid formalin polycondensate)" manufactured by Kao Corporation, "Homogenol L-18 (high-molecular polycarboxylic acid)", "Emulgen 920, 930, 935, 985, (polyoxyethylene nonyl phenyl ether)", "Acetamine 86 (stearylamine acetate)", "Solsperse 5000 (phthalocyanine derivative), 22000 (azo pigment derivative)" manufactured by The Lubrizol Corporation, 13240 (polyesteramine), 3000, 17000, 27000 (polymer having functional site on terminal part), 24000, 28000, 32000, 38500 (graft polymer)", "Nikkol T106 (polyoxyethylene sorbitan monooleate), MYS-IEX (polyoxyethylene monostearate)" manufactured by Nikko Chemicals Co., Ltd.

These dispersants may be used alone, or may be used by combining two or more kinds in the invention, particularly, it is preferable that the pigment derivative and the polymer dispersant are used by combining them.

A content of Dispersant (I) in the invention is preferably 1% by mass to 100% by mass, more preferably 3% by mass to 100% by mass, further preferably 5% by mass to 80% by mass, based on the pigment.

Specifically, when the polymer dispersant is used, its use amount is preferably in a range of 5% by mass to 100% by mass, more preferably, in a range of 10% by mass to 80% by mass relative to the pigment. In addition, when the pigment derivative is used, its use amount is preferably in a range of 1% by mass to 30% by mass, more preferably in a range of 3% by mass to 20% by mass, particularly preferably in the range of 5% by mass to 15% by mass relative to the pigment.

In the invention, when the pigment and the dispersant are used, from a viewpoint of a curing sensitivity and a color concentration, a total of contents of the pigment and the dispersant is preferably 35% by mass or more and 90% by mass or less, more preferably 45% by mass or more and 85% by mass or less, further preferably 50% by mass or more and 80% by mass or less relative to a total solid content constituting the curable composition.

(J) Co-Sensitizer

The curable composition of the invention preferably includes (J) a co-sensitizer. According to the invention, the co-sensitizer has effects such as further enhancing the sensitivity of the (G) sensitizing agent (sensitizing dye) or the (E) phopopolymerization initiator to actinic radiation, or suppressing the inhibition of the polymerization of polymerizable compounds by oxygen.

Examples of such co-sensitizer include amines, for example, the compounds described in M. R. Sander et al., "Journal of Polymer Society" Vol. 10, p. 3173 (1972), JP-B No. 44-20189, JP-A Nos. 51-82102, 52-134692, 59-138205, 60-84305, 62-18537 and 64-33104, and Research Disclosure No. 33825. Specific examples thereof include triethanolamine, p-dimethylaminobenzoic acid ethyl ester, p-formyldimethylaniline, p-methylthiodimethylaniline, and the like.

Other examples of the co-sensitizer include thiols and sulfides, for example, the thiol compounds described in JP-A No. 53-702, JP-B No. 55-500806, and JP-A No. 5-142772, the disulfide compounds described in JP-A No. 56-75643, and the like. Specific examples thereof include 2-mercaptobenzothiazole, 2-mercaptobenzooxazole, 2-mercaptobenzoimidazole, 2-mercapto-4(3H)-quinazoline, β-mercaptonaphthalene, and the like.

Further examples of the co-sensitizer include amino acid compounds (for example, N-phenylglycine, etc.), the organometallic compounds described in JP-B No. 48-42965 (for example, tributyltin acetate, etc.), the hydrogen donors described in JP-B No. 55-34414, the sulfur compounds described in JP-A No. 6-308727 (for example, trithiane, etc.), and the like.

The content of the co-sensitizer (J) is preferably in the range of 0.1 to 30% by mass, more preferably in the range of 0.5 to 25% by mass, and even more preferably in the range of 1.0 to 20% by mass, based on the total mass of solids in the curable composition, from the viewpoint of enhancing the curing rate by the balance between the polymer growth rate and the chain transfer.

(K) Polymerization Inhibitor

According to the invention, it is preferable to add during the production or storage of the curable composition, a small amount of a thermal polymerization preventing agent as the Polymerization inhibitor (K), so as to inhibit unnecessary thermal polymerization of compounds having an ethylenic unsaturated double bond in the molecule, such as the (A-1) polymer compound having a structural unit represented by any one of formulae (1) to (3) or the (F) photopolymerizable compound according to the first aspect of the invention, or such as the (D) resin of high acid number, the (A-2) dispersion resin, or the photopolymerizable compound (F) according to the second aspect of the invention.

Examples of the thermal polymerization preventing agent include hydroquinone, p-methoxyphenol, di-t-butyl-p-cresol, pyrogalol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium(I) salt, and the like.

The amount of addition of the Polymerization inhibitor (K) is preferably from about 0.01 to about 5% by mass based on the mass of the curable composition.

Furthermore, if necessary, a higher fatty acid derivative such as behenic acid or behenic acid amide may be added to prevent the inhibition of polymerization by oxygen, and may be localized at the surface during the course until the drying of the curable composition of the invention. The amount of addition of the higher fatty acid derivative is preferably from about 0.5 to about 10% by mass based on the mass of the curable composition.

[Other Components]

In addition, the curable composition of the invention may include fillers, plasticizers, polymer compounds other than the above-described components, surfactants, antioxidants, ultraviolet absorbers, antiflocculants, and the like for improving the properties of a cured layer.

More specifically, there may be mentioned fillers such as glass and alumina; plasticizers such as dioctyl phthalate, didodecyl phthalate, triethylene glycol dicaprylate, dimethyl glycol phthalate, tricresyl phosphate, dioctyl adipate, dibutyl sebacate and triacetyl glycerin; polymer compounds such as polyvinyl alcohol, polyacrylic acid, polyethylene glycol monoalkyl ether and polyfluoroalkyl acrylate; nonionic, cationic and anionic surfactants; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; and antiflocculants such as sodium polyacrylate.

In the case of applying the curable composition of the invention onto the surface of a hard material such as a support, an additive to enhance the contact characteristics with the hard material surface (hereinafter, referred to as "support adherence agent") may be added.

As the support adherence agent, known materials may be used. Particularly, it is preferable to use silane-based coupling agents, titanate-based coupling agents or aluminum-based coupling agents.

Examples of the silane-based coupling agents include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysi lane, γ-isocyanatopropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, and the like.

Among them, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferred, and γ-methacryloxypropyltrimethoxysi lane is most preferred.

Examples of the titanate-based coupling agents include isopropyltriisostearoyl titanate, isopropyltridecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl)bis(ditridecyl)phosphite titanate, bis(dioctylpyrophosphate) oxyacetate titanate, bis(dioctylpyrophosphate)ethylene titanate, isopropyltrioctanoyl titanate, isopropyldimethacrylisostearoyl titanate, isopropyl isostearoyldiacryl titanate, triisopropyltri(dioctylphosphate) titanate, isopropyltricumylphenyl titanate, isopropyltri(N-amidoethyl•aminoethyl) titanate, dicumylphenyloxyacetate titanate, diisostearoylethylene titanate, and the like.

Examples of the aluminum-based coupling agents include acetoalkoxyaluminum diisopropylate and the like.

The content of the support adherence agent is preferably from 0.1 to 30% by mass, more preferably from 0.5 to 20% by mass, and particularly preferably from 1 to 10% by mass, based on the total solids in the curable composition of the invention, in view of preventing any scum of the curable composition from remaining in uncured regions.

Furthermore, in the case of applying the curable composition of the invention to an application of forming a pattern, after exposing the pattern and curing the exposed parts, by removing the unexposed parts through development with water or an alkali, an organic carboxylic acid, preferably a low molecular weight organic carboxylic acid having a molecular weight of 1000 or less, may be added to the curable composition so as to promote the alkali-solubility and further improve the development performance.

Specific examples thereof include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cumic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

Preparation of the curable composition according to the first aspect of the invention preferably includes combining a polymer compound (A-1) having a structural unit represented by any one of formulae (1) to (3) (the dispersion resin according to the first aspect of the invention), a pigment (B), (E) a photopolymerizable initiator and if necessary, other components such as (I) a dispersant, with the a solvent (C), and mixing and dispersing the mixture using various mixers and dispersing apparatuses (mixing and dispersing process). That is, it is preferable to prepare the curable composition of the invention by preparing a pigment dispersion (the pigment-dispersed composition according to the first aspect of the invention) in advance, and mixing this pigment dispersion with the remaining components, in the mixing and dispersing processes.

preparation of the curable composition according to the second aspect of the invention preferably includes combining a resin (D) having an acid number of 100 mg KOH/g or more, a dispersion resin (A-2) having an acid number of less than 100 mg KOH/g and an unsaturation equivalent of less than 600, a pigment (B), a photopolymerization initiator (E), and if necessary, other components such as (I) a dispersant, with a solvent (C), and mixing and dispersing the mixture using various mixers and dispersing apparatuses (mixing and dispersing process). That is, it is preferable to prepare the curable composition of the invention by preparing a pigment dispersion (the pigment-dispersed composition according to the second aspect of the invention) in advance, and mixing this pigment dispersion with the remaining components, in the mixing and dispersing processes.

In addition, the mixing and dispersing process preferably includes kneading dispersion and a fine-dispersion treatment performed subsequently thereto, however the kneading dispersion may be omitted.

<Color Filter and Production Method Thereof>

Next, the color filter of the invention and a production method thereof will be described.

The color filter of the invention is characterized in having a colored pattern formed from the curable composition of the invention, on a support.

Hereinafter, the color filter of the invention will be illustrated in detail with reference to the production method thereof (the method of producing the color filter of the invention).

The method of producing the color filter of the invention is characterized in having coating the curable composition of the invention on a support to form a colored layer formed from the curable composition (hereinafter, this process may be referred to as "colored layer forming process"), exposing the colored layer formed imagewise through a patterned mask (hereinafter, this process may be referred to as "exposure process"), and developing the colored layer after the exposure to form a colored pattern (hereinafter, this process may be referred to as "developing process").

Hereinafter, the production method for a color filter of the invention will be described.

[Colored Layer Forming Process]

In the colored layer forming process, the curable composition of the invention is coated on a support to form a colored layer formed from the curable composition.

The support that may be used in the present process may include soda glass, Pyrex® glass, quartz glass, and products obtained by attaching transparent conductive films thereon, which are used in liquid crystal display elements; photoelectric conversion element substrates, for example, silicon substrate and the like, which are used in image pick-up elements; complementary metal oxide semiconductors (CMOS); and the like. These supports may have black stripes formed thereon, which separate individual pixels.

Furthermore, these supports may also be provided with, if necessary, undercoat layers to improve the contact characteristics with the colored layer, to prevent diffusion of material, or to render the surface smooth and flat.

As for the method of providing the curable composition of the invention on the support, various methods such as slit coating, ink-jetting, spin coating, flow casting, roll coating and screen printing may be applied.

The film thickness immediately after the provision (for example, coating) of the curable composition is preferably from 0.1 to 10 µm, more preferably from 0.2 to 5 µm, and even more preferably from 0.2 to 3 µm, from the viewpoints of the uniformity of film thickness and the ease of solvent drying.

Drying (pre-baking) of the colored layer (curable composition layer) provided on the support by coating or the like, may be performed using a hot plate, an oven or the like, at a temperature of 50° C. to 140° C. for 10 to 300 seconds.

The film thickness after drying the curable composition (hereinafter, appropriately referred to as "dried film thickness") is, for the use as a colored filter for LCD, preferably 0.1 µm or more and less than 2.0 µm, more preferably 0.2 µm or more and 1.8 µm or less, and particularly preferably 0.3 µm or more and 1.75 µm or less, in view of coping with the thickness reduction for LCD and securing the color density.

For the use as a color filter for IS, the dried film thickness is preferably 0.05 µm or more and less than 1.0 µm, more preferably 0.1 µm or more and 0.8 µm or less, and particularly preferably 0.2 µm or more and 0.7 µm or less, in view of securing the color density, and alleviating the inconvenience caused by that the light coming from oblique directions does not reach the photoreceiver and makes a significant difference in the light collecting efficiency between the corners and the central area of a device.

[Exposure Process]

In the exposure process, the colored layer (curable composition layer) formed in the above-described colored layer forming process is imagewise exposed through a mask having a predetermined mask pattern.

As for the radiation that may be used upon the exposure, particularly ultraviolet radiation such as g-ray or i-ray is preferably used. The irradiation dose is preferably from 5 to 1500 mJ/cm$^2$, more preferably from 10 to 1000 mJ/cm$^2$, and most preferably from 10 to 500 mJ/cm$^2$.

When the color filter of the invention is intended for the use in liquid crystal display elements, the irradiation dose is, within the above-described range, preferably from 5 to 200 mJ/cm$^2$, more preferably from 10 to 150 mJ/cm$^2$, and most preferably from 10 to 100 mJ/cm$^2$. Also, when the color filter of the invention is intended for the use in solid state image pick-up elements, the irradiation dose is, within the above-described range, preferably from 30 to 1500 mJ/cm$^2$, more preferably from 50 to 1000 mJ/cm$^2$, and most preferably from 80 to 500 mJ/cm$^2$.

[Developing Process]

Subsequently, when an alkali developing treatment (developing process) is carried out, the unexposed parts in the above-described exposure process are eluted with a developer solution, so that only the photocured parts are left behind.

The developer solution is preferably an organic alkali developer solution which does not cause any damage in the foundation circuit or the like. The developing temperature is usually 20° C. to 30° C., and the developing time is 20 to 90 seconds.

Examples of the alkali agent used in the developer solution include organic alkaline compounds such as aqueous ammonia, ethylamine, diethylamine, dimethylethanolamine, tetramethylammonium hydroxide, tetraethylammonium hydroxide, choline, pyrrole, piperidine and 1,8-diazabicyclo[5.4.0]-7-undecene; inorganic compounds such as sodium hydroxide, potassium hydroxide, sodium hydrogen carbonate and potassium hydrogen carbonate; and the like. As for the developer solution, an alkaline aqueous solution prepared by diluting one of these alkali agents with purified water to a concentration of 0.001% to 10% by mass, and preferably 0.01% to 1% by mass, is preferably used as the developer solution. In addition, when a developer solution formed from such an alkaline aqueous solution is used, the color filter is generally washed (rinsed) with purified water after the development.

Subsequently, excess developer solution is removed by washing, and the color filter is dried.

The production method of the invention may also include, after carrying out the above-described colored layer forming process, exposure process and developing process, if necessary, a curing process for curing the formed colored pattern by heating (post-baking) and/or exposure.

The post-baking is a heating treatment after development intended to complete the curing, and is usually performed by a thermal curing treatment at 100° C. to 240° C. If the support is a glass substrate or a silicon substrate, the temperature is, within the above-described temperature range, preferably 200° C. to 240° C.

This post-baking treatment may be performed continuously or batchwise, using a heating means such as a hot plate, a convection oven (hot air circulating drier) or a high frequency heater to provide conditions as described above.

A color filter having a desired color is produced by repeating the above-described colored layer forming process, exposure process and developing process (and the curing process, if necessary) for the number of desired colors (for example, three colors or four colors).

As described above, the use of the curable composition of the invention has been mainly described in terms of the use in the pixels of a color filter, but it is needless to say that the curable composition may also be applied to the black matrix that are disposed between the pixels of the color filter. The black matrix may be formed in the same manner as in the method of producing pixels, by performing pattern exposure, alkali development and then post-baking to accelerate the curing of the film, except that a black pigment such as carbon black or titanium black is added as the colorant to the curable composition of the invention.

Since the color filter of the invention uses the curable composition of the invention, a formed colored pattern has excellent contact characteristics with substrate, and in order for the uncured areas to be removed easily by a developer solution, a colored pattern of high resolution, which has good contact characteristics with substrate and has a desired shape of cross-section, is formed thereon. Therefore, the color filter may be suitably used in liquid crystal display elements or solid state image pick-up elements such as CCD. In particular, the color filter is suitable in CCD elements or CMOS of very high resolution, which may contain more than one million pixels.

The color filter of the invention may be used as, for example, a color filter which is disposed between the photo-receiver of each pixel and a microlens for collecting light, in a CCD.

EXAMPLES

While the invention is described in more detail, the invention is by no means limited to the following examples unless they are beyond the spirit of the invention. "Parts" and "%" are based on parts and % by mass unless otherwise stated.

In addition, the weight-average molecular weight was measured by gel permeation chromatography (GPC). GPC was performed using HLC-8120 GPC, SC-8020 (manufactured by Tosoh Corporation), two TSKgel, SuperHM-H (manufactured by Tosoh Corporation, 6.0 mm ID×15 cm) for the column, and THF (tetrahydrofuran) as the eluent. GPC was performed under the conditions such as a sample concentration of 0.5% by mass, a flow rate of 0.6 ml/min, an amount of sample injection of 10 μl, and a measuring temperature of 40° C., using an RI detector. The calibration curve was prepared using 10 samples of the "polystyrene standard sample TSK standard" manufactured by Tosoh Corporation: "A-500", "F-1", "F-10", "F-80", "F-380", "A-2500", "F-4", "F-40", "F-128" and "F-700".

First, examples according to the first aspect of the invention will be described in more detail.

Synthesis Example 1

-Synthesis of Dispersion Resin (I)-1-

120 g of propylene glycol monomethyl ether was placed in a 1000-ml three-necked flask, and was heated to 90° C. under a nitrogen stream. To this, 120 g of a propylene glycol monomethyl ether solution of 74 g of benzyl methacrylate, 84 g of methacrylic acid and 9.7 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 8 L (liter; the same in the following) of water to precipitate out a polymer compound. The precipitated polymer compound was collected by filtration, washed with water, and dried to obtain 150 g of the polymer compound.

The weight-average molecular weight of the obtained polymer compound was measured by gel permeation chromatography (GPC) using polystyrene as the standard material, and was found to be 12,000. The acid number of this polymer compound was determined by titration and was found to be 202 mg KOH/g (calculated value: 204 mg KOH/g). Since this value was close to the theoretical value calculated from the feed ratio of benzyl methacrylate and methacrylic acid, 204 mg KOH/g, it could be seen that the composition ratio of benzyl methacrylate and methacrylic acid incorporated to the polymer was nearly the same as the feed ratio, and it was confirmed that polymerization was conducted properly.

110 mg of p-methoxyphenol was added to 40 g of the polymer compound obtained as described above in a 1000-ml three-necked flask, and 60 g of propylene glycol monomethyl ether was further added and dissolved therein. To this, 820 mg of tetrabutylammonium bromide was further added, and the mixture was heated to 80° C. Then, 15 g of glycidyl methacrylate was added thereto, and the mixture was stirred for 6 hours. Then, it was confirmed by gas chromatography that the peak originating from glycidyl methacrylate disappeared. This reaction solution was subjected to 7 L of water to precipitate out a polymer compound (dispersion resin (I)-1). The precipitated polymer compound was collected by filtration, washed with water and dried, to obtain 54 g of the desired dispersion resin (I)-1.

The weight-average molecular weight of the obtained polymer compound (dispersion resin (I)-1) was measured by gel permeation chromatography using polystyrene as the standard material, and was found to be 18,100. The acid number of this polymer compound was also determined by titration, and was found to be 97.6 mg KOH/g (calculated value: 98.8 mg KOH/g). The unsaturation equivalent was arithmetically calculated to be 425.

| | Structure | Unsaturation equivalent | Weight average molecular weight |
|---|---|---|---|
| Dispersion resin (I)-1 | (structure shown below) | 425 | 18100 |

(structure of Dispersion resin (I)-1: terpolymer with glycerol dimethacrylate ester side chain (subscript 43), benzyl methacrylate unit (subscript 24), and methacrylic acid unit (subscript 33))

-Synthesis of Dispersion Resins (I)-2 to (I)-10-

Dispersion resins (I)-2 to (I)-10 exhibiting the properties in the following Table 1 were synthesized in the same manner as in the synthesis method for the dispersion resin (I)-1 described above, by adjusting the ratio of the monomers used and the amount of the initiator.

TABLE 1

| Resin | Unsaturation equivalent | Acid number (mg KOH/g) | Weight average molecular weight |
|---|---|---|---|
| (I)-1 | 425 | 97.6 | 18100 |
| (I)-2 | 420 | 98.8 | 7300 |
| (I)-3 | 425 | 97.5 | 49000 |
| (I)-4 | 315 | 98.3 | 19600 |
| (I)-5 | 528 | 96.3 | 19000 |
| (I)-6 | 430 | 50.2 | 18600 |
| (I)-7 | 435 | 148 | 18500 |
| (I)-8 | 440 | 30.1 | 19100 |
| (I)-9 | 625 | 97.1 | 18500 |
| (I)-10 | 2500 | 95.9 | 17900 |

Synthesis Example 2

-Synthesis of Resin (II)-1-

100 g of 1-methyl-2-pyrrolidone was placed in a 1000-ml three-necked flask, and was heated to 90° C. under a nitrogen stream. To this, 100 g of a 1-methyl-2-pyrrolidone solution of 84 g of the following compound (i-1), 33 g of benzyl methacrylate, 23 g of methacrylic acid and 5.2 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 7 L of water to precipitate out a polymer compound. The precipitated polymer compound was collected by filtration, washed with water, and dried to obtain 131 g of the polymer compound.

The weight-average molecular weight of the obtained polymer compound was measured by gel permeation chromatography using polystyrene as the standard material, and was found to be 12,800. The acid number of this polymer compound was also determined by titration, and was found to be 69.6 mg KOH/g (calculated value: 67.3 mg KOH/g). Thus, it was confirmed that the polymerization was conducted properly.

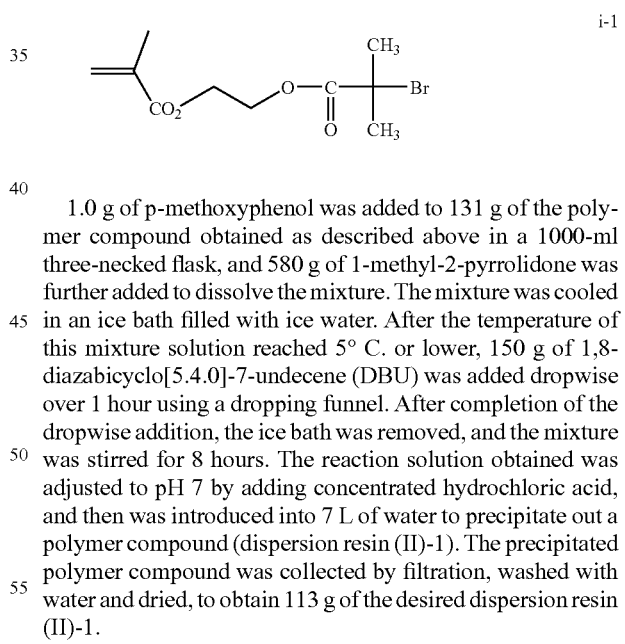

i-1

1.0 g of p-methoxyphenol was added to 131 g of the polymer compound obtained as described above in a 1000-ml three-necked flask, and 580 g of 1-methyl-2-pyrrolidone was further added to dissolve the mixture. The mixture was cooled in an ice bath filled with ice water. After the temperature of this mixture solution reached 5° C. or lower, 150 g of 1,8-diazabicyclo[5.4.0]-7-undecene (DBU) was added dropwise over 1 hour using a dropping funnel. After completion of the dropwise addition, the ice bath was removed, and the mixture was stirred for 8 hours. The reaction solution obtained was adjusted to pH 7 by adding concentrated hydrochloric acid, and then was introduced into 7 L of water to precipitate out a polymer compound (dispersion resin (II)-1). The precipitated polymer compound was collected by filtration, washed with water and dried, to obtain 113 g of the desired dispersion resin (II)-1.

The obtained polymer compound (dispersion resin (II)-1) was subjected to the measurement of $^1$H-NMR, and it was confirmed that 100% of the side chain group derived from the compound (i-1) was converted to an ethylene methacrylate group. Furthermore, the weight-average molecular weight was measured by gel permeation chromatography using polystyrene as the standard material, and was found to be 10,600. The acid number of this polymer compound was determined by titration, and was 84.7 meq/g (calculated value: 84.2 meq/g). The unsaturation equivalent was calculated to be 415.

| Structure | Unsaturation equivalent | Weight average molecular weight |
|---|---|---|
| Dispersion resin (II)-1 | 415 | 10600 |

-Synthesis of Dispersion Resin (II)-2 to (II)-10-

Dispersion resins (II)-2 to (II)-10 exhibiting the properties described in the following Table 2 were synthesized in the same manner as in the synthesis method for the dispersion resin (II)-1 described above, by adjusting the ratio of the monomers used and the amount of the initiator.

TABLE 2

| Resin | Unsaturation equivalent | Acid number (mg KOH/g) | Weight average molecular weight |
|---|---|---|---|
| (II)-1 | 415 | 84.7 | 10600 |
| (II)-2 | 435 | 85.3 | 5200 |
| (II)-3 | 420 | 82.3 | 25400 |
| (II)-4 | 295 | 85 | 10000 |
| (II)-5 | 585 | 83.8 | 9800 |
| (II)-6 | 420 | 30.5 | 10100 |
| (II)-7 | 430 | 12 | 9900 |
| (II)-8 | 410 | 203 | 10500 |
| (II)-9 | 610 | 85.2 | 10300 |
| (II)-10 | 4000 | 84.3 | 10800 |

In Examples 1 to 20 shown below, examples of the preparation of curable compositions containing pigments for the formation of color filters for liquid crystal display elements will be described.

Example 1

-A1. Preparation of Curable Composition- (A1-1) Preparation of Pigment Dispersion A liquid mixture prepared by mixing 40 parts of a 30/70 (mass ratio) mixture of C.I. Pigment Green 36 and C.I. Pigment Yellow 219 (average primary particle pigment 32 nm) as a pigment, 50 parts (about 22.6 parts in terms of solids) of BYK2001 (Disperbyk; manufactured by BYK Chemie GmbH, concentration of solids 45.1%), 5 parts of the dispersion resin (I)-1 synthesized above [(A) dispersion resin according to the invention], and 110 parts of ethyl 3-ethoxypropionate as the solvent, was mixed and dispersed with a bead mill for 15 hours, to prepare a pigment dispersion (P1).

<<Measurement of Particle Size Distribution of Pigment Dispersion>>

For the pigment dispersion (P1), the average particle size of the pigment immediately after the preparation was measured using a dynamic light scattering method (Microtrac Nanotrac UPA-EX150 (manufactured by Nikkiso Co., Ltd.), without further diluting P1), and was 61 nm.

(A1-2) Preparation of Curable Composition (Coating Solution)

A solution of the curable composition having the following composition was prepared using the pigment dispersion (P1) obtained from the above, by stirring and mixing.

<Composition>

| | |
|---|---|
| Pigment dispersion (P1) described above | 600 parts |
| 2,2'-Bis(2-chlorophenyl)-4,4',5,5'-tetraphenyl-1,2'-biimidazole [(E) photopolymerization initiator] | 30 parts |
| Pentaerythritol tetraacrylate [(F) Photopolymerizable compound] | 50 parts |
| Benzyl methacrylate/methacrylic acid/hydroxyethyl methacrylate (80/10/10 [molar ratio]) copolymer (Mw: 10000; alkali-soluble resin [(H) Binder polymer]) | 5 parts |
| Propylene glycol monomethyl ether acetate (PGMEA; (C) Solvent) | 900 parts |
| 3-Methacryloxypropyltrimethoxysilane (support adhesive) | 1 part |
| Compound α in the following [(G) Sensitizer] | 15 parts |
| 2-Mercaptobenzimidazole [(J) Co-sensitizer] | 15 parts |

Compound α

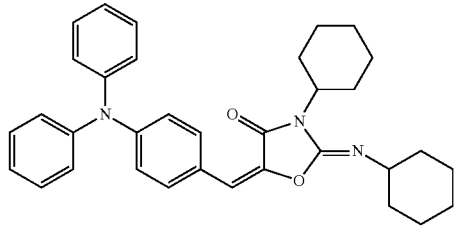 [SMILES: O=C1/C(=C\c2ccc(N(c3ccccc3)c3ccccc3)cc2)O/C(=N\C2CCCCC2)N1C1CCCCC1]

-A2. Production of Color Filter- (A2-1) Formation of a Curable Composition Layer The pigment-containing curable composition prepared as described above was coated (slit coated) as a resist solution on a glass substrate having a size of 550 mm×650 mm under the following conditions by using an slit coater, and then the coating film was left to stand as it was for 10 minutes, subjected to vacuum drying and prebaking (for 80 seconds at 100° C.), to form a curable composition layer.

Conditions for slit coating

Pore size of the opening at the tip of coating head: 50 μm

Coating speed: 100 mm/second

Clearance between substrate and coating head: 150 μm

Dried film thickness: 1.75 μm

Coating temperature: 23° C.

(A2-2) Exposure and Development

Thereafter, this curable composition layer was exposed through a pattern using a testing photomask having a line width of 20 μm and a 2.5 kW ultrahigh pressure mercury lamp. After the exposure, the entire surface of the layer was coated with a 10% aqueous solution of an organic developer (trade name: CD, manufactured by Fuji Film Electronics Materials Co., Ltd.), and was left to stand for 60 seconds to perform a developing treatment.

(A2-3) Heat Treatment

After the standing, purified water was jetted in shower form to rinse off the developer solution, and the curable composition layer which had been subjected to prebaking and developing treatment, was heated in an oven at 220° C. for 1 hour (postbaking). Thereby, there was obtained a color filter on which a colored pattern resulting from the curing of a curable composition layer on a glass substrate was formed.

-A3. Performance Evaluation-

The stability over time of a solution of the curable composition (coating solution) prepared in the above, and the exposure sensitivity, contact characteristics with substrate, development performance and the cross-sectional shape of the pattern related to the curable composition layer formed on a glass substrate using the curable composition were evaluated as follows. The evaluation results are presented in the following Table 3.

(A3-1) Stability Over Time of Curable Composition

After storing the curable composition (coating solution) prepared in the above at room temperature for 1 month, the viscosity of the liquid was measured with a type E viscometer (manufactured by Tokyo Keiki Co., Ltd.) and evaluated according to the following criteria.

-Evaluation Criteria-

A: No viscosity increase was observed.

B: A viscosity increase of 5% or more and less than 10% relative to the viscosity before storage was observed.

C: A viscosity increase of 10% or more relative to the viscosity before storage was observed.

(A3-2) Exposure Sensitivity of Curable Composition Layer

The curable composition layer after the coating was exposed by varying the exposure amount in the range of 10 to 100 ml/cm², and the exposure amount at which the line width of the pattern after the postbaking became 20 μm was evaluated as the exposure sensitivity. The exposure sensitivity is construed such that a smaller value indicates higher sensitivity.

(A3-3) Development Performance, Cross-Sectional Shape of Pattern and Contact Characteristics with Substrate The substrate surface and the cross-sectional shape of the pattern after the postbaking were checked by observation of optical microscopic photographs and SEM photographs. As respectively indicated in the following, the Development performance, the cross-sectional shape of the pattern, and the contact characteristics with substrate were evaluated. Details of the evaluation method and the evaluation criteria are as follows.

<Development Performance >

With regard to the exposure and development in (A2-2) above, the presence or absence of scum in the area where light was not irradiated (unexposed part) was observed, and the development performance was evaluated according to the following evaluation criteria.

-Evaluation Criteria-

A: No scum was confirmed at the unexposed part.

B: A negligible amount of scum was confirmed at the unexposed part, but only to an extent that would not cause any practical problem.

C: Significant scum was confirmed at the unexposed part.

<Cross-Sectional Shape of Pattern>

The cross-sectional shape of the colored pattern formed was observed and evaluated. The cross-sectional shape of the pattern is most preferably forward tapered, and next preferably rectangular in shape. An inversely tapered shape is not preferable.

<Contact Characteristics with Substrate>

The evaluation of the contact characteristics with substrate was performed according to the following evaluation criteria, by observing as to whether pattern defects were generated or not.

-Evaluation Criteria-

A: No pattern defects were observed.

B: Pattern defects were mostly not observed, but defects were observed in some areas.

C: Significant pattern defects were observed.

Examples 2 to 16

Curable compositions were prepared in the same manner as in Example 1, except that the resin (I)-1 in the curable composition prepared in Example 1 was substituted by resins (I)-2 to (I)-8, and resins (II)-1 to (II)-8 as indicated in the following Table 3, respectively. Then, color filters were produced, and furthermore the same evaluation as in Example 1 was performed. The evaluation results are presented in the following Table 3.

Examples 17 to 20

Curable compositions were prepared in the same manner as in Example 1, except that the resin (I)-1 in the curable composition prepared in Example 1 was substituted by resins (I)-9 or (I)-10, and resins (II)-9 or (II)-10 as indicated in the following Table 3, respectively. Then, color filters were produced, and furthermore the same evaluation as in Example 1 was performed. The evaluation results are presented in the following Table 3.

TABLE 3

| | Resin | Stability over time | Sensitivity | Development performance | contact characteristics | Cross-sectional shape of pattern |
|---|---|---|---|---|---|---|
| Example 1 | (I)-1 | A | 50 | A | A | Forward tapered shape |
| Example 2 | (I)-2 | A | 50 | A | A | Forward tapered shape |
| Example 3 | (I)-3 | A | 140 | A | A | Forward tapered shape |
| Example 4 | (I)-4 | A | 40 | A | A | Forward tapered shape |
| Example 5 | (I)-5 | A | 60 | A | A | Forward tapered shape |
| Example 6 | (I)-6 | A | 70 | A | A | Forward tapered shape |
| Example 7 | (I)-7 | A | 50 | A | B | Forward tapered shape |
| Example 8 | (I)-8 | A | 70 | A | A | Forward tapered shape |
| Example 9 | (II)-1 | A | 50 | A | A | Forward tapered shape |
| Example 10 | (II)-2 | A | 70 | A | B | Forward tapered shape |
| Example 11 | (II)-3 | A | 50 | A | A | Forward tapered shape |
| Example 12 | (II)-4 | A | 40 | A | A | Forward tapered shape |
| Example 13 | (II)-5 | B | 60 | B | B | Forward tapered shape |
| Example 14 | (II)-6 | A | 80 | A | A | Forward tapered shape |
| Example 15 | (II)-7 | A | 110 | A | A | Forward tapered shape |
| Example 16 | (II)-8 | A | 70 | A | A | Forward tapered shape |

TABLE 3-continued

|  | Resin | Stability over time | Sensitivity | Development performance | contact characteristics | Cross-sectional shape of pattern |
|---|---|---|---|---|---|---|
| Example 17 | (I)-9 | A | 50 | A | A | Forward tapered shape |
| Example 18 | (I)-10 | A | 60 | A | B | Forward tapered shape |
| Example 19 | (II)-9 | B | 80 | B | B | Forward tapered shape |
| Example 20 | (II)-10 | B | 70 | B | A | Forward tapered shape |

From the results of the above Table 3, it was found that the curable compositions of the respective Examples had excellent stability over time in their solution state. Furthermore, it was also found that when a colored pattern was formed using each of these curable compositions on a substrate, a color filter having high exposure sensitivity, excellent development performance, and excellent contact characteristics with substrate as well as cross-sectional shape of the pattern, could be obtained. In particular, when the dispersion resin according to the invention having an unsaturation equivalent of less than 600 was used, the properties were good.

Next, examples of preparing pigment-containing curable compositions for the use in the formation of color filters for solid state image pick-up elements will be described in the following Examples 21 to 40.

Example 21

-B1. Preparation of Resist Solution-

The components of the following composition were mixed and dissolved to prepare a resist solution.

<composition of Resist Solution>

| | |
|---|---|
| Propylene glycol monomethyl ether acetate (PGMEA: (C) solvent) | 19.20 parts |
| Ethyl lactate [(C) Solvent] | 36.67 parts |
| 40% Propylene glycol monomethyl ether acetate (PGMEA) solution of benzyl methacrylate/methacrylic acid/2-hydroxyethyl methacrylate (molar ratio = 60/22/18) copolymer [(H) Binder polymer] | 30.51 parts |
| Dipentaerythritol hexaacrylate [(E) Ethylenic unsaturated double bond-containing photopolymerizable compound] | 12.20 parts |
| Polymerization inhibitor (p-methoxyphenol) | 0.0061 parts |
| Fluorine-based surfactant (F-475, Dainippon Ink and Chemicals, Inc.) | 0.83 parts |
| TAZ-107 (manufactured by Midori Chemicals Co., Ltd.; trihalomethyltriazine-based (E) photopolymerization initiator) | 0.586 parts |

-B2. Production of Silicon Wafer with Undercoat Layer-

A 6-inch silicon wafer was heat treated in an oven at 200° C. for 30 minutes. Subsequently, the above-described resist solution was coated on this silicon wafer to obtain a dried film thickness of 1.5 μm, and the coating layer was dried by heating in an oven at 220° C. for 1 hour to form an undercoat layer. Thus, a silicon wafer substrate with undercoat layer was obtained.

-B3. Preparation of Pigment Dispersion-

A mixture liquid prepared by mixing 95 parts of C.I. Pigment Blue 15:6 (average primary particle diameter 32 nm) as a pigment, 35.5 parts (about 16 parts in terms of solids) of BYK2001 (Disperbyk; manufactured by BYK Chemie GmbH, concentration of solids 45.1%) as a dispersant, 31 parts of dispersion resin (I)-1 synthesized in the above [(A) dispersion resin according to the invention], and 830 parts of propylene glycol monomethyl ether acetate as a solvent, was mixed and dispersed by a bead mill, to prepare a pigment dispersion (P2).

The average particle size of the pigment of the pigment dispersion (P2) immediately after the preparation was measured by a dynamic light scattering method, and was found to be 200 nm.

-B4. Preparation of Curable Composition (Coating Solution)-

A solution of the curable composition having the following composition was prepared using the pigment dispersion (P2) obtained from the above, by stirring and mixing.

<Composition>

| | |
|---|---|
| Pigment dispersion (P2) described above | 600 parts |
| Irgacure 907 (manufactured by Ciba Specialty Chemicals Inc.; acetophenone-based (E) photopolymerization initiator) | 5 parts |
| Dipentaerythritol hexaacrylate [(F) Photopolymerizable compound] | 15 parts |
| Propylene glycol monomethyl ether acetate (PGMEA; (C) Solvent) | 280 parts |

-B5. Production of Color Filter Using Curable Composition and Evaluation Thereof- (B5-1) Pattern Formation and Evaluation of Sensitivity The curable composition prepared as described above was coated on the undercoat layer of the silicon wafer with undercoat layer obtained in B2. above, to form a colored layer (coating film). This coating film was subjected to a heat treatment (prebaked) using a hot plate at 100° C. for 120 seconds so that the dried film thickness of this coating film became 0.7 μm.

Subsequently, the coating film was exposed at a wavelength of 365 nm with various exposure amounts in the range of 50 to 1200 mJ/cm², through a patterned mask having a 1.5-μm² island pattern, using an i-ray stepper exposure apparatus FPA-3000i5+ (manufactured by Canon, Inc.).

Thereafter, the silicon wafer substrate on which a coating film had been formed after the exposure, was placed on a horizontal rotary table of a spin-shower processor (DW-30 type; manufactured by Chemitronics Co., Ltd.), and subjected to a paddle development at 23° C. for 60 seconds using a CD-2000 (manufactured by Fuji Film Electronics Materials Co., Ltd.), to form a colored pattern on the silicon wafer.

The silicon wafer on which a colored pattern had been formed was fixed to the horizontal rotary table by a vacuum chuck method. While the silicon wafer was rotated by a rotating apparatus at a speed of rotation of 50 rpm, a rinsing treatment was performed by supplying purified water provided in shower from above the rotational center of the silicon wafer from an ejection nozzle, and then the silicon wafer was spray-dried.

Thereafter, the size of the colored pattern was measured using a length measuring SEM "S-9260A" (manufactured by Hitachi High-Technologies Corporation). The exposure amount to obtain a pattern line width of 1.5 μm was evaluated as the exposure sensitivity. The exposure sensitivity is construed such that a smaller value indicates higher sensitivity. The measurement results are presented in the following Table 4.

(B5-2) Performance Evaluation

For the evaluation of properties other than sensitivity, the stability over time of the solution of the curable composition prepared as described above (coating solution), and the exposure sensitivity, contact characteristics with substrate, development performance and the cross-sectional shape of pattern of the curable composition layer formed using the curable composition on a glass substrate, were evaluated in the same manner as in A3. Performance Evaluation (A3-1 to A3-3) in Example 1 above. The evaluation results are presented in the following Table 4.

Additionally, the cross-sectional shape of the pattern is preferably rectangular, and an inversely tapered shape is not desirable.

Examples 22 to 36

Curable compositions were prepared in the same manner as in Example 21, except that the resin (I)-1 of the curable composition prepared in Example 21 was substituted by the resins (I)-2 to (I)-8 and the resins (II)-1 to (II)-8 as indicated in the following Table 4, respectively. Furthermore, color filters were produced, and the same evaluation as in Example 21 was performed. The evaluation results are presented in the following Table 4.

Examples 37-40

Curable compositions were prepared in the same manner as in Example 21, except that the resin (I)-1 of the curable composition prepared in Example 21 was substituted by the resins (I)-9 or (I)-10 and the resins (II)-9 or (II)-10 as indicated in the following Table 4, respectively. Furthermore, color filters were produced, and the same evaluation as in Example 21 was performed. The evaluation results are presented in the following Table 4.

over time in their solution state. Furthermore, it was also found that when a colored pattern was formed using each of these curable compositions on a support, high exposure sensitivity, excellent development performance was obtained, and a color filter having excellent contact characteristics with substrate and cross-sectional shape of pattern could be obtained. In particular, when the dispersion resin according to the invention having an unsaturation equivalent of less than 600 was used, the properties were good.

From these results, it could be seen that the curable compositions of the Examples could realize an excellent pattern forming property even in the case of producing color filters for solid state image pick-up elements, similarly to the case of producing color filters for liquid crystal display elements.

In addition, examples of preparing pigment-containing curable composition for the use in the formation of color filters for solid state image pick-up elements will be described in the following Examples 41 to 79 and Comparative Examples 1 to 12.

Synthesis Example 3

-Synthesis of Dispersed Resin (I)-11-

120 g of propylene glycol monomethyl ether was placed in a 1000-ml three-necked flask, and was heated to 90° C. under a nitrogen stream. To this, 120 g of a propylene glycol monomethyl ether solution of 74 g of benzyl methacrylate, 84 g of methacrylic acid and 9.7 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 8 L (liter) of water to precipitate out a polymer compound. The precipitated polymer compound was collected by filtration, washed with water, and dried to obtain 150 g of the polymer compound.

The weight-average molecular weight of the obtained polymer compound was measured by gel permeation chromatography (GPC) using polystyrene as the standard mate-

TABLE 4

|  | Resin | Stability over time | Sensitivity | Development performance | contact characteristics | Cross-sectional shape of pattern |
| --- | --- | --- | --- | --- | --- | --- |
| Example 21 | (I)-1 | A | 250 | A | A | Rectangular shape |
| Example 22 | (I)-2 | A | 250 | A | B | Rectangular shape |
| Example 23 | (I)-3 | A | 500 | A | B | Rectangular shape |
| Example 24 | (I)-4 | A | 200 | A | A | Rectangular shape |
| Example 25 | (I)-5 | A | 300 | A | A | Rectangular shape |
| Example 26 | (I)-6 | A | 300 | A | A | Rectangular shape |
| Example 27 | (I)-7 | A | 250 | A | A | Rectangular shape |
| Example 28 | (I)-8 | B | 350 | B | A | Rectangular shape |
| Example 29 | (II)-1 | A | 250 | A | A | Rectangular shape |
| Example 30 | (II)-2 | A | 300 | A | A | Rectangular shape |
| Example 31 | (II)-3 | A | 250 | A | A | Rectangular shape |
| Example 32 | (II)-4 | A | 200 | A | A | Rectangular shape |
| Example 33 | (II)-5 | B | 300 | A | A | Rectangular shape |
| Example 34 | (II)-6 | A | 500 | B | A | Rectangular shape |
| Example 35 | (II)-7 | A | 550 | B | A | Rectangular shape |
| Example 36 | (II)-8 | A | 550 | A | A | Rectangular shape |
| Example 37 | (I)-9 | A | 750 | B | A | Rectangular shape |
| Example 38 | (I)-10 | A | 250 | A | B | Rectangular shape |
| Example 39 | (II)-9 | A | 250 | A | B | Rectangular shape |
| Example 40 | (II)-10 | A | 550 | A | A | Rectangular shape |

From the results of the above Table 4, it was found that the curable compositions (pigment-based) of the respective Examples, which are used in the formation of color filters for solid state image pick-up elements, had excellent stability rial, and was found to be 12,000. The acid number of this polymer compound was determined by titration and was 202 mg KOH/g (calculated value: 204 mg KOH/g). Since this value was close to the theoretical value calculated from the feed ratio of benzyl methacrylate and methacrylic acid, 204 mg KOH/g, it could be seen that the composition ratio of benzyl methacrylate and methacrylic acid incorporated to the polymer was nearly the same as the feed ratio, and it was confirmed that polymerization was performed properly.

110 mg of p-methoxyphenol was added to 40 g of the polymer compound obtained as described above in a 1000-ml three-necked flask, and 60 g of propylene glycol monomethyl ether was further added and dissolved therein. To this, 820 mg of tetrabutylammonium bromide was further added, and the mixture was heated to 80° C. Then, 15 g of glycidyl methacrylate was added thereto, and the mixture was stirred for 6 hours. Then, it was confirmed by gas chromatography that the peak originating from glycidyl methacrylate disappeared. This reaction solution was added into 7 L of water to precipitate out a polymer compound (dispersion resin (I)-11). The precipitated polymer compound was collected by filtration, washed with water and dried, to obtain 54 g of the desired dispersion resin (I)-11.

The weight-average molecular weight of the obtained polymer compound (dispersion resin (I)-11) was measured by gel permeation chromatography (GPC) using polystyrene as the standard material, and was found to be 10,200. The unsaturation equivalent was calculated to be 265.

stream. To this, 100 g of a 1-methyl-2-pyrrolidone solution of 84 g of the compound (i-1) described above, 33 g of benzyl methacrylate, 23 g of methacrylic acid and 5.2 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 7 L of water to precipitate out a polymer compound. The precipitated polymer compound was collected by filtration, washed with water, and dried to obtain 131 g of the polymer compound.

131 g of the polymer compound obtained as described above and 1.0 g of p-methoxyphenol were placed in a 1000-ml three-necked flask, and 580 g of 1-methyl-2-pyrrolidone was further added to dissolve the mixture. The mixture was cooled in an ice bath filled with ice water. After the temperature of this mixture solution reached 5° C. or lower, 150 g of 1,8-diazabicyclo[5.4.0]-7-undecene (DBU) was added dropwise over 1 hour using a dropping funnel. After completion of the dropwise addition, the ice bath was removed, and the mixture was further stirred for 8 hours. The reaction solution obtained was adjusted to pH 7 by adding concentrated hydrochloric acid, and then was introduced into 7 L of water to precipitate out a polymer compound (dispersion resin (II)-

| | Structure | Unsaturation equivalent | Weight average molecular weight |
|---|---|---|---|
| Dispersion resin (I)-11 | [structure shown with subscripts 39, 29, 32] | 265 | 10200 |

-Synthesis of Dispersion Resins (I)-12 to (I)-24-

Dispersion resins (I)-12 to (I)-24 having the properties indicated in the following Table 5 were synthesized by the same synthesis method as in the synthesis of the dispersion resin (I)-11, by adjusting the ratio of monomers used and the amount of initiator.

Synthesis Example 4

-Synthesis of Resin (II)-11-

100 g of 1-methyl-2-pyrrolidone was placed in a 1000-ml three-necked flask, and was heated to 90° C. under a nitrogen 11). The precipitated polymer compound was collected by filtration, washed with water and dried, to obtain 113 g of the desired dispersion resin (II)-11.

The obtained polymer compound (dispersion resin (II)-11) was subjected to the measurement of $^1$H-NMR, and it was confirmed that 100% of the side chain group derived from the compound (i-1) was converted to an ethylene methacrylate group. Furthermore, the weight-average molecular weight was measured by gel permeation chromatography using polystyrene as the standard material, and was found to be 9,800. The unsaturation equivalent was calculated to be 255.

| Structure | Unsaturation equivalent | Weight average molecular weight |
|---|---|---|
| Dispersion resin (II)-11 ![structure] | 255 | 9800 |

-Synthesis of Dispersion Resins (II)-12 to (II)-24-

Dispersion resins (II)-12 to (II)-24 exhibiting the properties described in the following Table 5 were synthesized in the same manner as in the synthesis method for the dispersion resin (II)-11 described above, by adjusting the ratio of the monomers used and the amount of the initiator.

TABLE 5

| Polymer compound | Unsaturation equivalent | Weight average molecular weight |
|---|---|---|
| Dispersion resin (I)-11 | 265 | 10200 |
| Dispersion resin (I)-12 | 495 | 8700 |
| Dispersion resin (I)-13 | 570 | 9800 |
| Dispersion resin (II)-11 | 255 | 9800 |
| Dispersion resin (II)-12 | 440 | 9900 |
| Dispersion resin (II)-13 | 540 | 10500 |
| Dispersion resin (I)-14 | 140 | 12100 |
| Dispersion resin (I)-15 | 167 | 25400 |
| Dispersion resin (I)-16 | 220 | 2400 |
| Dispersion resin (I)-17 | 270 | 24100 |
| Dispersion resin (I)-18 | 520 | 31000 |
| Dispersion resin (I)-19 | 564 | 2700 |
| Dispersion resin (I)-20 | 950 | 13000 |
| Dispersion resin (I)-21 | 890 | 2700 |
| Dispersion resin (I)-22 | 740 | 35500 |
| Dispersion resin (I)-23 | 150 | 27400 |
| Dispersion resin (I)-24 | 178 | 24500 |
| Dispersion resin (II)-14 | 146 | 2340 |
| Dispersion resin (II)-15 | 150 | 11000 |
| Dispersion resin (II)-16 | 230 | 2200 |
| Dispersion resin (II)-17 | 285 | 26700 |
| Dispersion resin (II)-18 | 480 | 31500 |
| Dispersion resin (II)-19 | 520 | 2100 |
| Dispersion resin (II)-20 | 575 | 27800 |
| Dispersion resin (II)-21 | 1200 | 15600 |
| Dispersion resin (II)-22 | 815 | 35500 |
| Dispersion resin (II)-23 | 160 | 27400 |
| Dispersion resin (II)-24 | 182 | 24500 |

Synthesis Example 5

The following dispersion resin (III) and dispersion resin (IV) were synthesized in the same manner as in the above Synthesis Examples 3 and 4.

| Structure | Unsaturation equivalent | Weight average molecular weight |
|---|---|---|
| Dispersion resin (III) 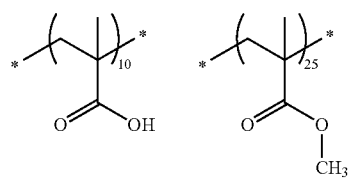 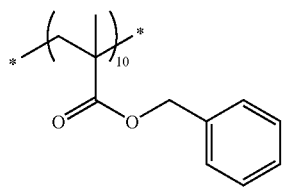 | 230 | 12650 |

-continued

| | Structure | Unsaturation equivalent | Weight average molecular weight |
|---|---|---|---|
| Dispersion resin (IV) | (structure shown) | 350 | 7000 |

Example 41

-Process 1: Preparation of Pigment Dispersion-

A liquid obtained by mixing the following components was dispersed for 1 hour by a bead mill with zirconium oxide beads having a diameter of 0.1 mm, under the conditions of a bead filling ratio of 40%, to prepare a pigment dispersion (Q1).

<Composition>

| | |
|---|---|
| C.I. Pigment Blue 15:6 (average primary particle diameter 32 nm: pigment) | 10.12 parts |
| L147 (manufactured by Sanyo Color Works, Ltd., concentration of solids 50%; dispersant) | 3.04 parts (1.52 parts in terms of solids) |
| Dispersion resin (I)-11 synthesized above [Dispersion resin according to the invention] | 3.56 parts |
| Propylene glycol monomethyl ether acetate (PGMEA; solvent) | 63.63 parts |
| Cyclohexanone (solvent) | 21.19 parts |

<Measurement of Particle Size Distribution of Pigment Dispersion>

The pigment dispersion prepared in Process 1 (Q1) was gradually diluted to a pigment concentration of 2%±0.1% using the solvent and a dispersant (PGMEA:cyclohexaonone:L147=20.9:6.96:1) used in the pigment dispersion, for the purpose of suppressing shock flocculation of the pigment. For the pigment dispersion after the dilution, the particle size distribution was measured using a particle size distribution measuring apparatus [Microtrac Nanotrac UPA-EX150 particle analyzer (manufactured by Nikkiso Co., Ltd.)] which was based on a dynamic light scattering method (frequency analysis method). As a result of the measurement, D90 was found to be 0.035 μm, while Fmax was 0.019 μm.

In addition, D90 is defined as the particle diameter (μm) corresponding to a cumulative amount of 90%, with the total amount of particles being 100%, when the cumulative amount by mass is counted from small-sized particles in a pigment-dispersed composition. Fmax is defined as the particle diameter (μm) at which the amount of particles present is the maximum in the particle size distribution of a pigment-dispersed composition.

-Process 3: Preparation of Foundation Solution-

The components of the following composition were mixed and dissolved to prepare a foundation solution.

<Composition of Foundation Solution>

| | |
|---|---|
| Benzyl methacrylate/methacrylic acid copolymer (molar ratio 70/30, weight-average molecular weight 30,000; resin) | 16.4 parts |
| Dipentaerythritol pentaacrylate (monomer) | 6.5 parts |
| Irgacure OXE01 (manufactured by Ciba Specialty Chemicals Inc.: oxime-based photopolymerization initiator) | 0.3 parts |
| Solvent 1: Propylene glycol monomethyl ether acetate | 13.8 parts |
| Solvent 2: Ethyl-3-ethoxypropionate | 12.3 parts |

-Process 4: Production of Silicon Wafer after Completion of Coating of Foundation Solution- A 6-inch silicon wafer was subjected to a heat treatment in an oven at 200° C. for 30 minutes. Subsequently, the above-described foundation solution was applied on this silicon wafer to obtain a dried film thickness of 1.0 μm, and the coating film was dried by heating in an oven at 220° C. for 1 hour, to form a foundation layer. As such, a silicon wafer with a foundation layer was obtained.

-Process 5: Preparation of Curable Composition (Color Resist Solution)-

A curable composition was prepared using a pigment dispersion (Q1) obtained in the above, by stirring and mixing the components to obtain the following composition.

<Composition of Curable Composition>

| | |
|---|---|
| Pigment dispersion (Q1) described above | 600 parts |
| Irgacure OXE01 (Ciba Specialty Chemicals Inc.; oxime-based photopolymerization initiator) | 5 parts |
| Dipentaerythritol hexaacrylate (monomer) | 15 parts |
| Propylene glycol monomethyl ether acetate (Solvent) | 280 parts |

-Process 6: Production of Color Filter Using Curable Composition-

The curable composition prepared as described above was applied on the foundation layer of the silicon wafer with a foundation layer, which was obtained in the Process 4, to form a colored layer (coating film). The coating film was subjected to a heat treatment (prebaked) using a hot plate at 100° C. for 120 seconds so that the dried film thickness of this coating film became 0.7 µm.

Subsequently, the coating film was exposed at a wavelength of 365 nm with various exposure amounts in the range of 50 to 1,200 mJ/cm$^2$, through a patterned mask having a 1.5-µm$^2$ island pattern, using an i-ray stepper exposure apparatus FPA-3000i5+ (manufactured by Canon, Inc.).

Thereafter, the silicon wafer substrate on which a coating film had been formed after the exposure, was placed on a horizontal rotary table of a spin-shower processor (DW-30 type; manufactured by Chemitronics Co., Ltd.), and subjected to a paddle development at 23° C. for 60 seconds using a CD-2000 (manufactured by Fuji Film Electronics Materials Co., Ltd.), to form a colored pattern on the silicon wafer.

The silicon wafer on which a colored pattern had been formed was fixed to the horizontal rotary table by a vacuum chuck method. While the silicon wafer was rotated by a rotating apparatus at a speed of rotation of 50 rpm, a rinsing treatment was performed by supplying purified water provided in shower from above the rotational center of the silicon wafer from an ejection nozzle, and then the silicon wafer was spray-dried, to obtain a color filter.

-Process 7: Performance Evaluation-

[Evaluation of Surface Roughness]

A glass substrate on which the monochromatic pigment dispersion (Q1) obtained in the Process 1 was coated and dried was provided, and this glass substrate was disposed between the objective lens and the illuminator of an optical microscope, and the state of the transmitted light of when light was irradiated toward the objective lens, was observed with an optical microscope equipped with a digital camera of a magnification of 1000. The digital camera installed on this optical microscope was carried a CCD having 1.28 million pixels, and the digital camera took shot images of the film surface through which light was transmitted. The images taken were stored as digitally converted data (digital images) in an 8-bit bitmap format. Additionally, the imaging of the film surface was performed at 20 arbitrarily selected areas. The digitally converted data was stored after digitalizing the brightness of the three primary colors of RGB of each of the taken images into a density distribution of a scale of 256 tones from 0 to 255.

Subsequently, the stored digital image was compartmentalized in a lattice form so that the size of one lattice was corresponding to 2 µm$^2$ on the actual substrate, and the brightness within one compartment was averaged. According to the present Example, since images were taken at an optical magnification of 1000 with a digital camera with 1.28 million pixels, 2 µm on the actual substrate corresponded to 2 mm on the image taken. Thus, since the image sized on the display was 452 mm×352 mm, the total number of compartments in a single area was 39776.

For all of the compartments, the average brightness of one arbitrary compartment and the average brightness of all the compartments adjacent thereto were measured. If the difference between the average brightness of the one arbitrary compartment as measured above and the average brightness of the adjacent compartments was 5 or greater, such compartment was considered as a compartment with significant difference. The average total number of the compartments with significant difference in the entire area, and the proportion occupied by the average total number of compartments with significant difference in the entire area with respect to the total number of compartments (39776) in each area, were calculated. This proportion occupied by the compartments with significant difference with respect to the total number of components was taken as an index for evaluating the surface roughness (roughness) of an image, and was evaluated according to the following evaluation criteria. The evaluation results are presented in the following Table 6 and Table 7.

<Evaluation Criteria>

AA: The proportion occupied by the compartments with significant difference with respect to the total number of compartments is less than 4%.

A: The proportion occupied by the compartments with significant difference with respect to the total number of compartments is 4% or more and less than 6%.

B: The proportion occupied by the compartments with significant difference with respect to the total number of compartments is 6% or more and less than 8%.

C: The proportion occupied by the compartments with significant difference with respect to the total number of compartments is 8% or more and less than 10%.

xx: The proportion occupied by the compartments with significant difference with respect to the total number of compartments is 10% or more.

[Evaluation of Pattern Shape]

The colored pattern produced in the Process 6 using the curable composition (containing the pigment dispersion (Q1)) prepared in the above Process 5, was observed using a length measuring SEM (S-9260S; manufactured by Hitachi, Ltd.). As the object of observation, the pattern shape of a square pixel pattern having an edge of 1.5 µm on each side was selected. At this time, the following method was used as the method of pattern evaluation, and the pattern was evaluated according to the following evaluation criteria. The evaluation results are presented in the following Table 6 and Table 7.

Figure 1B:
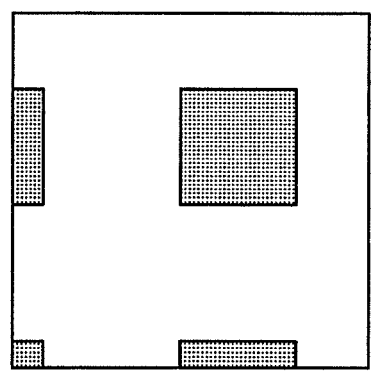
FIG. 1B is a diagram showing a pattern of the best shape.
Figure 1C:
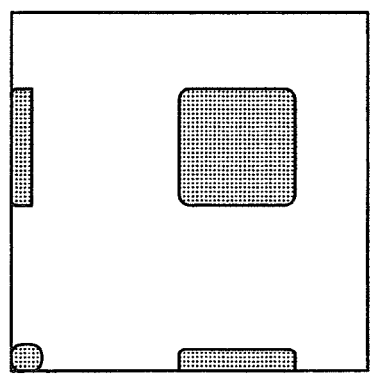
FIG. 1C is a diagram showing a pattern shape with four rounded corners.
Figure 2A:
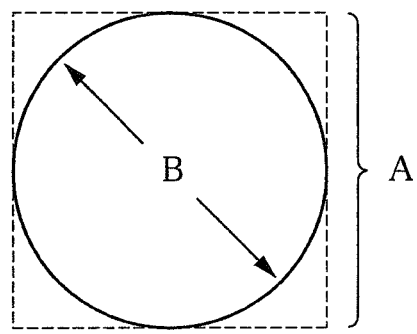
FIG. 2A is a diagram of the worst shape.
Figure 2B:
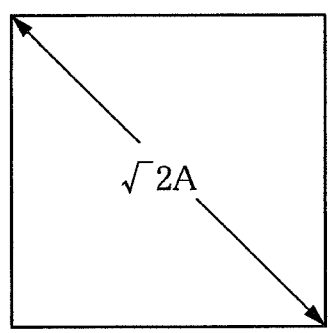
FIG. 2B is a diagram showing a pattern of the best shape.
Figure 2C:
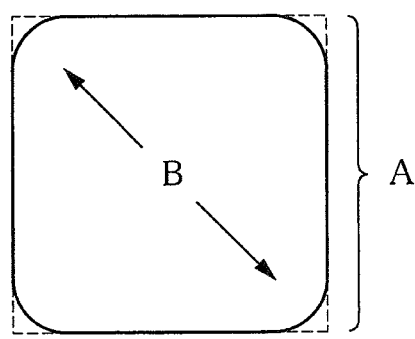
FIG. 2C is a diagram showing a pattern shape with four rounded corners.

When the worst shape of the pattern was assumed to be circular in shape as shown in FIG. 1(a) and FIG. 2(a), and the best shape was assumed to be rectangular in shape as shown in FIG. 1(b) and FIG. 2(b), and when one edge of the pattern was designated as A and the diagonal was designated as B, as shown in FIG. 1(c) and FIG. 2(c), the ratio of B/A (this is defined as the ratio of rectangle) varies within the range of $1 \leq B/A \leq 2^{1/2}$. Here, it is evaluated such that when the ratio of rectangle B/A approaches 1, the shape of pattern is closer to a circular shape, whereas when the ratio of rectangle approaches $2^{1/2}$ (=1.414 . . . ), the shape of pattern is closer to a rectangular shape.

<Evaluation Criteria>

AA: The ratio of rectangle B/A is 1.35 or more.

A: The ratio of rectangle B/A is 1.25 or more and less than 1.35.

B: The ratio of rectangle B/A is 1.15 or more and less than 1.25.

C: The ratio of rectangle B/A is 1.1 or more and less than 1.15.

xx: The ratio of rectangle B/A is less than 1.1.

[Evaluation of Development Scum]

The surrounding area and the in-between areas of the colored pattern formed in the above Process 6 were observed using a length measuring SEM (S-9260S, manufactured by Hitachi, Ltd.), and the state of the generation of development scum such as attached substances or dissolution remnant was observed. As the object of observation, the pattern shape of a square pixel pattern having an edge of 1.5 µm on each side was selected, and the pattern was evaluated according to the following evaluation criteria. The evaluation results are presented in the following Table 6 and Table 7.

<Evaluation Criteria>

Figure 3A:
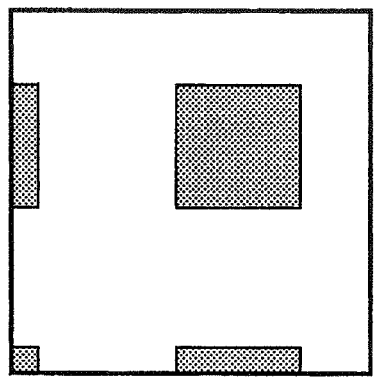
FIG. 3A is a diagram showing that there is no scum generated in the periphery of the pattern and in between the patterns.

AA: There was no scum in the surrounding area and the in-between areas of the pattern, as shown in FIG. 3(a).

Figure 3B:
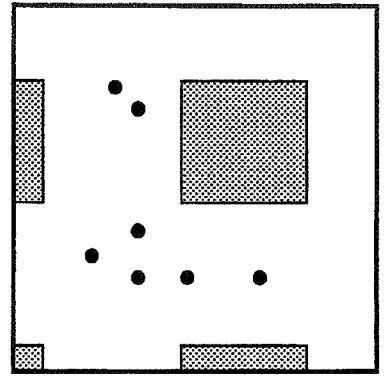
FIG. 3B is a diagram showing that there is a negligible amount of scum generated in the periphery of the pattern and in between the patterns.

A: A negligible amount of scum was seen in the surrounding area and the in-between areas of the pattern, as shown in FIG. 3(b).

Figure 3C:
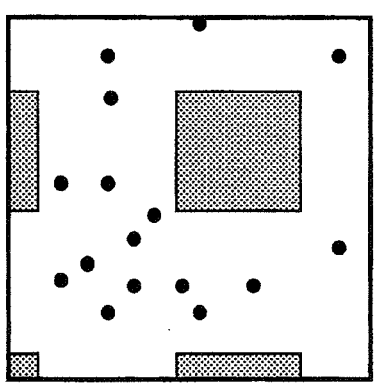
FIG. 3C is a diagram showing that there is a small amount of scum generated in the periphery of the pattern and in between the patterns.

B: A small amount of scum was seen in the surrounding area and the in-between areas of the pattern, as shown in FIG. 3(c).

Figure 3D:
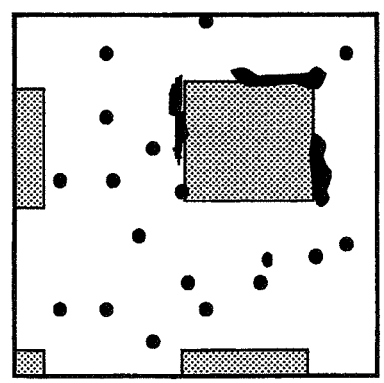
FIG. 3D is a diagram showing that there is scum generated in the periphery of the pattern and in between the patterns.

C: Scum was seen in the surrounding area and the in-between areas of the pattern, as shown in FIG. 3(d).

Figure 3E:
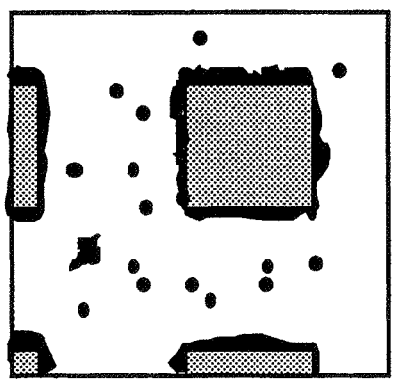
FIG. 3E is a diagram showing that there is a significant amount of scum generated in the periphery of the pattern and in between the patterns.

D: A significant amount of scum was seen in the surrounding area and the in-between areas of the pattern, as shown in FIG. 3(e).

[Evaluation of Thermal Fastness]

A glass substrate with a foundation layer, on which a colored pattern was formed, was placed on a hot plate, with the surface of glass substrate being in contact with the hot plate, and was heated at 200° C. for 1 hour. Then, the chromaticity change of the colored pattern, that is, ΔEab value, was measured using a colorimeter MCPD-1000 (manufactured by Otsuka Electronics Co., Ltd.). The ΔEab value is construed such that a smaller value indicates excellent thermal fastness. The evaluation results are presented in the following Table 6 and Table 7.

Examples 42 to 79 and Comparative Examples 1 to 12

Pigment dispersions (Q2) to (Q51) were prepared in the same manner as in Example 41, except that the dispersion resin (I)-11 [dispersion resin according to the invention] used in the Process 1 of Example 41 was changed as indicated in the following Table 6 and Table 7, and also adjustments were made by varying the dispersing conditions (dispersing time, amount of beads, and diameter of beads), and the particle size distribution was measured. Furthermore, curable compositions and color filters were produced therefrom.

Each of the color filters obtained was subjected to performance evaluation as described in the Process 7 of Example 41.

TABLE 6

| | Pigment dispersion | Dispersion resin | Unsaturation equivalent | Weight average molecular weight | Particle size distribution D90 | Particle size distribution Fmax | Surface roughness | Pattern shape | Scum | Δ Eab |
|---|---|---|---|---|---|---|---|---|---|---|
| Example 41 | Q1 | Dispersion resin (I)-11 | 265 | 10200 | 0.035 | 0.019 | AA | AA | AA | 4.2 |
| Example 42 | Q2 | Dispersion resin (I)-12 | 495 | 8700 | 0.052 | 0.025 | A | A | AA | 3.4 |
| Example 43 | Q3 | Dispersion resin (I)-13 | 570 | 9800 | 0.042 | 0.014 | A | AA | AA | 3.8 |
| Example 44 | Q4 | Dispersion resin (II)-11 | 255 | 9800 | 0.053 | 0.022 | AA | AA | A | 3.5 |
| Example 45 | Q5 | Dispersion resin (II)-12 | 440 | 9900 | 0.043 | 0.020 | AA | AA | AA | 4.0 |
| Example 46 | Q6 | Dispersion resin (II)-13 | 540 | 10500 | 0.042 | 0.027 | AA | AA | AA | 3.8 |
| Example 47 | Q7 | Dispersion resin (III) | 230 | 12650 | 0.045 | 0.025 | AA | AA | A | 2.9 |
| Example 48 | Q8 | Dispersion resin (III) | 230 | 12650 | 0.048 | 0.028 | AA | AA | A | 2.7 |
| Example 49 | Q9 | Dispersion resin (III) | 230 | 12650 | 0.041 | 0.013 | AA | AA | A | 2.6 |
| Example 50 | Q10 | Dispersion resin (IV) | 350 | 7000 | 0.047 | 0.022 | AA | AA | AA | 3.7 |
| Example 51 | Q11 | Dispersion resin (IV) | 350 | 7000 | 0.043 | 0.027 | AA | AA | AA | 2.4 |
| Example 52 | Q12 | Dispersion resin (IV) | 350 | 7000 | 0.047 | 0.014 | AA | AA | AA | 2.8 |
| Comparative Example 1 | Q13 | Dispersion resin (V) | — | 30000 | 0.049 | 0.024 | B | C | D | 11.1 |
| Comparative Example 2 | Q14 | Dispersion resin (V) | — | 30000 | 0.067 | 0.027 | C | C | C | 12.1 |
| Comparative Example 3 | Q15 | Dispersion resin (V) | — | 30000 | 0.034 | 0.019 | B | C | C | 11.8 |
| Comparative Example 4 | Q16 | Dispersion resin (VI) | — | 10000 | 0.036 | 0.013 | B | D | C | 13.1 |
| Comparative Example 5 | Q17 | Dispersion resin (VI) | — | 10000 | 0.062 | 0.017 | C | D | C | 14.2 |
| Comparative Example 6 | Q18 | Dispersion resin (VI) | — | 10000 | 0.051 | 0.024 | B | D | B | 13.9 |
| Comparative Example 7 | Q19 | Dispersion resin (VII) | — | 14000 | 0.064 | 0.025 | C | D | C | 12.1 |
| Comparative Example 8 | Q20 | Dispersion resin (VII) | — | 14000 | 0.051 | 0.023 | B | D | C | 11.9 |
| Comparative Example 9 | Q21 | Dispersion resin (VII) | — | 14000 | 0.034 | 0.014 | B | D | C | 12.4 |
| Comparative Example 10 | Q22 | Dispersion resin (VIII) | 650 | 9400 | 0.064 | 0.026 | C | C | C | 14.2 |
| Comparative Example 11 | Q23 | Dispersion resin (VIII) | 650 | 9400 | 0.051 | 0.018 | C | C | C | 14.9 |
| Comparative Example 12 | Q24 | Dispersion resin (VIII) | 650 | 9400 | 0.036 | 0.020 | B | C | C | 15.2 |
| Example 53 | Q25 | Dispersion resin (I)-14 | 140 | 12100 | 0.039 | 0.024 | A | A | A | 4.2 |
| Example 54 | Q26 | Dispersion resin (I)-15 | 167 | 25400 | 0.067 | 0.024 | B | A | A | 3.6 |
| Example 55 | Q27 | Dispersion resin (I)-16 | 220 | 2400 | 0.040 | 0.015 | A | B | AA | 2.8 |
| Example 56 | Q28 | Dispersion resin (I)-17 | 270 | 24100 | 0.041 | 0.027 | A | AA | B | 3.1 |
| Example 57 | Q29 | Dispersion resin (I)-18 | 520 | 31000 | 0.062 | 0.024 | B | A | A | 2.5 |

TABLE 7

| | Pigment dispersion | Dispersion resin | Unsaturation equivalent | Weight average molecular weight | Particle size distribution | | Surface roughness | Pattern shape | Scum | Δ Eab |
|---|---|---|---|---|---|---|---|---|---|---|
| | | | | | D90 | Fmax | | | | |
| Example 58 | Q30 | Dispersion resin (I)-19 | 564 | 2700 | 0.038 | 0.017 | A | A | AA | 3.4 |
| Example 59 | Q31 | Dispersion resin (I)-20 | 950 | 13000 | 0.036 | 0.020 | A | B | B | 4.2 |
| Example 60 | Q32 | Dispersion resin (I)-21 | 890 | 2700 | 0.058 | 0.022 | A | B | AA | 3.1 |
| Example 61 | Q33 | Dispersion resin (I)-22 | 740 | 35500 | 0.057 | 0.025 | A | B | A | 3.0 |
| Example 62 | Q34 | Dispersion resin (I)-23 | 150 | 27400 | 0.036 | 0.020 | A | B | B | 2.8 |
| Example 63 | Q35 | Dispersion resin (I)-24 | 178 | 24500 | 0.058 | 0.022 | A | A | B | 2.9 |
| Example 64 | Q36 | Dispersion resin (II)-14 | 146 | 2340 | 0.062 | 0.020 | B | B | A | 3.9 |
| Example 65 | Q37 | Dispersion resin (II)-15 | 150 | 11000 | 0.041 | 0.019 | A | B | B | 2.8 |
| Example 66 | Q38 | Dispersion resin (II)-16 | 230 | 2200 | 0.062 | 0.024 | A | A | A | 2.8 |
| Example 67 | Q39 | Dispersion resin (II)-17 | 285 | 26700 | 0.038 | 0.017 | B | A | B | 3.4 |
| Example 68 | Q40 | Dispersion resin (II)-18 | 480 | 31500 | 0.057 | 0.025 | A | A | B | 2.5 |
| Example 69 | Q41 | Dispersion resin (II)-19 | 520 | 2100 | 0.042 | 0.014 | A | A | A | 2.8 |
| Example 70 | Q42 | Dispersion resin (II)-20 | 575 | 27800 | 0.057 | 0.025 | A | A | B | 3.4 |
| Example 71 | Q43 | Dispersion resin (II)-21 | 1200 | 15600 | 0.058 | 0.022 | A | B | B | 3.6 |
| Example 72 | Q44 | Dispersion resin (II)-22 | 815 | 35500 | 0.062 | 0.021 | B | A | B | 2.8 |
| Example 73 | Q45 | Dispersion resin (II)-23 | 160 | 27400 | 0.041 | 0.022 | A | B | B | 2.7 |
| Example 74 | Q46 | Dispersion resin (II)-24 | 182 | 24500 | 0.067 | 0.024 | B | A | B | 4.1 |
| Example 75 | Q47 | Dispersion resin (I)-11 | 265 | 10200 | 0.025 | 0.045 | A | A | B | 3.6 |
| Example 76 | Q48 | Dispersion resin (I)-12 | 495 | 8700 | 0.120 | 0.057 | A | B | A | 3.5 |
| Example 77 | Q49 | Dispersion resin (I)-11 | 255 | 9800 | 0.019 | 0.035 | A | A | A | 3.5 |
| Example 78 | Q50 | Dispersion resin (I)-12 | 440 | 9900 | 0.089 | 0.048 | A | A | B | 2.9 |
| Example 79 | Q51 | Dispersion resin (III) | 230 | 12650 | 0.084 | 0.045 | A | A | B | 3.8 |

| | Structure | Unsaturation equivalent | Weight average molecular weight |
|---|---|---|---|
| Dispersion resin (V) | 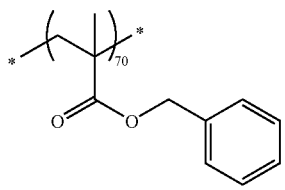 | — | 30000 |
| Dispersion resin (VI) | 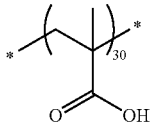 | — | 10000 |

-continued

| | Structure | Unsaturation equivalent | Weight average molecular weight |
|---|---|---|---|
| Dispersion resin (VII) | [structure: copolymer with benzyl methacrylate (60), methacrylic acid (21), and 2-hydroxyethyl methacrylate (19) segments] | — | 14000 |
| Dispersion resin (VIII) | [structure: copolymer with styrene (30), dicyclopentanyl methacrylate (30), glycerol monoacrylate phthalate methacrylate (m), and glycerol monoacrylate methacrylate (n) segments; m + n = 40] | 650 | 9400 |

As indicated in the Table 6 and Table 7, in the Examples using the dispersion resins according to the invention, the "surface roughness", which is one of important performances of a color filter, and the pattern shape, scum and thermal fastness were all excellent.

Examples 80 to 101, and Comparative Examples 13 to 20

Pigment dispersions (Q52) to (Q81) were prepared in the same manner as in Example 41, except that the type of the dispersion resin and particle size distribution in Example 41 were changed as indicated in the following Table 8, and the particle size distribution was measured. Furthermore, curable compositions and color filters were also produced. The same performance evaluation as that in the Process 7 of Example 41 was also performed.

In addition, the particle size distribution was controlled by varying the dispersing conditions (dispersing time, amount of beads, and diameter of beads).

ness", which is one of important performances of a color filter, and the pattern shape, scum and thermal fastness were all excellent.

Examples 102 to 121, and Comparative Examples 21 to 24

Pigment dispersions (R1) to (R24) were prepared in the same manner as in Example 41, except that the Process 1 for preparing a pigment dispersion in Example 41 was substituted by the following Process 8, the type of the dispersion resin and particle size distribution were changed as indicated in the following Table 9, and the particle size distribution was measured. Furthermore, curable compositions and color filters were also produced. The same performance evaluation as that in the Process 7 of Example 41 was also performed.

In addition, the particle size distribution was controlled by varying the dispersing conditions (dispersing time, amount of beads, and diameter of beads).

-Process 8: Preparation of Pigment Dispersion-

A liquid prepared by mixing the following components was dispersed for 1 hour by a bead mill with zirconium oxide

TABLE 8

| | Pigment dispersion | Dispersion resin | Unsaturation equivalent | Weight average molecular weight | Particle size distribution D90 | Particle size distribution Fmax | Surface roughness | Pattern shape | Scum | Δ Eab |
|---|---|---|---|---|---|---|---|---|---|---|
| Example 80 | Q52 | Dispersion resin (I)-11 | 265 | 10200 | 0.043 | 0.019 | AA | AA | A | 3.2 |
| Example 81 | Q53 | Dispersion resin (I)-12 | 495 | 8700 | 0.056 | 0.025 | A | A | A | 4.1 |
| Example 82 | Q54 | Dispersion resin (I)-13 | 570 | 9800 | 0.042 | 0.014 | A | A | A | 3.8 |
| Example 83 | Q55 | Dispersion resin (II)-11 | 255 | 9800 | 0.058 | 0.022 | A | AA | A | 3.9 |
| Example 84 | Q56 | Dispersion resin (II)-12 | 440 | 9900 | 0.047 | 0.020 | A | AA | A | 3.3 |
| Example 85 | Q57 | Dispersion resin (II)-13 | 540 | 10500 | 0.043 | 0.027 | A | A | A | 3.8 |
| Example 86 | Q58 | Dispersion resin (I)-11 | 265 | 10200 | 0.015 | 0.009 | B | AA | A | 4.5 |
| Example 87 | Q59 | Dispersion resin (I)-11 | 265 | 10200 | 0.102 | 0.056 | B | A | A | 8.9 |
| Example 88 | Q60 | Dispersion resin (I)-12 | 495 | 8700 | 0.024 | 0.019 | B | A | A | 4.2 |
| Example 89 | Q61 | Dispersion resin (I)-12 | 495 | 8700 | 0.121 | 0.075 | B | A | A | 3.8 |
| Example 90 | Q62 | Dispersion resin (II)-11 | 255 | 9800 | 0.023 | 0.008 | B | A | A | 3.6 |
| Example 91 | Q63 | Dispersion resin (II)-11 | 255 | 9800 | 0.074 | 0.032 | B | A | A | 3.1 |
| Example 92 | Q64 | Dispersion resin (II)-12 | 440 | 9900 | 0.018 | 0.007 | B | AA | A | 4.1 |
| Example 93 | Q65 | Dispersion resin (II)-12 | 440 | 9900 | 0.098 | 0.042 | B | AA | A | 4.0 |
| Example 94 | Q66 | Dispersion resin (I)-17 | 270 | 24100 | 0.089 | 0.034 | B | A | B | 4.8 |
| Example 95 | Q67 | Dispersion resin (I)-22 | 740 | 35500 | 0.098 | 0.045 | B | A | B | 4.5 |
| Example 96 | Q68 | Dispersion resin (II)-17 | 285 | 26700 | 0.074 | 0.048 | B | A | B | 2.9 |
| Example 97 | Q69 | Dispersion resin (II)-20 | 575 | 27800 | 0.088 | 0.035 | B | A | B | 2.7 |
| Example 98 | Q70 | Dispersion resin (III) | 230 | 12650 | 0.084 | 0.047 | B | A | A | 3.5 |
| Example 99 | Q71 | Dispersion resin (III) | 230 | 12650 | 0.078 | 0.027 | B | A | A | 3.9 |
| Example 100 | Q72 | Dispersion resin (IV) | 350 | 7000 | 0.098 | 0.056 | B | A | A | 4.3 |
| Example 101 | Q73 | Dispersion resin (IV) | 350 | 7000 | 0.075 | 0.022 | B | A | A | 4.4 |
| Comparative Example 13 | Q74 | Dispersion resin (V) | — | 30000 | 0.097 | 0.056 | B | D | B | 18.1 |
| Comparative Example 14 | Q75 | Dispersion resin (V) | — | 30000 | 0.079 | 0.028 | B | D | B | 17.9 |
| Comparative Example 15 | Q76 | Dispersion resin (VI) | — | 10000 | 0.026 | 0.007 | B | D | B | 11.7 |
| Comparative Example 16 | Q77 | Dispersion resin (VI) | — | 10000 | 0.047 | 0.008 | A | C | C | 13.5 |
| Comparative Example 17 | Q78 | Dispersion resin (VII) | — | 14000 | 0.085 | 0.042 | B | D | B | 16.3 |
| Comparative Example 18 | Q79 | Dispersion resin (VII) | — | 14000 | 0.087 | 0.029 | B | D | C | 15.9 |
| Comparative Example 19 | Q80 | Dispersion resin (VIII) | 650 | 9400 | 0.097 | 0.055 | B | C | C | 17.9 |
| Comparative Example 20 | Q81 | Dispersion resin (VIII) | 650 | 9400 | 0.065 | 0.034 | B | C | B | 16.8 |

As shown in the Table 8, in the Examples using the dispersion resins according to the invention, the "surface roughness", which is one of important performances of a color beads having a diameter of 0.1 mm, under the conditions of a bead filling ratio of 40%, to prepare a pigment dispersion.

<Composition>

| | |
|---|---|
| C.I. Pigment Green 36 (average primary particle diameter 30 nm: pigment) | 15 parts |
| F411 (manufactured by Sanyo Color Works, Ltd., concentration of solids 80%: dispersant) | 5.0 parts (4.0 parts in terms of solids) |
| Dispersion resin indicated in the following Table 9, synthesized as described above | 7.5 parts |
| Propylene glycol monomethyl ether acetate (PGMEA; solvent) | 72.5 parts |

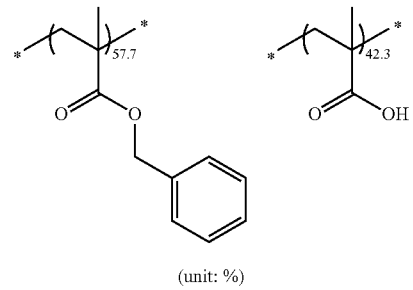

(unit: %)

TABLE 9

| | Pigment dispersion | Dispersion resin | Unsaturation equivalent | Weight average molecular weight | Particle size distribution D90 | Particle size distribution Fmax | Surface roughness | Pattern shape | Scum | Δ Eab |
|---|---|---|---|---|---|---|---|---|---|---|
| Example 102 | R1 | Dispersion resin (I)-11 | 265 | 10200 | 0.042 | 0.017 | A | AA | AA | 3.5 |
| Example 103 | R2 | Dispersion resin (I)-12 | 495 | 8700 | 0.059 | 0.024 | A | A | AA | 4.5 |
| Example 104 | R3 | Dispersion resin (I)-13 | 570 | 9800 | 0.047 | 0.014 | A | A | AA | 3.7 |
| Example 105 | R4 | Dispersion resin (II)-11 | 255 | 9800 | 0.058 | 0.024 | A | AA | AA | 3.8 |
| Example 106 | R5 | Dispersion resin (II)-12 | 440 | 9900 | 0.043 | 0.021 | A | AA | AA | 3.6 |
| Example 107 | R6 | Dispersion resin (II)-13 | 540 | 10500 | 0.046 | 0.028 | A | A | A | 4.5 |
| Example 108 | R7 | Dispersion resin (I)-11 | 265 | 10200 | 0.016 | 0.008 | B | AA | A | 4.2 |
| Example 109 | R8 | Dispersion resin (I)-11 | 265 | 10200 | 0.089 | 0.044 | B | AA | A | 3.9 |
| Example 110 | R9 | Dispersion resin (I)-12 | 495 | 8700 | 0.027 | 0.017 | B | AA | AA | 4.8 |
| Example 111 | R10 | Dispersion resin (I)-12 | 495 | 8700 | 0.113 | 0.067 | B | AA | AA | 5.1 |
| Example 112 | R11 | Dispersion resin (II)-11 | 255 | 9800 | 0.021 | 0.078 | B | AA | AA | 4.6 |
| Example 113 | R12 | Dispersion resin (II)-11 | 255 | 9800 | 0.078 | 0.036 | B | AA | AA | 4.3 |
| Example 114 | R13 | Dispersion resin (II)-12 | 440 | 9900 | 0.016 | 0.008 | A | AA | AA | 3.8 |
| Example 115 | R14 | Dispersion resin (II)-12 | 440 | 9900 | 0.089 | 0.042 | B | AA | AA | 3.6 |
| Example 116 | R15 | Dispersion resin (I)-17 | 270 | 24100 | 0.089 | 0.031 | B | AA | B | 3.9 |
| Example 117 | R16 | Dispersion resin (I)-22 | 740 | 35500 | 0.102 | 0.057 | B | A | B | 4.0 |
| Example 118 | R17 | Dispersion resin (II)-17 | 285 | 26700 | 0.079 | 0.053 | B | AA | B | 3.7 |
| Example 119 | R18 | Dispersion resin (II)-20 | 575 | 27800 | 0.083 | 0.036 | B | A | B | 3.6 |
| Example 120 | R19 | Dispersion resin (III) | 230 | 12650 | 0.088 | 0.037 | B | AA | A | 3.6 |
| Example 121 | R20 | Dispersion resin (IV) | 350 | 7000 | 0.108 | 0.059 | B | A | A | 16.9 |
| Comparative Example 21 | R21 | Dispersion resin (V) | — | 30000 | 0.098 | 0.061 | C | D | C | 17.4 |
| Comparative Example 22 | R22 | Dispersion resin (VI) | — | 10000 | 0.023 | 0.067 | B | D | C | 12.4 |
| Comparative Example 23 | R23 | Dispersion resin (VII) | — | 14000 | 0.083 | 0.046 | C | D | B | 15.9 |
| Comparative Example 24 | R24 | Dispersion resin (VIII) | 650 | 9400 | 0.093 | 0.058 | B | C | C | 17.5 |

As indicated in the Table 9, in the Examples using the dispersion resins according to the invention, the "surface roughness", which is one of important performances of a color filter, and the pattern shape, scum and thermal fastness were all excellent.

Next, Examples of the invention according to the second aspect will be described in more detail.

Synthesis Example 6

-Synthesis of Resin of High Acid Number (I)-1-

85 g of propylene glycol methyl ether was placed in a 1000-ml three-necked flask, and was heated to 90° C. under a nitrogen stream. To this, 85 g of a propylene glycol methyl ether solution of 71 g of benzyl methacrylate, 52 g of methacrylic acid and 7 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 5 L of water to precipitate out a solid product. The precipitated solid product was collected by filtration, washed with water, and dried to obtain 110 g of a resin having the following structure [resin of high acid number (I)-1].

The acid number of the obtained resin was determined by titration, and was found to be 271 mg KOH/g (calculated value: 275 mg KOH/g). Thus, it was confirmed that polymerization was conducted properly. The weight-average molecular weight was also measured by gel permeation chromatography using polystyrene as the standard material, and was found to be 15,300.

-Synthesis of Resins of High Acid Number (I)-2 to (I)-10-

Resins of high acid number (I)-2 to (I)-10 exhibiting the properties indicated in the following Table 10 were synthesized by the same synthesis method as the method of "Synthesis of resin of high acid number (I)-1", by adjusting the ratio of the monomer used and the amount of initiator.

TABLE 10

| Resin | Acid number (mg KOH/g) | weight average molecular weight |
|---|---|---|
| (I)-1 | 271 | 15300 |
| (I)-2 | 115 | 12400 |
| (I)-3 | 680 | 25800 |
| (I)-4 | 135 | 5100 |

TABLE 10-continued

| Resin | Acid number (mg KOH/g) | weight average molecular weight |
|---|---|---|
| (I)-5 | 490 | 20100 |
| (I)-6 | 150 | 32000 |
| (I)-7 | 225 | 14700 |
| (I)-8 | 172 | 13200 |
| (I)-9 | 25 | 15000 |
| (I)-10 | 90 | 15500 |

Synthesis Example 7

-Synthesis of Dispersion Resin Having an Unsaturation Equivalent of Less than 600 (II)-1-

95 g of propylene glycol methyl ether was placed in a 1000-ml three-necked flask, and was heated to 90° C. under a nitrogen stream. To this, 95 g of a propylene glycol methyl ether solution of 80 g of benzyl methacrylate, 47 g of methacrylic acid and 7 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 5 L of water to precipitate out a solid product. The precipitated solid product was collected by filtration, washed with water, and dried to obtain 123 g of a solid polymer compound.

The acid number of the obtained polymer compound was determined by titration, and was found to be 240 mg KOH/g (calculated value: 241 mg KOH/g). Thus, it was confirmed that polymerization was conducted properly. The weight-average molecular weight was also measured by gel permeation chromatography using polystyrene as the standard material, and was found to be 15,800.

Subsequently, 120 g of the obtained polymer compound and 1.0 g of p-methoxyphenol were placed in a 1000-ml three-necked flask, and 180 g of 1-methyl-2-pyrrolidone was added to dissolve the mixture. Then, the mixture was heated to 90° C., and then 68 g of glycidyl methacrylate was added dropwise thereto. After completion of the dropwise addition, the mixture was further stirred for 6 hours. It was confirmed by high performance liquid chromatography (HPLC) that glycidyl methacrylate completely disappeared, and then this reaction solution was introduced into 7 L of water to precipitate out a polymer compound. The precipitated polymer compound was collected by filtration, washed with water and dried, to obtain 195 g of a resin compound having the following structure (dispersion resin (II)-1).

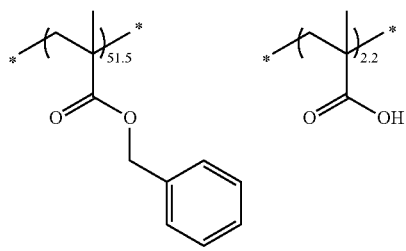

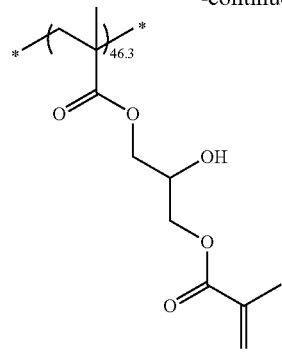

(unit: %)

The weight-average molecular weight of the obtained resin compound was measured by gel permeation chromatography (GPC) using polystyrene as the standard material, and was found to 19,200. The acid number of the obtained polymer compound was determined by titration, and was found to be 14.1 mg KOH/g (calculated value: 14.2 mg KOH/g). The unsaturation equivalent was arithmetically calculated to be 306.

-Synthesis of Dispersion Resins (II)-2 to (II)-4-

Dispersion resins (II)-2 to (II)-4 exhibiting the properties indicated in the following Table 11 were synthesized by the same synthesis method as the synthesis of the dispersion resin (II)-1, by adjusting the ratio of the monomer used and the amount of initiator.

Synthesis Example 8

-Synthesis of Dispersion Resin (II)-5-

100 g of 1-methyl-2-pyrrolidone was placed in a 1000-ml three-necked flask, and was heated to 90° C. under a nitrogen stream. To this, 100 g of a 1-methyl-2-pyrrolidone solution of 84 g of the following compound (i-1), 33 g of benzyl methacrylate, 23 g of methacrylic acid and 5.2 g of V-601 (Wako Pure Chemical Industries, Ltd.) was added dropwise over 2 hours. After completion of the dropwise addition, the mixture was further stirred for 2 hours. Subsequently, the reaction solution was cooled to room temperature, and was introduced into 7 L of water to precipitate out a polymer compound. The precipitated polymer compound was collected by filtration, washed with water, and dried to obtain 131 g of the polymer compound.

The acid number of the obtained polymer compound was determined by titration, and was found to be 69.6 mg KOH/g (calculated value: 67.3 mg KOH/g). Thus, it was confirmed that the polymerization was conducted properly. The weight-average molecular weight was also determined by gel permeation chromatography using polystyrene as the standard material, and was found to be 12,800.

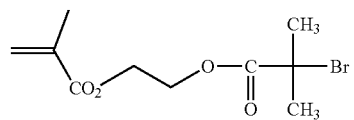

i-1

Subsequently, 131 g of the polymer compound obtained as described above and 1.0 g of p-methoxyphenol were placed in a 1000-ml three-necked flask, and 580 g of 1-methyl-2-pyrrolidone was further added to dissolve the mixture. The mixture was cooled in an ice bath filled with ice water. After the temperature of this mixture solution reached 5° C. or lower, 150 g of 1,8-diazabicyclo[5.4.0]-7-undecene (DBU) was added dropwise over 1 hour using a dropping funnel. After completion of the dropwise addition, the ice bath was removed, and the mixture was stirred for 8 hours. The reaction solution obtained was adjusted to pH 7 by adding concentrated hydrochloric acid, and then was introduced into 7 L of water to precipitate out a polymer compound. The precipitated polymer compound was collected by filtration, washed with water and dried, to obtain 113 g of a resin compound (dispersion resin (II)-5).

$^1$H-NMR of the obtained resin compound was measured, and it was confirmed that 100% of the side chain group derived from the compound (i-1) was converted to an ethylene methacrylate group. The weight-average molecular weight was measured by gel permeation chromatography using polystyrene as the standard material, and was found to be 10,600. Furthermore, the acid number of this resin compound was determined by titration, and was found to be 84.7 mg KOH/g (calculated value 84.2 mg KOH/g). The unsaturation equivalent was calculated to be 415.

-Synthesis of Dispersion Resins (II)-6 to (II)-10-

Dispersion resins (II)-6 to (II)-10 exhibiting the properties indicated in the following Table 11 were synthesized by the same synthesis method as described above (Synthesis Example 8), by adjusting the ratio of the monomers used and the amount of initiator.

TABLE 11

| Resin | Unsaturation equivalent | Acid number (mg KOH/g) | weight average molecular weight |
|---|---|---|---|
| (II)-1 | 306 | 14 | 19200 |
| (II)-2 | 233 | 13 | 18300 |
| (II)-3 | 254 | 20 | 4900 |
| (II)-4 | 305 | 58 | 83000 |
| (II)-5 | 415 | 85 | 10600 |
| (II)-6 | 575 | 65 | 12900 |
| (II)-7 | 310 | 82 | 42000 |
| (II)-8 | 625 | 14 | 40000 |
| (II)-9 | 2900 | 13 | 19100 |
| (II)-10 | No unsaturated bond | 14 | 18800 |

In the Examples 122 to 136 and Comparative Example 25 to 29 described below, examples of preparing pigment-containing curable composition for the use in the formation of color filters for liquid crystal display elements will be described.

Example 122

-A1. Preparation of Curable Composition- (A1-1) Preparation of Pigment Dispersion A mixture liquid prepared by mixing 50 parts of a 40/60 (mass ratio) mixture of C.I. Pigment Green 36 and C.I. Pigment Yellow 150 (average primary particle size 32 nm) as a pigment, 60 parts (about 27.0 parts in terms of solids) of BYK2001 (Disperbyk: manufactured BYK Chemie Co., Ltd., concentration of solids 45.1%), 8.0 parts of the resin of high acid number (I)-1 [(A) resin having an acid number of 100 mg KOH/g or more] synthesized in the above, 8.5 parts of the dispersion resin (II)-1 [(B) dispersion resin having an acid number of less than 100 mg KOH/g and an unsaturation equivalent of less than 600] synthesized in the above, and 103.5 parts of propylene glycol monomethyl ether as the solvent, was further mixed and dispersed for 15 hours by a bead mill, to prepare a pigment dispersion (P1).

(A1-2) Preparation of Curable Composition (Coating Solution)

A solution of curable composition was prepared using the pigment dispersion (P1) obtained in the above, by stirring and mixing the components to obtain the following composition.

<Composition>

| | |
|---|---|
| Pigment dispersion (P1) described above | 200 parts |
| 2,2'-Bis(2-chlorophenyl)-4,4'-5,5'-tetraphenyl-1,2'-biimidazole [(E) Photopolymerization initiator] | 4 parts |
| Dipentaerythritol hexaacrylate [DPHA; (F) Photopolymerizable compound] | 5 parts |
| Propylene glycol monomethyl ether acetate (PGMEA; (D) Solvent) | 250 parts |
| 3-Methacryloxypropyltrimethoxysilane (adhesiveness to support) | 0.5 parts |
| Following compound α [(G) Sensitizer] | 2.5 parts |
| 2-Mercaptobenzimidazole [(J) Co-sensitizer] | 3 parts |

Compound α

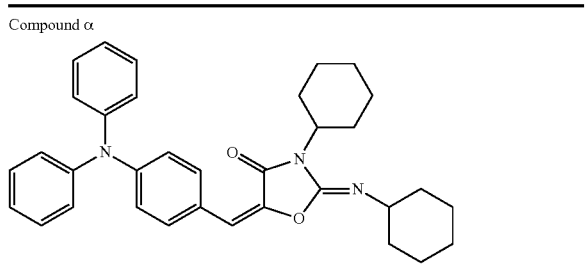

-A2. Production of Color Filter- (A2-1) Formation of Curable Composition Layer

The pigment-containing curable composition prepared as described above was coated (slit coated) as a resist solution on a glass substrate having a size of 550 mm×650 mm under the following conditions by using an slit coater, and then the coating film was left to stand as it was for 10 minutes, subjected to vacuum drying and prebaking (for 80 seconds at 100° C.), to form a curable composition layer.

Conditions for Slit Coating

Pore size of the opening at the tip of coating head: 50 μm

Coating speed: 100 mm/second

Clearance between substrate and coating head: 150 μm

Dried film thickness: 1.75 μm

Coating temperature: 23° C.

(A2-2) Exposure and Development

Thereafter, this curable composition layer was exposed through a pattern using a testing photomask having a line width of 20 μm and a 2.5-kW ultrahigh pressure mercury lamp. After the exposure, the entire surface of the layer was coated with a 10% aqueous solution of an organic developer (trade name: CD, manufactured by Fuji Film Electronics Materials Co., Ltd.), and was left to stand for 60 seconds to perform a developing treatment.

(A2-3) Heat Treatment

After the standing, purified water was jetted in shower form to rinse off the developer solution, and the curable composition layer which had been subjected to prebaking and developing treatment, was heated in an oven at 220° C. for 1 hour (postbaking). Thereby, there was obtained a color filter on which a colored pattern resulting from the curing of a curable composition layer on a glass substrate was formed.

-A3. Performance Evaluation-

The stability over time and fine dispersibility of the pigment dispersion prepared in the above, the stability over time of a solution of the curable composition (coating solution)

prepared in the above, and the exposure sensitivity, contact characteristics with substrate, development performance and the cross-sectional shape of the pattern of the curable composition layer formed on a glass substrate using the curable composition, were evaluated as follows. The evaluation results are presented in the following Table 12.

(A3-1) Stability Over Time of Pigment Dispersion

After storing the above-prepared pigment dispersion (P1) at room temperature for 1 week, the viscosity of the liquid was measured with a type E viscometer (manufactured by Tokyo Keiki Co., Ltd.) and evaluated according to the following criteria.

-Evaluation Criteria-

A: The viscosity increase was less than 5% relative to the viscosity before storage.

B: A viscosity increase of 5% or more and less than 10% relative to the viscosity before storage was observed.

C: A viscosity increase of 10% or more relative to the viscosity before storage was observed.

(A3-2) Fine Dispersibility of Pigment Dispersion

For the pigment dispersion (P1), the average particle size of the pigment was measured by a dynamic light scattering method (measured without further diluting the pigment dispersion (P1) using Microtrac Nanotrac UPA-EX150 manufactured by Nikkiso Co., Ltd.). A smaller average particle size of the pigment means that the fine dispersibility is higher.

-Evaluation Criteria-

A: The average particle size was less than 70 nm.

B: The average particle size was 70 nm or more and less than 150 nm.

C: The average particle size was 150 nm or more.

(A3-3) Stability Over Time of Curable Composition

After storing the above-prepared curable composition (coating solution) at room temperature for 1 month, the viscosity of the liquid was measured with a type E viscometer (manufactured by Tokyo Keiki Co., Ltd.) and evaluated according to the following criteria.

-Evaluation Criteria-

A: No viscosity increase was observed.

B: A viscosity increase of 5% or more and less than 10% relative to the viscosity before storage was observed.

C: A viscosity increase of 10% or more relative to the viscosity before storage was observed.

(A3-4) Exposure Sensitivity of Curable Composition Layer

The curable composition layer after the coating was exposed with various exposure amounts by varying the exposure amount in the range of 10 to 100 mJ/cm$^2$, and the exposure amount at which the pattern line width after the postbaking became 20 μm was evaluated as the exposure sensitivity. The exposure sensitivity is construed such that a smaller value indicates higher sensitivity.

(A3-5) Development Performance, Cross-Sectional Shape of Pattern, Adhesiveness to Support The substrate surface and the cross-sectional shape of the pattern after the postbaking were checked by observation of optical microscopic photographs and SEM photographs. As respectively indicated in the following, the development performance, the cross-sectional shape of the pattern, and the adhesiveness to support were evaluated. Details of the evaluation method and the evaluation criteria are as follows.

<Development Performance>

With regard to the exposure and development in (A2-2) above, the presence or absence of scum in the area where light was not irradiated (unexposed part) was observed, and the development performance was evaluated according to the following evaluation criteria.

-Evaluation Criteria-

A: No scum was confirmed at the unexposed part.

B: A negligible amount of scum was confirmed at the unexposed part, but only to an extent that would not cause any practical problem.

C: Significant scum was confirmed at the unexposed part.

<Cross-Sectional Shape of Pattern>

The cross-sectional shape of the colored pattern formed was observed and evaluated. The cross-sectional shape of the pattern is most preferably forward tapered, and next preferably rectangular in shape. An inversely tapered shape is not preferable.

<Adhesiveness to Support>

The evaluation of the adhesiveness to support was performed according to the following evaluation criteria, by observing as to whether pattern defects were generated or not.

-Evaluation Criteria-

A: No pattern defects were observed.

B: Pattern defects were mostly not observed, but defects were observed in some areas.

C: Significant pattern defects were observed.

Examples 123 to 136

Curable compositions were prepared in the same manner as in Example 122, except that the resin of high acid number (I)-1 and the dispersion resin (II)-1 for the curable composition prepared in Example 122 were substituted as indicated in the following Table 12, and color filters were produced as well as evaluated in the same manner as in Example 122. The evaluation results are presented in the following Table 12.

Comparative Examples 25 to 29

Curable compositions were prepared in the same manner as in Example 122, except that the resin of high acid number (I)-1 and the dispersion resin (II)-1 for the curable composition prepared in Example 122 were substituted as indicated in the following Table 12, and color filters were produced as well as evaluated in the same manner as in Example 122. The evaluation results are presented in the following Table 12.

TABLE 12

|  | (A) Resin of high acid number | (B) Dispersion resin | Dispersion stability over time | Fine dispersibility | Stability over time | Sensitivity | Development performance | contact characteristics | Cross-sectional shape of pattern |
|---|---|---|---|---|---|---|---|---|---|
| Example 122 | (I)-1 | (II)-1 | A | A | A | 65 | A | A | Forward tapered shape |
| Example 123 | (I)-1 | (II)-2 | A | A | A | 60 | A | A | Forward tapered shape |
| Example 124 | (I)-1 | (II)-3 | A | A | A | 65 | A | B | Forward tapered shape |

TABLE 12-continued

| | (A) Resin of high acid number | (B) Dispersion resin | Dispersion stability over time | Fine dispersibility | Stability over time | Sensitivity | Development performance | contact characteristics | Cross-sectional shape of pattern |
|---|---|---|---|---|---|---|---|---|---|
| Example 125 | (I)-1 | (II)-4 | A | A | A | 60 | A | A | Forward tapered shape |
| Example 126 | (I)-1 | (II)-5 | A | A | A | 50 | A | A | Forward tapered shape |
| Example 127 | (I)-1 | (II)-6 | A | A | A | 55 | A | A | Forward tapered shape |
| Example 128 | (I)-1 | (II)-7 | A | A | A | 45 | A | A | Forward tapered shape |
| Example 129 | (I)-2 | (II)-1 | A | A | A | 70 | A | A | Forward tapered shape |
| Example 130 | (I)-2 | (II)-5 | A | A | A | 60 | B | A | Forward tapered shape |
| Example 131 | (I)-3 | (II)-5 | A | A | A | 60 | B | B | Forward tapered shape |
| Example 132 | (I)-4 | (II)-5 | A | A | A | 65 | A | B | Forward tapered shape |
| Example 133 | (I)-5 | (II)-5 | A | A | A | 60 | A | A | Forward tapered shape |
| Example 134 | (I)-6 | (II)-5 | A | A | A | 65 | A | A | Forward tapered shape |
| Example 135 | (I)-7 | (II)-5 | A | A | A | 55 | A | A | Forward tapered shape |
| Example 136 | (I)-8 | (II)-5 | A | A | A | 60 | A | A | Forward tapered shape |
| Comparative Example 25 | (I)-9 | (II)-1 | B | B | B | 75 | B | B | Rectangular shape |
| Comparative Example 26 | (I)-10 | (II)-1 | B | B | B | 75 | B | B | Rectangular shape |
| Comparative Example 27 | (I)-1 | (II)-8 | B | B | B | 80 | C | B | Rectangular shape |
| Comparative Example 28 | (I)-1 | (II)-9 | B | C | B | 250 | C | B | Inversely tapered shape |
| Comparative Example 29 | (I)-1 | (II)-10 | C | C | C | (Entire area peeled off) | C | C | (Entire area peeled off) |

From the results of the Table 12, it may be seen that the curable composition of each of the Examples containing the resin of high acid number and the dispersion resin according to the invention has excellent stability over time in its solution state. Furthermore, it may be seen that when a colored pattern is formed on a support using this curable composition, a color filter which has high exposure sensitivity, excellent development performance, and excellent adhesiveness to support as well as cross-sectional shape of pattern may be obtained, compared to the Comparative Examples which do not use both the resin of high acid number and the dispersion resin.

Next, examples of preparing a pigment-containing curable composition for the use in the formation of color filters for solid state image pick-up elements will be described in the following Examples 138 to 152 and Comparative Examples 30 to 34.

Example 137

-B1. Preparation of Resist Solution-
The components of the following composition were mixed and dissolved to prepare a resist solution.
<Composition of Resist Solution>

| | |
|---|---|
| Propylene glycol monomethyl ether acetate (PGMEA: (D) Solvent) | 19.20 parts |
| Ethyl lactate [(D) Solvent] | 36.67 parts |
| 40% propylene glycol monomethyl ether acetate (PGMEA) solution of benzyl methacrylate/methacrylic acid/2-hydroxyethyl methacrylate (molar ratio = 60/22/18) [(H) Binder polymer] | 30.51 parts |

-continued

| | |
|---|---|
| Dipentaerythritol hexaacrylate [(F) Ethylenic unsaturated double bond-containing photopolymerizable compound] | 12.20 parts |
| Polymerization inhibitor (p-methoxyphenol) | 0.0061 parts |
| Fluoro-based surfactant (F-475, manufactured by Dainippon Ink Chemicals, Inc.) | 0.83 parts |
| TAZ-107 (manufactured by Midori Chemicals Co., Ltd.; trihalomethyltriazine-based (E) photopolymerization initiator) | 0.586 parts |

-B2. Production of Silicon Wafer with Undercoat Layer-
A 6-inch silicon wafer was heat treated in an oven at 200° C. for 30 minutes. Subsequently, the above-described resist solution was coated on this silicon wafer to obtain a dried film thickness of 1.5 µm, and the coating film was dried by heating in an oven at 220° C. for 1 hour to form an undercoat layer. Thus, a silicon wafer substrate with undercoat layer was obtained.

-B3. Preparation of Pigment Dispersion-
A mixture liquid prepared by mixing 50 parts of a 40/60 (mass ratio) mixture of C.I. Pigment Green 36 and C.I. Pigment Yellow 150 (average primary particle diameter 32 nm) as a pigment, 30 parts (about 13.5 parts in terms of solids) of BYK2001 (Disperbyk; manufactured by BYK Chemie GmbH, concentration of solids 45.1%) as a dispersant, 8.0 parts of the resin of high acid number (I)-1 synthesized above [(A) resin having an acid number of 100 mg KOH/g or more], 8.5 parts of the dispersion resin synthesized above [(B) dispersion resin having an acid number of less than 100 mg KOH/g and an unsaturation equivalent of less than 600], and 103.5 parts of propylene glycol monomethyl ether acetate as a solvent, was mixed and dispersed by a bead mill for 15 hours, to prepare a pigment dispersion (P2).

-B4. Preparation of Curable Composition (Coating Solution)-

A solution of curable composition was prepared using the above-obtained pigment dispersion (P2) by stirring and mixing the components to obtain the following composition.

<Composition>

| | |
|---|---|
| Pigment dispersion (P2) described above | 200 parts |
| Irgacure 907 (manufactured by Ciba Specialty Chemicals Inc.; acetophenone-based (E) photopolymerization initiator) | 5 parts |
| Dipentaerythritol hexaacrylate [(F) Photopolymerizable compound] | 15 parts |
| Propylene glycol monomethyl ether acetate (PGMEA; (D) Solvent) | 280 parts |

-B5. Production of Color Filter Using Curable Composition and Evaluation Thereof- (B5-1) Pattern Formation and Evaluation of Sensitivity The curable composition prepared as described above was coated on the undercoat layer of the silicon wafer with undercoat layer obtained in B2. above, to form a colored layer (coating film). This coating film was subjected to a heat treatment (prebaking) using a hot plate at 100° C. for 120 seconds so that the dried film thickness of this coating film became 0.7 µm.

Subsequently, the coating film was exposed at a wavelength of 365 nm with various exposure amounts in the range of 50 to 1200 mJ/cm$^2$, through a patterned mask having a 1.5-µm$^2$ island pattern, using an i-ray stepper exposure apparatus FPA-3000i5+ (manufactured by Canon, Inc.).

Thereafter, the silicon wafer substrate on which a coating film had been formed after the exposure, was placed on a horizontal rotary table of a spin-shower developing machine (DW-30 type; manufactured by Chemitronics Co., Ltd.), and subjected to a paddle development at 23° C. for 60 seconds using a CD-2000 (manufactured by Fuji Film Electronics Materials Co., Ltd.), to form a colored pattern on the silicon wafer.

The silicon wafer on which a colored pattern had been formed was fixed to the horizontal rotary table by a vacuum chuck method. While the silicon wafer was rotated by a rotating apparatus at a speed of rotation of 50 rpm, a rinsing treatment was conducted by supplying purified water in shower form from above the rotational center of the silicon wafer from an ejection nozzle, and then the silicon wafer was spray-dried.

Thereafter, the size of the colored pattern was measured using a length measuring SEM "S-9260A" (manufactured by Hitachi High-Technologies Corporation). The exposure amount to obtain a pattern line width of 1.5 µm was evaluated as the exposure sensitivity. The exposure sensitivity is construed such that a smaller value indicates higher sensitivity. The measurement results are presented in the following Table 13.

(B5-2) Performance Evaluation
(B5-2-1)

For the evaluation of properties other than sensitivity, the stability over time and fine dispersibility of the pigment dispersion prepared in the above, the stability over time of the solution of the curable composition (coating solution), and the adhesiveness to support, development performance and the cross-sectional shape of pattern of the curable composition layer formed on a glass substrate using the curable composition, were evaluated in the same manner as in A3. Performance Evaluation (A3-1 to A3-3, A3-5) in Example 122 in the above. The evaluation results are presented in the following Table 13.

Additionally, the cross-sectional shape of pattern is preferably rectangular in shape, and an inversely tapered shape is not desirable.

(B5-2-2) Evaluation of Color Unevenness

The brightness distribution was interpreted by the following method, and the color unevenness was evaluated on the basis of the proportion occupied by the pixels having a deviation from the average of within ±5%, in the entire number of pixels. The evaluation criteria are as follows.

First, the curable composition was coated on the undercoat layer of the glass substrate with undercoat layer which was obtained by the same method as in B2. above, to form a colored layer (coating film). The coating film was subjected to a heat treatment (prebaking) using a hot plate at 100° C. for 120 seconds, so that the dried film thickness of this coating film became 0.7 µm. The brightness distribution of the glass substrate which had been completed with coating film, was interpreted from the images taken with a microscope MX-50 (manufactured by Olympus Corporation).

-Evaluation Criteria-

A: The number of pixels having a deviation from the average of within ±5% is 99% or more of the entire number of pixels.

B: The number of pixels having a deviation from the average of within ±5% is 95% or more and less than 99% of the entire number of pixels.

C: The number of pixels having a deviation from the average of within ±5% is less Than 95% of the entire number of pixels.

Examples 138 to 151

Curable compositions were prepared in the same manner as in Example 137, except that the resin of high acid number (I)-1 and the dispersion resin (II)-1 for the curable composition prepared in Example 137 were substituted as indicated in the following Table 13, and color filters were produced as well as evaluated in the same manner as in Example 137. The evaluation results are presented in the following Table 13.

Comparative Examples 30 to 34

Curable compositions were prepared in the same manner as in Example 137, except that the resin of high acid number (I)-1 and the dispersion resin (II)-1 for the curable composition prepared in Example 137 were substituted as indicated in the following Table 13, and color filters were produced as well as evaluated in the same manner as in Example 137. The evaluation results are presented in the following Table 13.

TABLE 13

| | (A) Resin of high acid number | (B) Dispersion resin | Dispersion stability over time | Fine dispersibility | Stability over time | Sensitivity | Development performance | contact characteristics | Cross-sectional shape of pattern | Color unevenness |
|---|---|---|---|---|---|---|---|---|---|---|
| Example 137 | (I)-1 | (II)-1 | A | A | A | 380 | A | A | Rectangular shape | A |
| Example 138 | (I)-1 | (II)-2 | A | A | A | 350 | A | A | Rectangular shape | A |
| Example 139 | (I)-1 | (II)-3 | A | A | A | 380 | A | B | Rectangular shape | A |
| Example 140 | (I)-1 | (II)-4 | A | A | A | 350 | A | A | Rectangular shape | A |
| Example 141 | (I)-1 | (II)-5 | A | A | A | 250 | A | A | Rectangular shape | A |
| Example 142 | (I)-1 | (II)-6 | A | A | A | 300 | A | A | Rectangular shape | A |
| Example 143 | (I)-1 | (II)-7 | A | A | A | 200 | A | A | Rectangular shape | A |
| Example 144 | (I)-2 | (II)-1 | A | A | A | 400 | A | A | Rectangular shape | A |
| Example 145 | (I)-2 | (II)-5 | A | A | A | 320 | B | A | Rectangular shape | A |
| Example 146 | (I)-3 | (II)-5 | A | A | A | 330 | B | B | Rectangular shape | A |
| Example 147 | (I)-4 | (II)-5 | A | A | A | 370 | A | B | Rectangular shape | A |
| Example 148 | (I)-5 | (II)-5 | A | A | A | 350 | A | A | Rectangular shape | A |
| Example 149 | (I)-6 | (II)-5 | A | A | A | 380 | A | A | Rectangular shape | A |
| Example 150 | (I)-7 | (II)-5 | A | A | A | 300 | A | A | Rectangular shape | A |
| Example 151 | (I)-8 | (II)-5 | A | A | A | 340 | A | A | Rectangular shape | A |
| Comparative Example 30 | (I)-9 | (II)-1 | B | B | B | 450 | B | B | Inversely tapered shape | B |
| Comparative Example 31 | (I)-10 | (II)-1 | B | B | B | 450 | A | B | Inversely tapered shape | B |
| Comparative Example 32 | (I)-1 | (II)-8 | B | B | B | 750 | C | B | Inversely tapered shape | B |
| Comparative Example 33 | (I)-1 | (II)-9 | B | C | B | 1000 | C | B | Inversely tapered shape | B |
| Comparative Example 34 | (I)-1 | (II)-10 | C | C | C | (Entire area peeled off) | C | C | (Entire area peeled off) | C |

From the results of the Table 13, it may be seen that the curable compositions (pigment-based) of the respective Examples containing the resin of high acid number and the dispersion resin according to the invention, which are used for the use in the formation of color filters for solid state image pick-up elements, have excellent stability over time in their solution state. Also, it may be seen that when a colored pattern is formed on a support using one of these curable compositions, a color filter having high exposure sensitivity, excellent development performance, and excellent adhesiveness to support as well as cross-sectional shape of pattern may be obtained, compared to the Comparative Examples which do not use both the resin of high acid number and the dispersion resin.

From these results, it was found that the curable compositions of the Examples could realize an excellent pattern forming property, also in the case of producing color filters for solid state image pick-up elements, similarly to the case of producing color filters for liquid crystal display elements.

Hereinafter exemplary embodiments of the invention related to the first aspect will be described. However, the invention is not limited to the following embodiments.

<1> A pigment-dispersed composition including at least a polymer compound (A-1) having at least one selected from the structural units represented by the following formulae (1) to (3), a pigment (B), and a solvent (C):

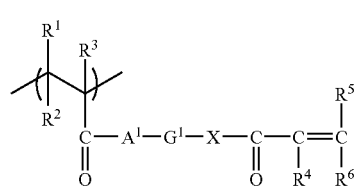

Formula (1)

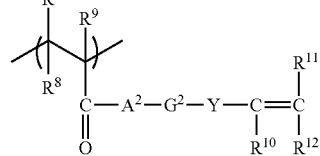

Formula (2)

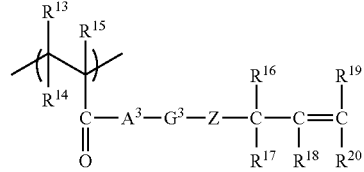

Formula (3)

wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$ and $R^{20}$ each independently represent a hydrogen atom or a monovalent organic group; $A^1$, $A^2$ and $A^3$ each independently represent an oxygen atom, a sulfur atom or —N($R^{21}$)—, wherein $R^{21}$ represents an alkyl group which may be substituted; $G^1$, $G^2$ and $G^3$ each independently represent a divalent organic group; X and Z each independently represent an oxygen atom, a sulfur atom or —N($R^{22}$)—, wherein $R^{22}$ represents an alkyl group which may be substituted; and Y represents an oxygen atom, a sulfur atom, a phenylene group which may be substituted, or —N($R^{23}$)—, wherein $R^{23}$ represents an alkyl group which may be substituted.

<2> The pigment-dispersed composition as described in <1>, wherein the polymer compound (A-1) has an unsaturation equivalent of less than 600.

<3> A curable composition comprising a polymer compound (A-1) having at least one selected from the structural units represented by the formulae (1) to (3) described above, a pigment (B), a solvent (C), and a photopolymerization initiator (E):

<4> The curable composition as described in <3>, wherein the polymer compound (A-1) has an unsaturation equivalent of less than 600.
<5> The curable composition as described in <3> or <4>, further comprising a photopolymerizable compound (F).
<6> A color filter including a colored pattern formed on a support using the curable composition of any one of <3> to <5>.
<7> A production method for a color filter, including: coating the curable composition of any one of <3> to <5> on a support to form a colored layer; exposing the coated layer through a patterned mask; and developing the colored layer after the exposure to form a colored pattern.

Hereinafter exemplary embodiments of the invention related to the second aspect will be described. However, the invention is not limited to the following embodiments.
<8> A pigment dispersed composition including at least a resin (D) having an acid number of 100 mg KOH/g or more, a dispersion resin (A-2) having an acid number of less than 100 mg KOH/g and an unsaturation equivalent of less than 600, a pigment (B), and a solvent (C).
<9> The pigment dispersed composition as described in <8>, wherein the dispersion resin (A-2) has at least one selected from the structural units represented by the formulae (1) to (3) described above:
<10> The pigment dispersed composition as described in <8> or <9>, wherein the resin (D) has an acid number of from 120 g KOH/g to 800 mg KOH/g, and a weight-average molecular weight of 3,000 to 100,000, has a structure containing a single bond between carbon atoms, a urethane bond, an ester bond, an ether bond or an amide bond individually or in combination of a plurality thereof in the main chain of the resin, and has one or more acid groups selected from a —COOH group, an —SO$_3$H group and an —OPO$_3$H$_2$ group, and the dispersion resin (A-2) has an unsaturation equivalent of 580 or less, an acid number of from 30 g KOH/g to 100 mg KOH/g, and a weight-average molecular weight of 3,000 to 100,000, and has a structure containing a single bond between carbon atoms, a urethane bond, an ester bond, an ether bond or an amide bond individually or in combination of a plurality thereof in the main chain of the resin.
<11> A curable composition including at least a resin (D) having an acid number of 100 mg KOH/g or more, a dispersion resin (A-2) having an acid number of less than 100 mg KOH/g and an unsaturation equivalent of less than 600, a pigment (B), a solvent (C), and a photopolymerization initiator (E).
<12> The curable composition as described in <11>, wherein the dispersion resin (A-2) has at least one selected from the structural units represented by the formulae (1) to (3) described above:
<13> The curable composition as described in <11> or <12>, further comprising a photopolymerizable compound (F).
<14> The curable composition as described in any one of <11> to <13>, wherein the resin (D) has an acid number of from 120 g KOH/g to 800 mg KOH/g, and a weight-average molecular weight of 3,000 to 100,000, has a structure containing a single bond between carbon atoms, a urethane bond, an ester bond, an ether bond or an amide bond individually or in combination of a plurality thereof in the main chain of the resin, and has one or more acid groups selected from a —COOH group, an —SO$_3$H group and an —OPO$_3$H$_2$ group, and the dispersion resin (A-2) has an unsaturation equivalent of 580 or less, an acid number of from 30 g KOH/g to 100 mg KOH/g or less, and a weight-average molecular weight of 3,000 to 100,000, and has a structure containing a single bond between carbon atoms, a urethane bond, an ester bond, an ether bond or an amide bond individually or in combination of a plurality thereof in the main chain of the resin.
<15> A color filter having a colored pattern which is formed on a support using the curable composition of any one of <11> to <14>.
<16> A production method for a color filter, including: coating the curable composition of any one of <11> to <14> on a support to form a colored layer; exposing the coated layer through a patterned mask; and developing the colored layer after the exposure to form a colored pattern.

According to the invention according to the first aspect and the second aspect, a pigment-dispersed composition having excellent fine-dispersibility of a pigment, excellent stability over time and high tinctorial strength, may be provided by suppressing aggregation of the pigment. The pigment-dispersed composition of the invention may be suitably used for a variety of applications such as coating materials, printing inks and color display panels.

According to the invention according to the first aspect and the second aspect, there may be provided a colored curable composition which has high photosensitivity, has excellent stability over time, tinctorial strength and contact characteristics with substrate, has the film shrinkage and a decrease in the color density (decoloration) at the cured part suppressed, has good development performance with little development scum, and is capable of forming a colored pattern with a cross-section having a tapered shape or a rectangular shape. The colored curable composition of the invention may be suitably used in the formation of a colored image on a substrate, such as a color proof, or in the production of a color filter that is used for solid state image pick-up elements, liquid crystal color displays and the like.

Furthermore, according to the invention according to the first aspect and the second aspect, a color filter having excellent contact characteristics with substrate and including a colored pattern with a cross-section having a tapered shape or a rectangular shape, and a production method for a color filter with excellent productivity for the color filter, may be provided.

The invention claimed is:

1. A pigment-dispersed composition comprising at least a polymer compound (A-1) having at least one selected from the structural units represented by the following formulae (1) to (3), a pigment (B), and a solvent (C):

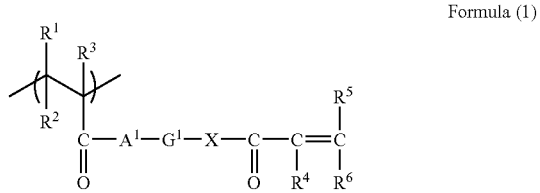

Formula (1)

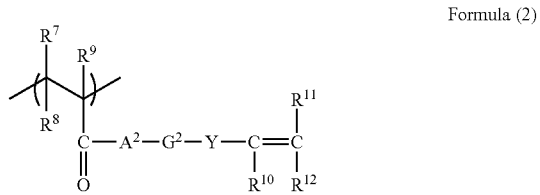

Formula (2)

-continued

Formula (3)

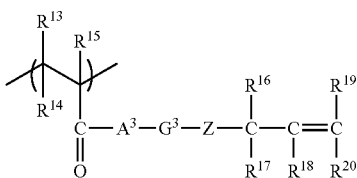

wherein $R^1$, $R^2$, $R^5$, $R^6$, $R^7$, $R^8$, $R^{11}$, $R^{12}$, $R^{13}$, $R^{14}$, $R^{19}$ and $R^{20}$ each independently represents a hydrogen atom; $R^3$, $R^4$, $R^9$, $R^{10}$, $R^{15}$ and $R^{18}$ each independently represents a hydrogen atom or a methyl group; $R^{16}$ and $R^{17}$ each independently represents a hydrogen atom or a monvalent organic group; $A^1$, $A^2$ and $A^3$ each independently represents an oxygen atom, a sulfur atom or —N($R^{21}$)—, wherein $R^{21}$ represents an alkyl group which may be substituted; $G^1$, $G^2$ and $G^3$ each independently represents an unsubstituted alkylene group having 1 to 20 carbon atoms; X and Z each independently represents an oxygen atom, a sulfur atom or —N($R^{22}$)—, wherein $R^{22}$ represents an alkyl group which may be substituted; and Y represents an oxygen atom, a sulfur atom, a phenylene group which may be substituted, or —N($R^{23}$)—, wherein $R^{23}$ represents an alkyl group which may be substituted, wherein the amount of the structural units represented by formula (1) to (3) in the polymer compound (A-1) is from 20% by mole or more to less than 95% by mole.

2. The pigment-dispersed composition according to claim 1, wherein the polymer compound (A-1) has an unsaturation equivalent of less than 600.

3. A method of producing a color filter, comprising:
preparing the pigment-dispersed composition of claim 1 by mixing and dispersing the polymer compound (A-1) as a dispersant, the pigment (B), and the solvent to produce a mixture, and dispersing the mixture;
mixing the pigment-dispersed composition with a photopolymerization initiator (E) to obtain a curable composition;
coating the curable composition on a support to form a colored layer;
exposing the colored layer through a patterned mask; and
developing the colored layer to form a colored pattern.

4. The pigment-dispersed composition according to claim 1, wherein the polymer compound (A-1) has the structural unit represented by formula (1).

5. A curable composition comprising a polymer compound (A-1) having at least one selected from the structural units represented by the following formulae (1) to (3), a pigment (B), a solvent (C), and a photopolymerization initiator (E):

Formula (1)

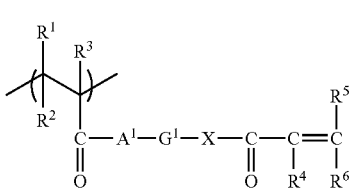

-continued

Formula (2)

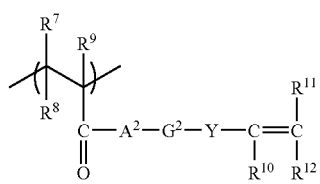

Formula (3)

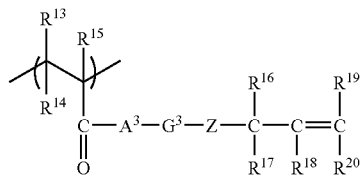

wherein $R^1$, $R^2$, $R^5$, $R^6$, $R^7$, $R^8$, $R^{11}$, $R^{12}$, $R^{13}$, $R^{14}$, $R^{19}$, and $R^{20}$ each independently represents a hydrogen atom $R^3$, $R^4$, $R^9$, $R^{10}$, $R^{15}$ and $R^{18}$ each independently represents a hydrogen atom or a methyl group; $R^{16}$ and $R^{17}$ each independently represents a hydrogen atom or a monvalent organic group; $A^1$, $A^2$ and $A^3$ each independently represent an oxygen atom, a sulfur atom or —N($R^{21}$)—, wherein $R^{21}$ represents an alkyl group which may be substituted; $G^1$, $G^2$ and $G^3$ each independently represents an unsubstituted alkylene group having 1 to 20 carbon atoms; X and Z each independently represent an oxygen atom, a sulfur atom or —N($R^{22}$)—, wherein $R^{22}$ represents an alkyl group which may be substituted; and Y represents an oxygen atom, a sulfur atom, a phenylene group which may be substituted, or —N($R^{23}$)—, wherein $R^{23}$ represents an alkyl group which may be substituted, wherein the amount of the structural units represented by formula (1) to (3) in the polymer compound (A-1) is from 20% by mole or more to less than 95% by mole.

6. The curable composition according to claim 5, wherein the polymer compound (A-1) has an unsaturation equivalent of less than 600.

7. The curable composition according to claim 5, further comprising a photopolymerizable compound (F).

8. A color filter comprising a colored pattern formed on a support using the curable composition of claim 5.

9. A production method for a color filter, comprising:
coating the curable composition of claim 5 on a support to form a colored layer;
exposing the coated layer through a patterned mask; and
developing the colored layer after the exposure to form a colored pattern.

10. The curable composition according to claim 5, wherein the photopolymerization initiator (E) is an oxime compound.

11. The curable composition according to claim 5, wherein the polymer compound (A-1) further has a structural unit derived from benzyl methacrylate.

12. The curable composition according to claim 5, wherein the polymer compound (A-1) has an acid number of from 20 to 300.

13. A method of producing the curable composition of claim 5, comprising:
mixing and dispersing the polymer compound (A-1) as a dispersant, the pigment (B), and the solvent (C) to produce a pigment dispersion; and
mixing the pigment dispersion with the photopolymerization initiator (E).

* * * * *